United States Patent
Karmoose et al.

(10) Patent No.: US 12,199,763 B2
(45) Date of Patent: Jan. 14, 2025

(54) TRANSPORT BLOCK MAPPING ACROSS SLOTS

(71) Applicant: Samsung Electronics Co., Ltd., Suwon-si (KR)

(72) Inventors: Mohammed Karmoose, San Diego, CA (US); Jung Hyun Bae, San Diego, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 196 days.

(21) Appl. No.: 17/378,646

(22) Filed: Jul. 16, 2021

(65) Prior Publication Data

US 2022/0045789 A1 Feb. 10, 2022

Related U.S. Application Data

(60) Provisional application No. 63/192,563, filed on May 24, 2021, provisional application No. 63/153,943, (Continued)

(51) Int. Cl.
*H04L 1/00* (2006.01)
*H04W 72/0446* (2023.01)
(Continued)

(52) U.S. Cl.
CPC .......... *H04L 1/0071* (2013.01); *H04L 1/0068* (2013.01); *H04W 72/0446* (2013.01); *H04W 72/1268* (2013.01); *H04W 72/21* (2023.01)

(58) Field of Classification Search
CPC ... H04L 1/0071; H04L 1/0068; H04L 5/0007; H04L 5/0048; H04L 1/18; H04L 1/0067;
(Continued)

(56) References Cited

U.S. PATENT DOCUMENTS

| | | |
|---|---|---|
| 7,477,610 B2 | 1/2009 | Bejerano et al. |
| 8,213,461 B2 | 7/2012 | Croxford |
| (Continued) | | |

FOREIGN PATENT DOCUMENTS

| | | |
|---|---|---|
| EP | 4102757 A1 | 12/2022 |
| WO | WO-2018030736 A1 * | 2/2018 |
| (Continued) | | |

OTHER PUBLICATIONS

U.S. Appl. No. 63/021,323 Priority of WO 2021/225512 May 2020 (Year: 2020).*

(Continued)

*Primary Examiner* — Rina C Pancholi
(74) *Attorney, Agent, or Firm* — Renaissance IP Law Group LLP

(57) ABSTRACT

A system and a method are disclosed for processing data to be mapped into a transport block transmitted over a wireless physical shared channel. In one embodiment, a code block determination circuit determines a size of a code block of data that maps across at least one slot boundary of a slot of the wireless physical shared channel. A rate matching circuit rate matches bits of a code block to a number of bits available in the transport block that spans one or more slots of the wireless physical shared channel. An interleaver interleaves an output of the rate matching circuit so that a code block that crosses a slot boundary between a first slot and a second slot is interleaved between the first slot and the second slot.

20 Claims, 23 Drawing Sheets

Related U.S. Application Data filed on Feb. 25, 2021, provisional application No. 63/138,382, filed on Jan. 15, 2021, provisional application No. 63/134,584, filed on Jan. 6, 2021, provisional application No. 63/062,423, filed on Aug. 6, 2020.

(51) Int. Cl.
*H04W 72/1268* (2023.01)
*H04W 72/21* (2023.01)

(58) Field of Classification Search
CPC ... H04L 1/0072; H04L 1/0041; H04L 1/0058; H04L 1/0013; H04L 1/22; H04L 5/0044; H04W 72/0446; H04W 72/1268; H04W 72/21; H03M 13/1102; H03M 13/2792; H03M 13/635
See application file for complete search history.

(56) References Cited

U.S. PATENT DOCUMENTS

| | | | |
|---|---|---|---|
| 11,297,635 | B2 | 4/2022 | Salim et al. |
| 2019/0045390 | A1 | 2/2019 | Davydov et al. |
| 2019/0110273 | A1 | 4/2019 | Jiang et al. |
| 2019/0149365 | A1 | 5/2019 | Chatterjee et al. |
| 2020/0100139 | A1 | 3/2020 | Kim et al. |
| 2020/0344753 | A1 | 10/2020 | Gao |
| 2021/0218538 | A1 | 7/2021 | Myung et al. |
| 2021/0368501 | A1 | 11/2021 | Hamidi-Sepehr et al. |
| 2021/0392648 | A1 | 12/2021 | Andersson et al. |
| 2022/0045789 | A1 | 2/2022 | Karmoose et al. |
| 2022/0052832 | A1* | 2/2022 | Ersbo .......... H04L 5/0062 |
| 2022/0303987 | A1 | 9/2022 | Sridharan et al. |
| 2022/0346091 | A1* | 10/2022 | Karmoose .......... H04L 1/0072 |

FOREIGN PATENT DOCUMENTS

| | | | | |
|---|---|---|---|---|
| WO | 2020071985 | A1 | 4/2020 | |
| WO | WO-2021225508 | A2 * | 11/2021 | ......... H04L 1/1614 |
| WO | WO-2021225512 | A1 * | 11/2021 | ......... H04L 1/0041 |

OTHER PUBLICATIONS

CATT, "POSCH and PUSCH Resource Allocation," 3GPP Draft; R1-1715824, 3rd Generation Partnership Project (3GPP), Mobile Competence Centre; 650, Route Des Lucioles; F-06921 Sophia-Antipolis Cedex; France, vol. RAN WG1, No. Nagoya, Japan; Sep. 18, 2017-Sep. 21, 2017, Sep. 12, 2017, XP051329516, Retrieved from the Internet: URL:http://www.3gpp.org/ftp/tsg_ran/WG1_RL1 /TSG R 1_AH/NR_AH_1709/Docs/ [retrieved on Sep. 12, 2017].

Extended European Search Report for Application No. 21189400.1, mailed Jan. 21, 2022.

LG Electronics, "Discussion on Resource Allocation and TBS Determination," 3GPP Draft; R1-1719929, 3rd Generation Partnership Project (3GPP), Mobile Competence Centre; 650, Route Des Lucioles; F-06921 Sophia-Antipolis Cedex; France, Dec. 1, 2017, pp. 1-16, XP051369642, Retrieved from the Internet: URL:http://www.3gpp.org/ftp/tsg%5Fran/WG1%5FRL1/TSGR1%5F91/Docs/.

Extended European Search Report for Application No. 22185474.8, mailed Apr. 12, 2023.

Intel Corporation, "Downlink Multiplexing of eMBB and URLLC Transmissions," 3GPP Draft; R1-1700374 Intel—DL_EMBB_URLLC, 3rd Generation Partnership Project (3GPP), Mobile Competence Centre; 650, Route Des Lucioles; F-06921, Sophia-Antipolis Cedex; France, vol. RAN WG1, No. Spokane, USA; Jan. 2017, XP051207911,12 pages.

Nokia et al., "Transport Block Processing for PUSCH Coverage Enhancements," 3GPP Draft; RI-2105902, 3rd Generation Partnership Project (3GPP), Mobile Competence Centre; 650, Route Des Lucioles; F-06921 Sophia-Antipolis Cedex; France, vol. RAN WG1, No. e-Meeting; May 2021, XP052006491, 9 pages.

Partial European Search Report for Application No. 22185474.8, mailed Dec. 9, 2022.

Office Action for U.S. Appl. No. 17/856,942, mailed Aug. 26, 2024.

European Office Action for Application No. 22185474.8, mailed Nov. 5, 2024.

\* cited by examiner

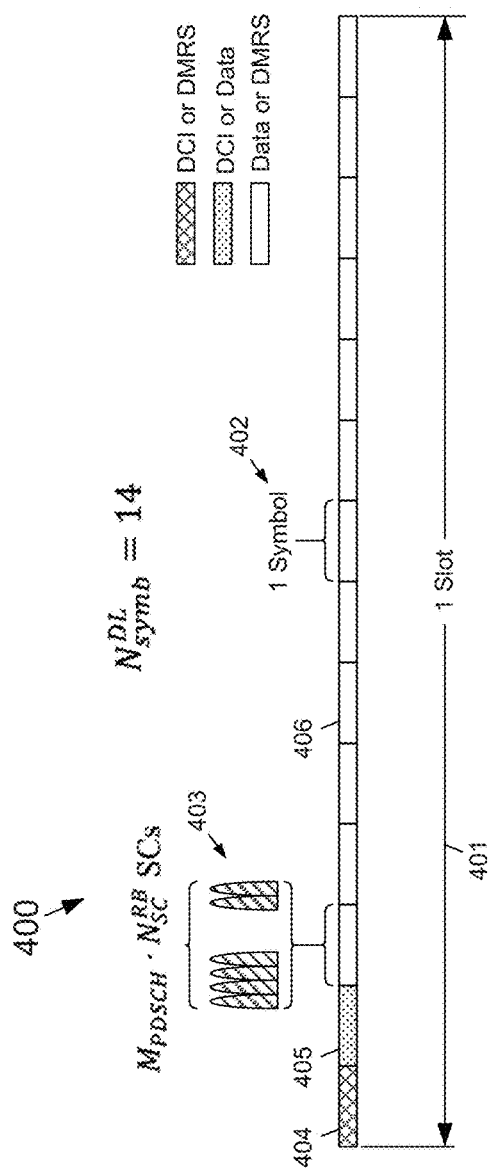
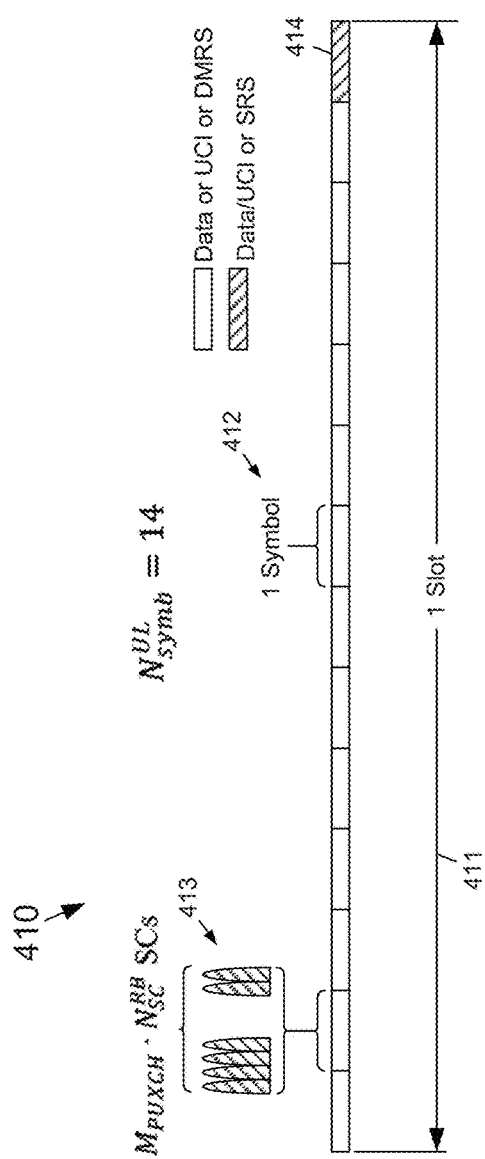

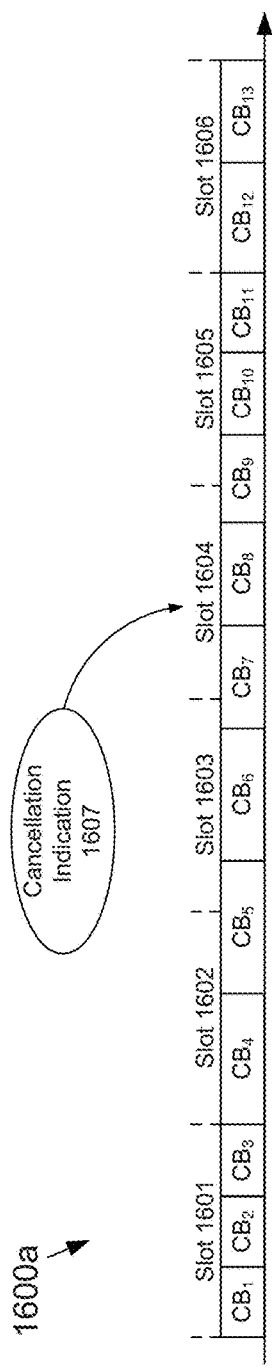
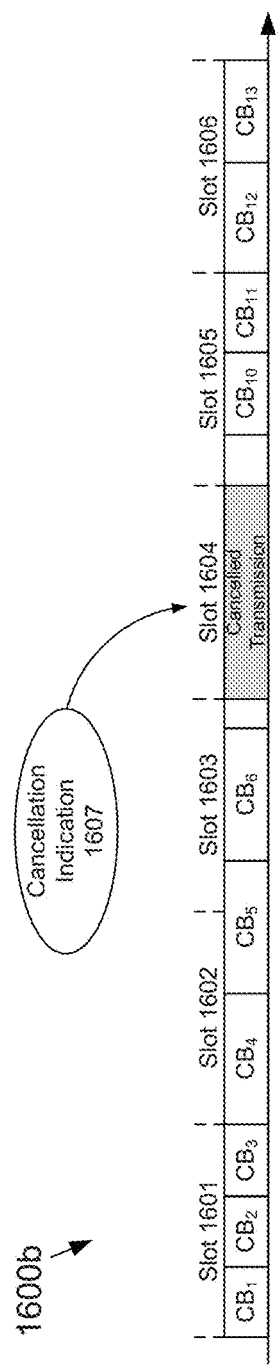
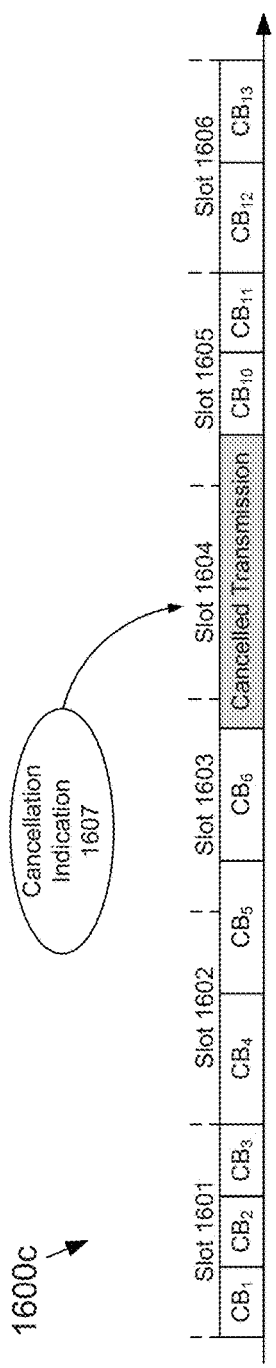

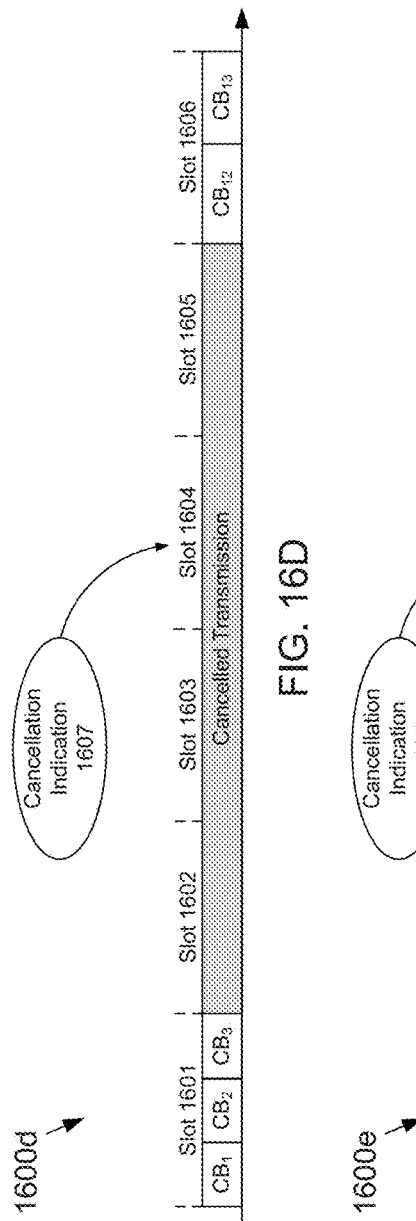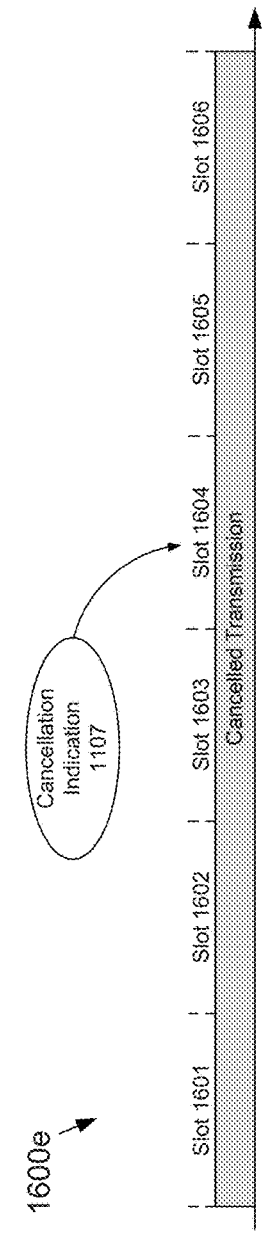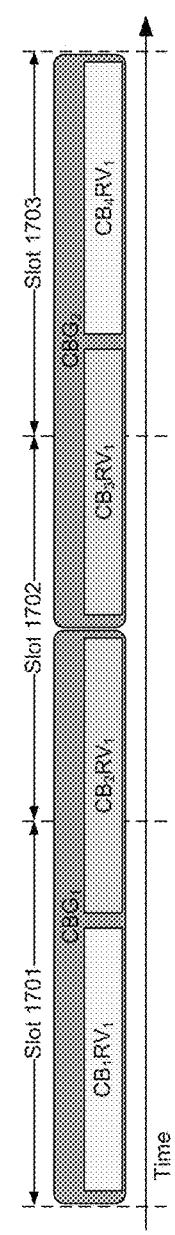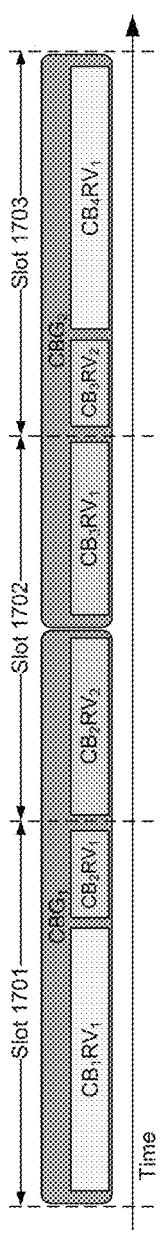

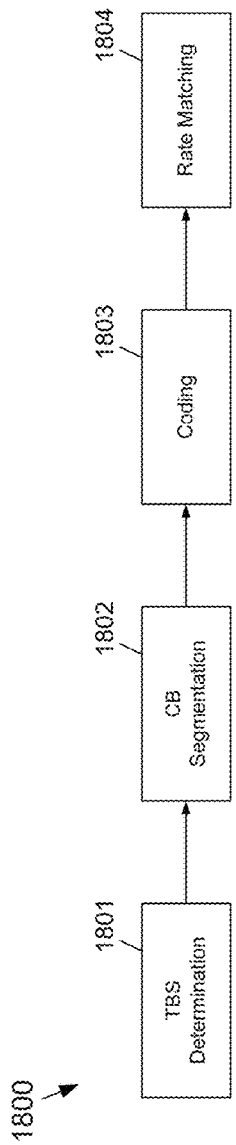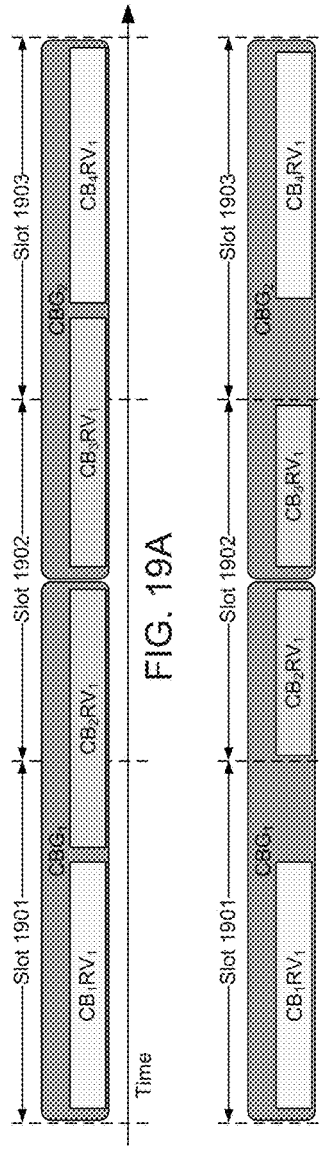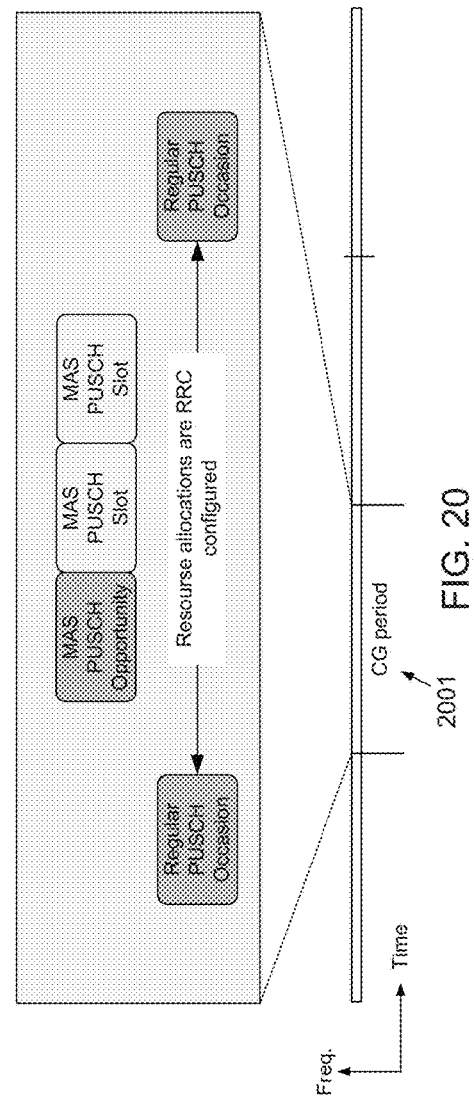

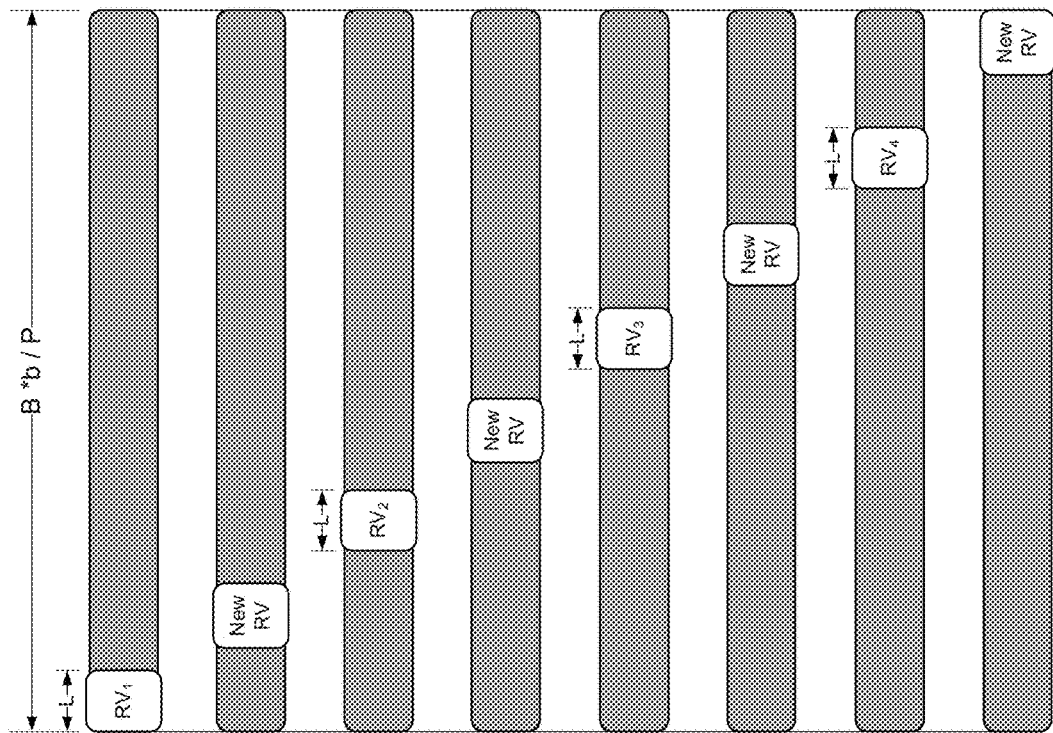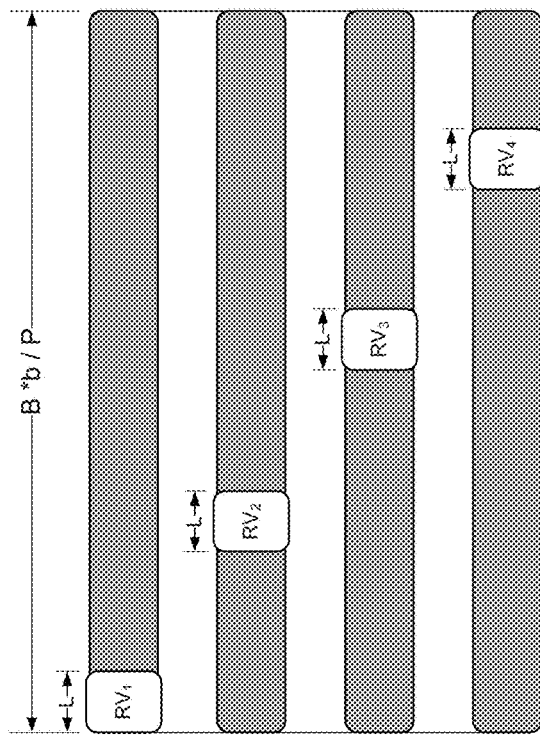
FIG. 21A
FIG. 21B

TRANSPORT BLOCK MAPPING ACROSS SLOTS

CROSS-REFERENCE TO RELATED APPLICATION

This application claims the priority benefit under 35 U.S.C. § 119(e) of U.S. Provisional Patent Application No. 63/062,423, filed on Aug. 6, 2020, U.S. Provisional Application No. 63/134,584, filed on Jan. 6, 2021, U.S. Provisional Patent Application No. 63/138,382, filed on Jan. 15, 2021, U.S. Provisional Patent Application No. 63/153,943, filed on Feb. 25, 2021, and U.S. Provisional Patent Application No. 63/192,563, filed on May 24, 2021, and the disclosures of which are incorporated herein by reference in its entirety.

TECHNICAL FIELD

The subject matter disclosed herein generally relates to wireless communication systems. More specifically, the subject matter disclosed herein relates to mapping a transport block across slots that have been allocated for uplink transmission in a wireless physical shared channel.

BACKGROUND

A wireless network, such a Fifth Generation (5G) wireless network, may allocate resources for transmission over a physical shared channel. The form of the allocation may be resources in multiple slots, in which case the allocation corresponds to the transmission of a physical shared channel with repetitions (e.g., type A or type B repetitions). The resources may be indicated to a transmitter either dynamically (e.g., via a downlink control information (DCI)) or semi-statically (e.g., through a process of Configured Grant (CG) Physical Uplink Shared Channel (PUSCH) transmission). The resources may include a set of orthogonal frequency division multiplexing (OFDM) symbols and Sub-carriers (SCs) along with additional configurations for the physical shared channel transmission. The set of OFDM symbols may be contiguous or non-contiguous in time. The OFDM symbols may also be indicated in the form of sets of symbols in one or more slots. The set of subcarriers may be a set of contiguous or non-contiguous subcarriers, and may be indicated in the form of Resource Blocks (RBs) or subsets of Resource Blocks. A combination of OFDM symbols and subcarriers correspond to Resource Elements (REs) that carry the coded bits of the PUSCH.

SUMMARY

An example embodiment provides a transmit block processing chain for a transmitter that may include a code block determination circuit and a rate matching circuit. The code block determination circuit may determine a size of a code block that maps across at least one slot boundary of a slot of a wireless physical shared channel, and the rate matching circuit may rate match bits of the code block to a number of bits available in a transport block that spans one or more slots of the wireless physical shared channel. In one embodiment, the transmit block processing chain may further include an interleaver that may interleave a continuous output of the rate matching circuit on a slot basis so that a code block that crosses a slot boundary between a first slot and a second slot may be interleaved within the first slot and the second slot. In another embodiment, the code block that crosses the slot boundary between the first slot and the second slot may be segmented with a redundancy version corresponding to the second slot, the output of the rate matching circuit may be constrained to a predetermined number of slots, and the interleaver may further interleave the output of the rate matching circuit across the predetermined number of slots. In yet another embodiment, the rate matching circuit rate may match bits of the code block continuously to a number of bits available in the transport block, and an interleaver may interleave a continuous rate matching of the rate matching circuit across a predetermined number of slots that are fewer that a number of allocated to the transmit block processing chain. In one embodiment, the transmit block processing chain may further include an interleaver that may interleave a continuous output of the rate matching circuit with no Redundancy Version segmentation. In still another embodiment, the transmit block processing chain may further include an interleaver that may interleave a continuous output of the rate matching circuit on a slot basis in response to a cancellation indication by interleaving the output of the rate matching circuit in slots remaining after the cancellation indication or in response to an uplink control information (UCI) with multi-slot physical uplink shared channel (PUSCH) being scheduled in the one or more slots over which the transport block spans by interleaving the output of the rate matching circuit in one or more slots that precede a slot into which the UCI is scheduled. In yet another embodiment of the transmit block processing chain information scheduling the UCI may be received a first predetermined time period prior to a first slot of the one or more slots over which the transport block spans, and information relating to bits of the UCI may be received a second predetermined time period prior to the first slot of the one or more slots over which the transport block spans.

An example embodiment provides a transceiver that may include receive processing circuitry and transmit processing circuitry. The receive processing circuitry may receive an indication of resources that have been allocated for a transmission over a wireless physical shared channel in which the indication of resources may include one or more allocated slots of the wireless physical shared channel. The transmit processing circuitry may include a code block determination circuit and a rate matching circuit. The code block determination circuit may determine a size of a code block that maps across at least one slot boundary of an allocated slot of the wireless physical shared channel, and the rate matching circuit may rate match bits of the code block to a number of bits available in a transport block that spans the one or more allocated slots of the wireless physical shared channel. In one embodiment, the transceiver may further include an interleaver that may interleave a continuous output of the rate matching circuit on a slot basis so that a code block that crosses a slot boundary between a first allocated slot and a second allocated slot is interleaved within the first allocated slot and the second allocated slot. In another embodiment, the code block that crosses the slot boundary between the first allocated slot and the second allocated slot may be segmented with a redundancy version corresponding to the second allocated slot, the output of the rate matching circuit may be constrained to a predetermined number of allocated slots, and the interleaver may further interleave the output of the rate matching circuit across the predetermined number of allocated slots. In another embodiment, the rate matching circuit rate may match bits of the code block continuously to a number of bits available in the transport block, and an interleaver may interleave a continuous rate matching of the rate matching circuit across a predetermined number of slots that are fewer that a number of allocated to the transmit block processing circuitry. In another embodiment, the transmit processing circuitry may further include an interleaver that interleaves a continuous output of the rate matching circuit with no Redundancy Version segmentation. In still another embodiment, the transmit processing circuitry may further include an interleaver that interleaves a continuous output of the rate matching circuit on a slot basis in response to a cancellation indication by interleaving the output of the rate matching circuit in slots remaining after the cancellation indication or in response to an uplink control information (UCI) with multi-slot physical uplink shared channel (PUSCH) being scheduled in the one or more allocated slots over which the transport block spans by interleaving the output of the rate matching circuit in one or more slots that precede a slot into which the UCI is scheduled. In one embodiment, information scheduling the UCI may be received a first predetermined time period prior to a first slot of the one or more slots over which the transport block spans, and information relating to bits of the UCI may be received a second predetermined time period prior to the first slot of the one or more slots over which the transport block spans.

An example embodiment provides a method for processing data to be mapped into a transport block that may include determining, by a code block determination circuit, a size of a code block of data that maps across at least one slot boundary of a slot of a wireless physical shared channel; and rate matching, by a rate matching circuit, bits of a code block to a number of bits available in the transport block that spans one or more slots of the wireless physical shared channel. In one embodiment, the method may further include interleaving, by an interleaver, a continuous output of the rate matching circuit on a slot basis so that a code block that crosses a slot boundary between a first slot and a second slot is interleaved within the first slot and the second slot. In another embodiment, the method may further include segmenting, by the code block determination circuit, the code block that crosses the slot boundary between the first slot and the second slot with a redundancy version corresponding to the second slot in which the output of the rate matching circuit may be constrained to a predetermined number of slots in which case the method may further include interleaving, by the interleaver, the output of the rate matching circuit across the predetermined number of slots. In another embodiment, the method may further include matching, by the rate matching circuit rate, bits of the code block continuously to a number of bits available in the transport block, and interleaving, by an interleaver, a continuous rate matching of the rate matching circuit across a predetermined number of slots that are fewer that a number of allocated slots. In still another embodiment, the method may further include interleaving, by an interleaver, a continuous output of the rate matching circuit with no Redundancy Version segmentation. In yet another embodiment, the method may further include interleaving, by an interleaver, a continuous output of the rate matching circuit on a slot basis in response to a cancellation indication by interleaving the output of the rate matching circuit in slots remaining after the cancellation indication or in response to or in response to an uplink control information (UCI) with multi-slot physical uplink shared channel (PUSCH) that is scheduled in the one or more slots over which the transport block spans by interleaving the rate matching circuit output in one or more slots that precede a slot into which the UCI is scheduled. In one embodiment, information scheduling the UCI may be received a first predetermined time period prior to a first slot of the one or more slots over which the transport block spans, and information relating to the bits of the UCI may be received a second predetermined time period prior to the first slot of the one or more slots over which the transport block spans.

BRIEF DESCRIPTION OF THE DRAWING

In the following section, the aspects of the subject matter disclosed herein will be described with reference to exemplary embodiments illustrated in the figures, in which:

FIG. 4A depicts an example embodiment of a downlink slot structure;

FIG. 4B depicts an example embodiment of an uplink slot structure for physical uplink shared channel transmission or physical uplink control channel transmission;

FIGS. 16A-16E depict example scenarios in which a cancellation indication in one slot of an uplink mapping-across-slots transmission is received and handled by a transmitter according to the subject matter disclosed herein;

FIG. 17A depicts an example mapping across slots transmission of two code block groups across three slots according to the subject matter disclosed herein;

FIG. 17B depicts an example mapping across slots transmission of two code block groups across three slots with code block segmentation according to the subject matter disclosed herein;

FIG. 18 depicts an example operations of a transport block processing chain according the subject matter disclosed herein;

FIG. 19A depicts an example mapping across slots transmission of code blocks in two code block groups across three slots according to the subject matter disclosed herein;

FIG. 19B depicts an example mapping across slots transmission of code blocks in two code block groups with segmentation across three slots according to the subject matter disclosed herein;

FIG. 20 depicts a configured grant period in an example configured grant configuration that may include a set of regular transmission occasions and a set of mapping across slots transmission occasions according to the subject matter disclosed herein;

FIG. 21A depicts an example situation in which a codeword length L is too small;

FIG. 21B depicts an example situation in which additional redundancy versions have been added to a transport block according to the subject matter disclosed herein;

DETAILED DESCRIPTION

Figure 1:
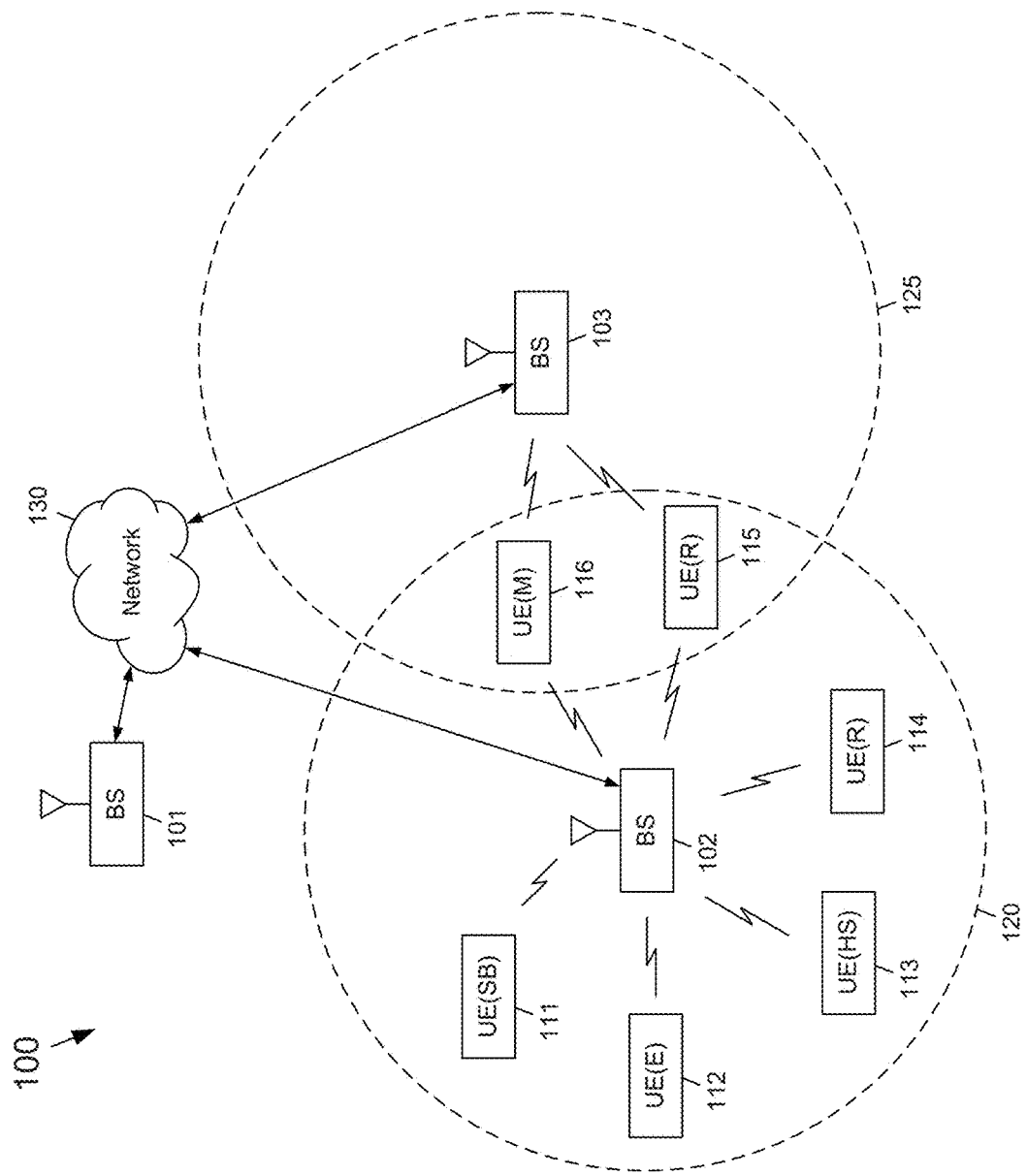
FIG. 1 depicts an example embodiment of a wireless communication network according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system-on-a-chip (SoC), an assembly, and so forth.

FIGS. 1-40, described below, and the various embodiments used to illustrate the subject matter disclosed herein are only by way of example and should not be construed in any way to limit the scope of the subject matter disclosed herein. It should be understood that the subject matter disclosed herein may be implemented in any suitably arranged system or device.

At least the following documents are hereby incorporated by reference into the present disclosure as if fully set forth herein: 3GPP TS 38.211 v15.6.0, "NR; Physical channels and modulation;" 3GPP TS 38.212 v15.6.0, "NR; Multiplexing and Channel coding;" 3GPP TS 38.213 v15.6.0, "NR; Physical Layer Procedures for Control;" 3GPP TS 38.214 v15.6.0, "NR; Physical Layer Procedures for Data;" 3GPP TS 38.321 v15.6.0, "NR; Medium Access Control (MAC) protocol specification;" and 3GPP TS 38.331 v15.6.0, "NR; Radio Resource Control (RRC) Protocol Specification."

Figure 2:
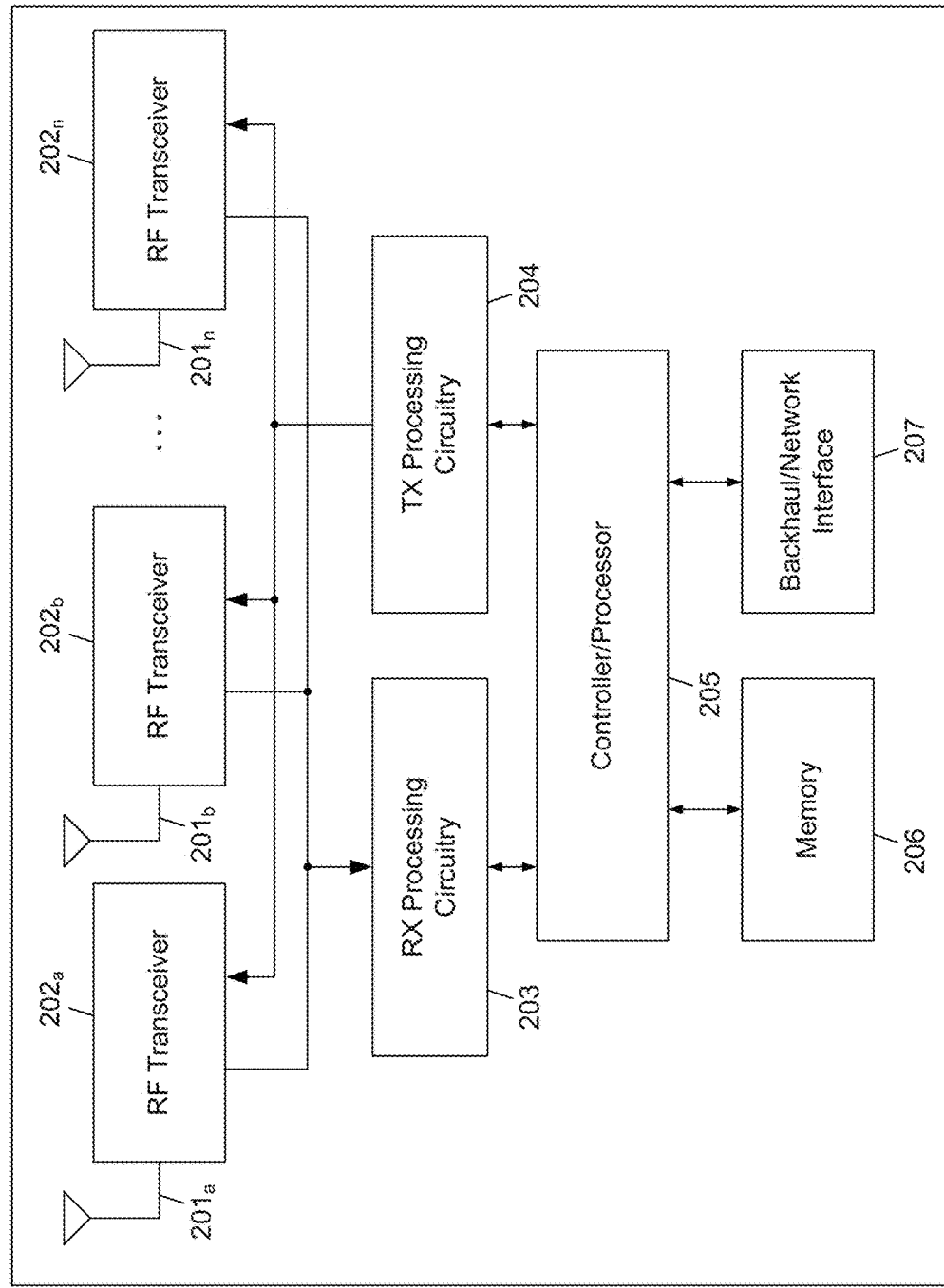
FIG. 2 depicts an example embodiment of a base station according to the subject matter disclosed herein.
Figure 3:
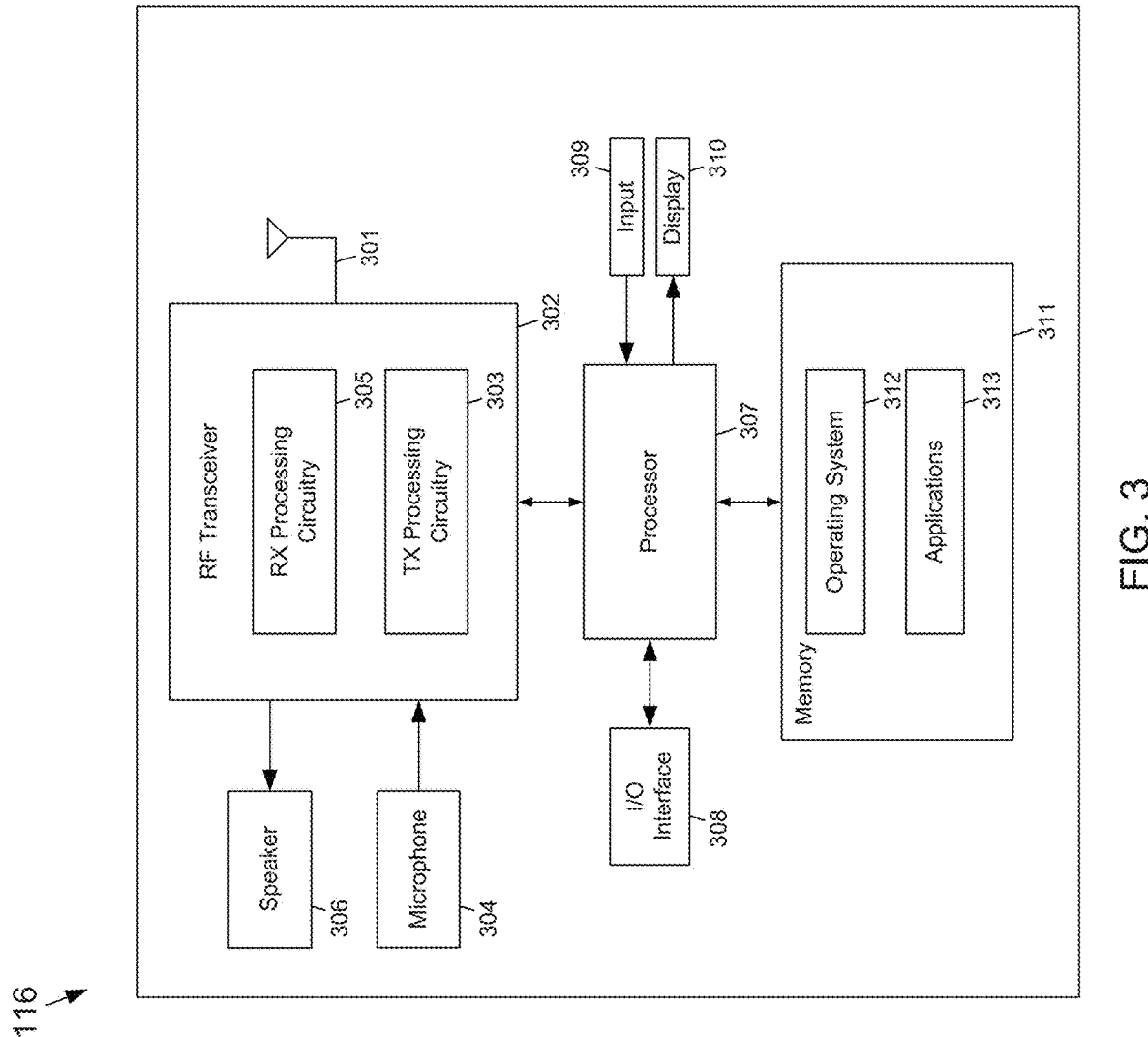
FIG. 3 depicts an example embodiment of a user equipment according to the subject matter disclosed herein.

FIGS. 1-5 depict various example embodiments implemented in wireless communications systems and use of orthogonal frequency division multiplexing (OFDM) or orthogonal frequency division multiple access (OFDMA) communication techniques. The descriptions of FIGS. 1-3 are not meant to imply physical or architectural limitations to the manner in which different embodiments may be implemented. Different embodiments of the subject matter disclosed herein may be implemented in any suitably-arranged communications system.

FIG. 1 depicts an example embodiment of a wireless communication network 100 according to the subject matter disclosed herein. The example embodiment of the wireless network depicted in FIG. 1 is for illustration only. Other embodiments of the wireless network 100 may be used without departing from the principles of the subject matter disclosed herein.

As depicted in FIG. 1, the wireless network 100 includes a gNB 101 (e.g., base station, BS), a gNB 102, and a gNB 103. The gNB 101 may communicate with the gNB 102 and the gNB 103. The gNB 101 may also communicate with at least one network 130, such as the internet, a proprietary Internet Protocol (IP) network, or other data network.

The gNB 102 may provide wireless broadband access to the network 130 for a first plurality of UEs within a coverage area 120 of the gNB 102. The first plurality of UEs may include a UE 111 that may be located in a small business (SB); a UE 112 that may be located in an enterprise I; a UE 113 that may be located in a WiFi hotspot (HS); a UE 114 that may be located in a first residence I; a UE 115 that may be located in a second residence I; and a UE 116 that may be a mobile device (M), such as, but not limited to, a cell phone, a wireless laptop, a wireless PDA, or the like. The gNB 103 may provide wireless broadband access to the network 130 for a second plurality of UEs within a coverage area 125 of the gNB 103. The second plurality of UEs may include the UE 115 and the UE 116. In some embodiments, one or more of the gNBs 101-103 may communicate with each other and with the UEs 111-116 using 5G/NR, LTE, LTE-A, WiMAX, WiFi, and/or other wireless communication techniques.

Depending on the network type, the term "base station" or "BS" may refer to any component (or collection of components) configured to provide wireless access to a network, such as a transmit point (TP), a transmit-receive point (TRP), an enhanced base station (eNodeB or eNB), a 5G/NR base station (gNB), a microcell, a femtocell, a WiFi access point (AP), or other wirelessly enabled devices. Base stations may provide wireless access in accordance with one or more wireless communication protocols, e.g., 5G/NR 3GPP new radio interface/access (NR), long term evolution (LTE), LTE advanced (LTE-A), high speed packet access (HSPA), Wi-Fi 802.11a/b/g/n/ac, etc. For the sake of convenience, the terms "BS" and "TRP" are used interchangeably herein to refer to network infrastructure components that provide wireless access to remote terminals. Also, depending on the network type, the term "user equipment" or "UE" may refer to any component such as "mobile station," "subscriber station," "remote terminal," "wireless terminal," "receive point," or "user device." For the sake of convenience, the terms "user equipment" and "UE" may be used herein to refer to remote wireless equipment that wirelessly accesses a BS, whether the UE is a mobile device (such as, but not limited to, a mobile telephone or smartphone) or is normally considered a stationary device (such as, but not limited to, a desktop computer or vending machine).

Dotted lines depict approximate extents of the coverage areas 120 and 125, which are depicted as approximately circular for the purposes of illustration and explanation only. It should be clearly understood that the coverage areas associated with gNBs, such as the coverage areas 120 and 125, may have other shapes, including irregular shapes, depending upon the configuration of the gNBs and variations in the radio environment associated with natural and man-made obstructions.

As described in more detail below, one or more of the UEs 111-116 may include circuitry, programming, or a combination thereof, for efficient control signaling designed for improved resource utilization. In certain embodiments, and one or more of the gNBs 101-103 may include circuitry, programming, or a combination thereof, for efficient control signaling designed for improved resource utilization.

Although FIG. 1 depicts one example of a wireless network, various changes may be made to FIG. 1. For example, the wireless network 100 could include any number of gNBs and any number of UEs in any suitable arrangement. Also, the gNB 101 may communicate directly with any number of UEs and provide those UEs with wireless broadband access to the network 130. Similarly, each gNB 102-103 may communicate directly with the network 130 and provide UEs with direct wireless broadband access to the network 130. Further, the gNBs 101, 102, and/or 103 may provide access to other or additional external networks, such as, but not limited to, external telephone networks or other types of data networks.

FIG. 2 depicts an example embodiment of the gNB 102 according to the subject matter disclosed herein. The embodiment of the gNB 102 depicted in FIG. 2 is for illustration only, and the gNBs 101 and 103 of FIG. 1 may have the same or a similar configuration. However, gNBs come in a wide variety of configurations, and it should be understood that FIG. 2 does not limit the scope of the subject matter disclosed herein to any particular implementation of a gNB.

As depicted in FIG. 2, the gNB 102 may include multiple antennas 201a-201n, multiple radio frequency (RF) transceivers 202a-202n, receive (RX) processing circuitry 203, and transmit (TX) processing circuitry 204. The gNB 102 may also include a controller/processor 205, a memory 206, and/or a backhaul or network interface 207.

The RF transceivers 202a-202n may receive incoming RF signals from the antennas 201a-201n. The received RF signals may be signals transmitted by UEs in the network 100. The RF transceivers 202a-202n may down-convert the incoming RF signals to generate IF or baseband signals. The IF or baseband signals may be sent to the RX processing circuitry 203, which generates processed baseband signals by filtering, decoding, and/or digitizing the baseband or IF signals. The RX processing circuitry 203 may transmit the processed baseband signals to the controller/processor 255 for further processing.

The TX processing circuitry 204 may receive analog or digital data (such as, but not limited to, voice data, web data, e-mail, or interactive video game data) from the controller/processor 225. The TX processing circuitry 204 may encode, multiplex, and/or digitize the outgoing baseband data to generate processed baseband or IF signals. The RF transceivers 202a-202n may receive the outgoing processed baseband or IF signals from the TX processing circuitry 204 and may up-convert the baseband or IF signals to RF signals that are transmitted via the antennas 201a-201n.

The controller/processor 205 may include one or more processors or other processing devices that may control the overall operation of the gNB 102. For example, the controller/processor 205 may control the reception of forward channel signals and the transmission of reverse channel signals by the RF transceivers 202a-202n, the RX processing circuitry 203, and the TX processing circuitry 204 in accordance with well-known principles. The controller/processor 205 may support additional functions as well, such as more advanced wireless communication functions. For instance, the controller/processor 205 may support beamforming or directional-routing operations in which outgoing/incoming signals from/to multiple antennas 201a-201n may be weighted differently to effectively steer the outgoing signals in a desired direction. Any of a wide variety of other functions may be supported in the gNB 102 by the controller/processor 205.

The controller/processor 205 may also be capable of executing programs and other processes resident in the memory 206, such as an operating system (OS). The controller/processor 205 may move data into or out of the memory 206, which may be coupled to the controller/processor 205, as required by an executing process. Part of the memory 206 may include a random-access memory (RAM), and another part of the memory 206 may include a flash memory or other read-only memory (ROM).

The controller/processor 205 may also be coupled to the backhaul or network interface 207. The backhaul or network interface 207 may allow the gNB 102 to communicate with other devices or systems over a backhaul connection or over a network. The interface 207 may support communications over any suitable wired or wireless connection(s). For example, when the gNB 102 is implemented as part of a cellular communication system (such as a gNB supporting 5G/NR, LTE, or LTE-A), the interface 207 may allow the gNB 102 to communicate with other gNBs over a wired or wireless backhaul connection. When the gNB 102 is implemented as an access point, the interface 207 may allow the gNB 102 to communicate over a wired or wireless local area network or over a wired or wireless connection to a larger network (such as the internet). The interface 207 may include any suitable structure supporting communications over a wired or wireless connection, such as an Ethernet or an RF transceiver.

Although FIG. 2 depicts one example of gNB 102, various changes may be made to FIG. 2. For example, the gNB 102 may include any number of each component shown in FIG. 2. As a particular example, an access point may include a number of interfaces 207, and the controller/processor 205 may support routing functions to route data between different network addresses. As another particular example, while shown as including a single instance of TX processing circuitry 204 and a single instance of RX processing circuitry 203, the gNB 102 may include multiple instances of each (such as one per RF transceiver). Also, various components in FIG. 2 may be combined, further subdivided, or omitted and additional components may be added according to particular needs.

FIG. 3 depicts an example embodiment of UE 116 according to the subject matter disclosed herein. The embodiment of the UE 116 depicted in FIG. 3 is for illustration only, and the UEs 111-115 of FIG. 1 could have the same or similar configuration. UEs, however, may come in a wide variety of configurations, and FIG. 3 does not limit a UE to be any particular implementation of a UE.

As depicted in FIG. 3, the UE 116 may include an antenna 301, an RF transceiver 302, TX processing circuitry 303, a microphone 304, and RX processing circuitry 305. The UE 116 may also include a speaker 360, a processor 307, an input/output (I/O) interface (IF) 308, a touchscreen 309 (or other input device), a display 310, and a memory 311. The memory 311 may include an OS 312 and one or more applications 313.

The RF transceiver 310 may receive an incoming RF signal, from the antenna 305 that has been transmitted by a gNB of the network 100. The RF transceiver 310 may down-convert the incoming RF signal to generate an intermediate frequency (IF) or baseband signal. The IF or baseband signal may be sent to the RX processing circuitry 325, which generates a processed baseband signal by filtering, decoding, and/or digitizing the baseband or IF signal. The RX processing circuitry 325 may transmit the processed baseband signal to the speaker 330 (such as for voice data) or to the processor 340 for further processing (such as for web browsing data).

The TX processing circuitry 303 may receive analog or digital voice data from the microphone 304 or other outgoing baseband data (such as web data, e-mail, or interactive video game data) from the processor 307. The TX processing circuitry 303 may encode, multiplex, and/or digitize the outgoing baseband data to generate a processed baseband or IF signal. The RF transceiver 302 may receive the outgoing processed baseband or IF signal from the TX processing circuitry 303 and up-convert the baseband or IF signal to an RF signal that is transmitted via the antenna 301.

The processor 307 may include one or more processors or other processing devices and may execute the OS 312 stored in the memory 311 in order to control the overall operation of the UE 116. For example, the processor 307 may control the reception of forward channel signals and the transmission of reverse channel signals by the RF transceiver 302, the TX processing circuitry 303, and the RX processing circuitry 305 in accordance with well-known principles. In some embodiments, the processor 307 may at least one microprocessor or microcontroller.

The processor 370 may also be capable of executing other processes and programs resident in the memory 311, such as processes for beam management. The processor 307 may move data into or out of the memory 311 as required by an executing process. In some embodiments, the processor 307 may be configured to execute the applications 313 based on the OS 361 or in response to signals received from gNBs or from an operator. The processor 307 may also be coupled to the I/O interface 308, which may provide the UE 116 with the ability to connect to other devices, such as, but not limited to, laptop computers and handheld computers. The I/O interface 308 is the communication path between these accessories and the processor 307.

The processor 307 may also be coupled to the touchscreen 309 and the display 310. An operator of the UE 116 may use the touchscreen 309 to enter data into the UE 116. The display 310 may be a liquid crystal display, light emitting diode display, or other display capable of rendering text and/or at least limited graphics, such as from web sites.

The memory 311 may be coupled to the processor 307. Part of the memory 311 may include RAM and another part of the memory 311 may include a Flash memory or other ROM.

Although FIG. 3 depicts one example embodiment of the UE 116, various changes may be made to FIG. 3. For example, various components in FIG. 3 may be combined, further subdivided, or omitted and additional components may be added according to particular needs. As a particular example, the processor 340 may be divided into multiple processors, such as one or more central processing units (CPUs) and one or more graphics processing units (GPUs). Also, while FIG. 3 depicts the UE 116 configured as a mobile telephone or smartphone, UEs may be configured to operate as other types of mobile or stationary devices.

To meet the demand for wireless data traffic that has increased since deployment of 4G communication systems, efforts have been made to develop an improved 5G/NR or pre-5G/NR communication system. Therefore, the 5G/NR or pre-5G/NR communication system may be also referred to as a "beyond 4G network" or a "post LTE system." The 5G/NR communication system may be considered to be implemented in higher frequency (mmWave) bands, e.g., 28 GHz or 60 GHz bands or, in general, above 6 GHz bands, to accomplish higher data rates or in lower frequency bands, such as below 6 GHz, to enable robust coverage and mobility support. To decrease propagation loss of the radio waves and increase the transmission distance, the beam-forming, massive multiple-input multiple-output (MIMO), full dimensional MIMO (FD-MIMO), array antenna, an analog beam forming, large scale antenna techniques as used in 5G/NR communication systems. Additionally, in 5G/NR communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

A communication system may include a downlink (DL) that refers to transmissions from a base station or one or more transmission points to UEs and an uplink (UL) that refers to transmissions from UEs to a base station or to one or more reception points.

A unit for DL signaling or for UL signaling on a cell may be referred to as a slot and may include one or more symbols. A symbol may also serve as an additional time unit. A frequency (or bandwidth (BW)) unit may be referred to as a resource block (RB). One RB may include a number of sub-carriers (SCs). For example, a slot may have duration of 0.5 milliseconds or 1 millisecond, include 14 symbols, and an RB may include 12 SCs with inter-SC spacing of 30 kHz or 15 kHz, respectively. A unit of one RB in frequency and one symbol in time may be referred to as physical RB (PRB).

DL signals may include data signals conveying information content, control signals conveying DL control information (DCI), and reference signals (RS) that may also be known as pilot signals. A gNB transmits data information or DCI through respective physical DL shared channels (PDSCHs) or physical DL control channels (PDCCHs). A PDSCH or a PDCCH may be transmitted over a variable number of slot symbols including one slot symbol. For brevity, a DCI format scheduling a PDSCH reception by a UE may be referred to as a DL DCI format and a DCI format scheduling a PUSCH transmission from a UE is referred to as an UL DCI format.

A gNB may transmit one or more of multiple types of RS including channel state information RS (CSI-RS) and demodulation RS (DM-RS). A CSI-RS may be primarily intended for UEs to perform measurements and provide channel state information (CSI) to a gNB. For channel measurement, non-zero power CSI-RS (NZP CSI-RS) resources may be used. For interference measurement reports (IMRs), CSI interference measurement (CSI-IM) resources may be used. A CSI process may include NZP CSI-RS and CSI-IM resources.

A UE may determine CSI-RS transmission parameters through DL control signaling or higher-layer signaling, such as radio resource control (RRC) signaling, from a gNB. Transmission instances of a CSI-RS may be indicated by DL control signaling or be configured by higher layer signaling. A DM-RS may be typically transmitted only within a BW of a respective PDCCH or PDSCH and a UE may use the DM-RS to demodulate data or control information.

FIG. 4A depicts an example embodiment of a DL slot structure 400 according to the subject matter disclosed herein. The example embodiment of the DL slot structure 400 depicted in FIG. 4A is for illustration only. FIG. 4 does not limit the scope of the subject matter disclosed herein to any particular implementation. It should be noted that in the DL slot structure 400 described as follows, the DCI information need not be located as depicted in FIG. 4A and may be located elsewhere as appropriate.

As depicted in FIG. 4A, a DL slot 401 may include $N_{symb}^{DL}$ symbols 402 in which a gNB may transmit, for example, data information, DCI, or DM-RS. A DL system BW may include $N_{RB}^{DL}$ RBs. Each RB may include $N_{SC}^{RB}$ SCs. A UE may be assigned $M_{PDSCH}$ RBs for a total of $M_{SC}^{PDSCH} = M_{PDSCH} \cdot N_{SC}^{RB}$ SCs 403 for a PDSCH transmission BW. A PDCCH conveying DCI may be transmitted over control channel elements (CCEs) that are substantially spread across the DL system BW. A first slot symbol 404 may be used by the gNB to transmit PDCCH. A second slot symbol 405 may be used by the gNB to transmit PDCCH or PDSCH. Remaining slot symbols 406 may be used by the gNB to transmit PDSCH and CSI-RS. In some slots, the gNB may also transmit synchronization signals and channels that convey system information, such as synchronization signals and primary broadcast channel (SS/PBCH) blocks.

UL signals may also include data signals conveying information content, control signals conveying UL control information (UCI), DM-RS associated with data or UCI demodulation, sounding RS (SRS) enabling a gNB to perform UL channel measurement, and a random access (RA) preamble enabling a UE to perform random access. A UE may transmit data information or UCI through a respective physical UL shared channel (PUSCH) or a physical UL control channel (PUCCH). A PUSCH or a PUCCH may be transmitted over a variable number of symbols in a slot including one symbol. When a UE simultaneously transmits data information and UCI, the UE may multiplex both in a PUSCH.

A UCI may include hybrid automatic repeat request acknowledgement (HARQ-ACK) information, indicating correct or incorrect detection of data transport blocks (TBs) or of code block groups (CBGs) in a PDSCH, scheduling request (SR) indicating whether a UE has data in the buffer to the UE, and CSI reports enabling a gNB to select appropriate parameters for PDSCH or PDCCH transmissions to a UE.

A CSI report from a UE may include a channel quality indicator (CQI) informing a gNB of a largest modulation and coding scheme (MCS) for the UE to detect a TB with a predetermined block error rate (BLER), such as a 10% BLER, a precoding matrix indicator (PMI) informing a gNB how to combine signals from multiple transmitter antennas in accordance with a multiple input multiple output (MIMO) transmission principle, a CSI-RS resource indicator (CRI) indicating a CSI-RS resource associated with the CSI report, and a rank indicator (RI) indicating a transmission rank for a PDSCH.

A UL RS may include DM-RS and SRS. A DM-RS may typically be transmitted only within a BW of a respective PUSCH or PUCCH transmission. A gNB may use a DM-RS to demodulate information in a respective PUSCH or PUCCH. A SRS may be transmitted by a UE to provide a gNB with an UL CSI and, for a TDD system, an SRS transmission can also provide a PMI for DL transmission. Additionally, in order to establish synchronization or an initial higher-layer connection with a gNB, a UE may transmit a physical random access channel (PRACH).

FIG. 4B depicts an example embodiment of a UL slot structure 410 for PUSCH transmission or PUCCH transmission according to the subject matter disclosed herein. The embodiment of the UL slot structure 410 depicted in FIG. 4B is for illustration only. FIG. 4B does not limit the scope of the subject matter disclosed herein to any particular implementation. It should be noted that in the UL slot structure 410 described as follows, the UCI information need not be located as depicted in FIG. 4B and may be located elsewhere as appropriate.

As depicted in FIG. 4B, a slot 411 may include $N_{symb}^{UL}$ symbols 412 in which a UE transmits, for example, data information, UCI, or DM-RS. An UL system BW may include N RBs. Each RB may include $N_{SC}^{RB}$. A UE may be assigned $M_{PUXCH}$ RBs for a total of $M_{SC}^{PUXCH} = M_{PUXCH} \cdot N_{SC}^{RB}$ SCs 413 for a PUSCH transmission BW ("X"="S") or for a PUCCH transmission BW ("X"="C"). The last one or more symbols of a slot may be used, for example, to multiplex SRS transmissions 414 or short PUCCH transmissions from one or more UEs.

Figure 5A:
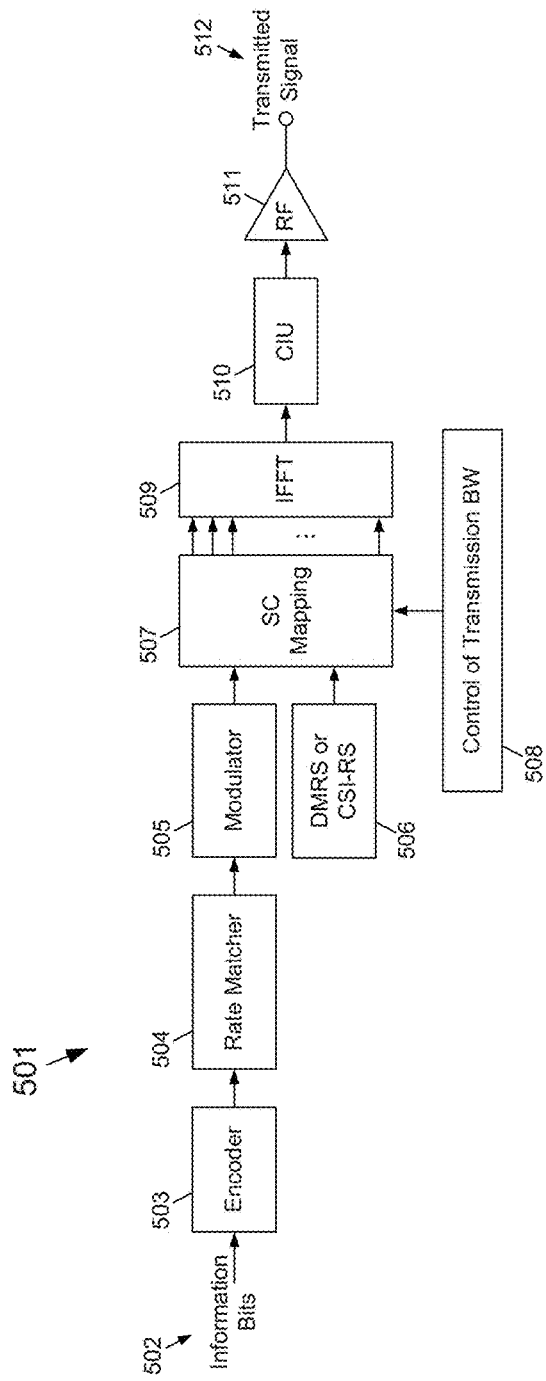
FIG. 5A depicts a block diagram of an example embodiment of a transmitter structure using OFDM according to the subject matter disclosed herein.

FIG. 5A depicts a block diagram of an example embodiment of a transmitter structure 501 using OFDM according to the subject matter disclosed herein. The embodiment of the transmitter structure 501 depicted in FIG. 5A is for illustration only and an actual implementation may have the same or a similar configuration. FIG. 5A does not limit the scope of the subject matter disclosed herein to any particular implementation.

As depicted in FIG. 5A, information bits, such as DCI bits or data information bits 502, may be encoded by an encoder module 503, rate matched to assigned time/frequency resources by a rate matcher module 504 and modulated by a modulator module 505. Subsequently, modulated encoded symbols and DM-RS or CSI-RS module 506 may be mapped to SCs by an SC mapping module 507 controlled by a transmission bandwidth module 508. An inverse fast Fourier transform (IFFT) may be performed by a filter module 509. A cyclic prefix (CP) may be added to the output of the filter module 509. The resulting signal may be filtered by common interface unit (CIU) filter module 510 and transmitted by an RF module 511 as a transmitted signal 512.

Figure 5B:
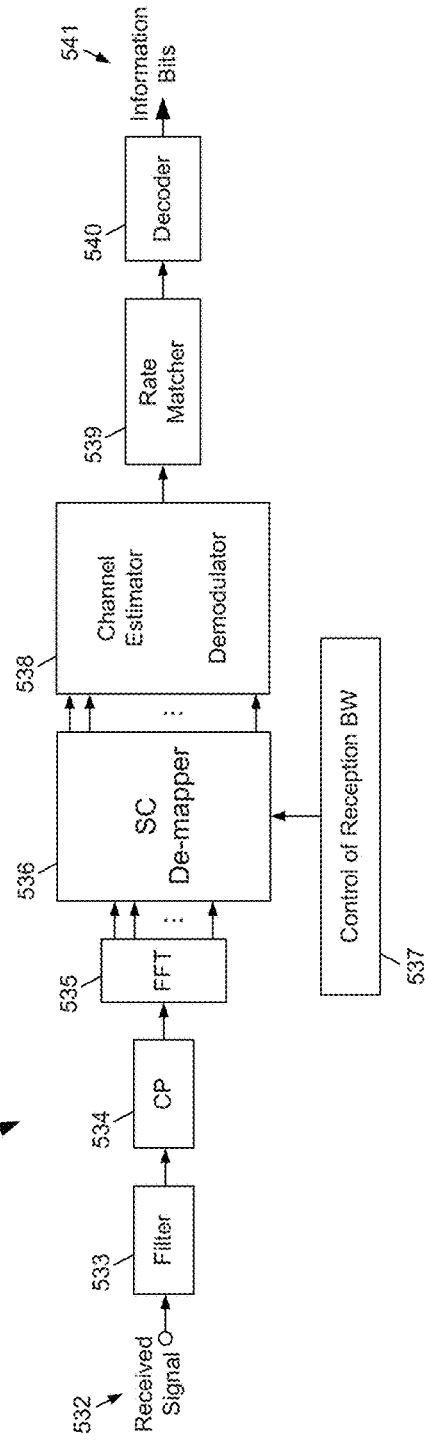
FIG. 5B depicts a block diagram of an example embodiment of an OFDM receiver structure according to the subject matter disclosed herein.

FIG. 5B depicts a block diagram of an example embodiment of an OFDM receiver structure 531 according to the subject matter disclosed herein. The embodiment of the receiver structure 531 depicted in FIG. 5B is for illustration only and an actual implementation may have the same or a similar configuration. FIG. 5B does not limit the scope of the subject matter disclosed herein to any particular implementation. As depicted in FIG. 5B, a received signal 532 may be filtered by a filter module 533. A CP removal module 534 may remove a cyclic prefix. A filter module 535 may apply a fast Fourier transform (FFT). An SC de-mapping module 536 may de-map SCs selected by BW selector module 537. Received symbols may be demodulated by a channel estimator and a demodulator module 538. A rate de-matcher module 539 may restore a rate matching, and a decoder module 540 may decode the resulting bits to provide data information bits 541. DL transmissions and UL transmissions may be based on an orthogonal frequency division multiplexing (OFDM) waveform that includes a variant using a DFT preceding that is known as DFT-spread-OFDM.

As previously mentioned, an objective in the 3GPP Rel-17 SID on RedCap NR devices is to support the same set of use cases in FR2 as in case of FR1. Beam refinement may be a key feature for FR2 operation in NR. An important issue relates to enabling a beam refinement procedure for RedCap UEs that are in a RRC_INACTIVE state (also referred to herein as a RRC Inactive state or an inactive mode). Accordingly, the subject matter disclosed herein provides a set of beam refinement procedures to enable RedCap in an inactive mode transmission in FR2.

Figure 6:
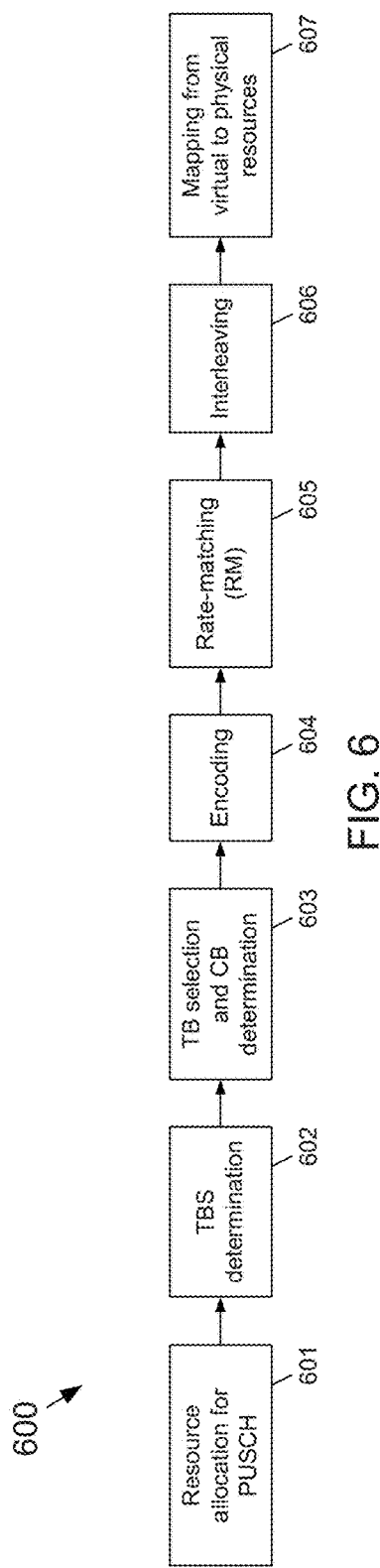
FIG. 6 shows a typical legacy processing flow in Release 16 at a transmitter for up and downlinks of a physical shared channel.

FIG. 6 shows a typical legacy processing flow 600 in Rel-16 at a transmitter for up and downlinks of a physical shared channel (PUSCH/PDSCH). At 601, an allocation may be made in the form of resources in a single slot corresponding to the transmission of one physical shared channel transmission. The allocation may be in the form of resources in multiple slots, in which case the allocation corresponds to the transmission of a physical shared channel with repetitions (e.g., type A or type B repetitions). The resources may be indicated to the transmitter either dynamically (e.g., via a DCI) or semi-statically (e.g., through a process of CG PUSCH transmission). The resources may include a set of OFDM symbols and subcarriers along with additional configurations for the physical shared channel transmission. The set of OFDM symbols may be contiguous or non-contiguous in time. The OFDM symbols may also be indicated in the form of sets of symbols in one or more slots. The set of subcarriers may be a set of contiguous or non-contiguous subcarriers, and may be indicated in the form of resource blocks or subsets of resource blocks. A combination of OFDM symbols and subcarriers correspond to resource elements that carry the coded bits of the PUSCH.

Most of the physical shared channel processing may primarily involve virtual resources and slots except at the mapping process 607 at the end of the processing sequence 600. Resources may be grouped into physical resources and virtual resources. A physical resource may be a resource that corresponds to actual time/frequency resources used by a transmitter for RF transmissions of a signal corresponding to the physical shared channel. A virtual resource may be a resource used by a transmitter in the process of generating the coded bits and modulation symbols corresponding to the physical shared channel. As used herein, references to "slots", "symbols" or "resources" indicate the virtual versions of those terms. Only when explicitly accompanied by the term "physical" do such references herein indicate physical terms.

At 602, a transmitter determines the Transport Block Size (TBS) based on the allocated resources and the configured resources for transmission overhead, such as Demodulation Reference Signal (DMRS) resources. At 603 the information bits contained in the Transport Block (TB) and the Code Block (CB) are determined. At 604, a Low-Density Parity Check (LDPC) encoding is performed on the different code blocks that may form the transport block. At 605, the output codeword for each code block is rate matched (RM) to the number of available coded bits for transmission of the code block in the physical shared channel. At 606, an interleaver maps the output of the rate matching onto the modulation symbols. At 607, mapping is performed from virtual symbols to physical symbols, which are then transmitted on the different resource elements of the physical shared channel that have been allocated.

When a Rel-16 physical shared channel is scheduled with repetitions/aggregations, the process 600 may be essentially repeated with a few differences for each repetition. For example, each repetition may be used to transmit the same TB; and in each repetition, a different Redundancy Version (RV) index may be used that may change the RM output for each repetition.

Figure 7:
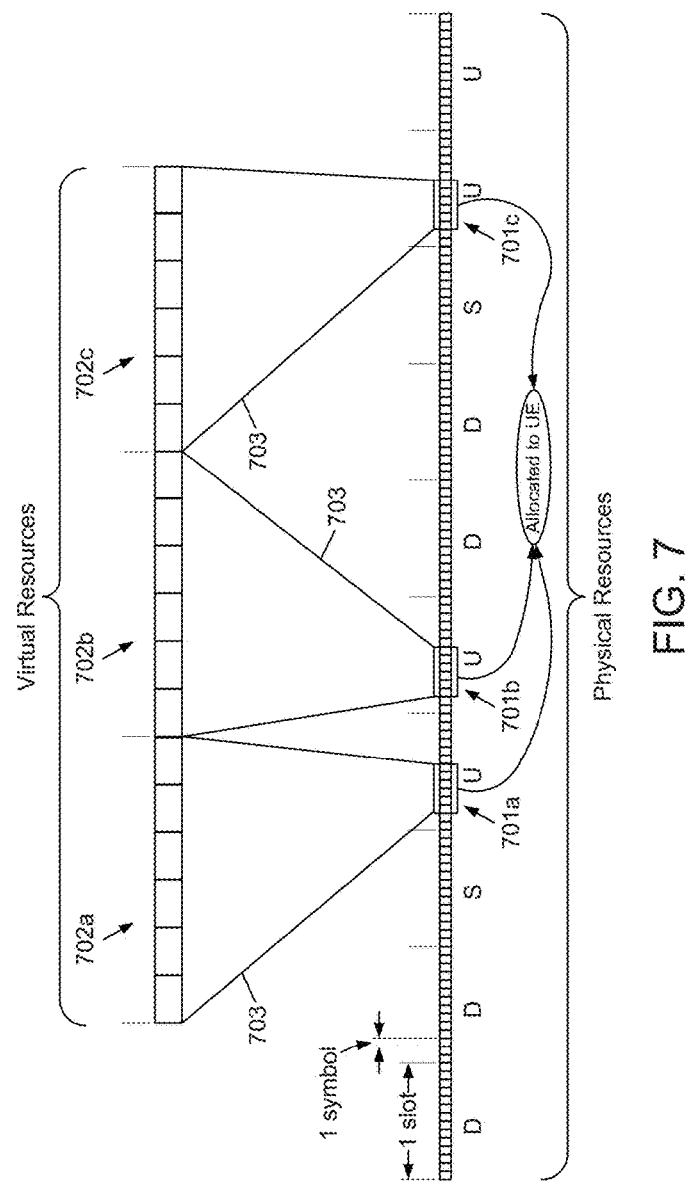
FIG. 7 depicts examples of physical and virtual resources that may be allocated to a UE in Release 16.

FIG. 7 depicts examples of physical and virtual resources that may be allocated to a UE in Rel-16. In FIG. 7, time resources have been allocated as three (3) UL slots 701a-701c for PUSCH transmission. In each slot there are six (6) consecutive allocated OFDM symbols starting from the second symbol (symbol number 2) in a slot. Depending on the Time Division Duplex (TDD) configuration, UL slots may be allocated that are consecutive, non-consecutive, or a combination of consecutive and non-consecutive slots. In the example of FIG. 7, if it is assumed that a TDD configuration results in the pattern DDSUU (S: 10D, 4U), then this TDD configuration corresponds to the UE being allocated the physical slots 701a-701c.

When performing the processing involved for PUSCH in Rel-16, the UE may use a virtual allocation 702a-702c in FIG. 7 that respectively correspond to the three consecutive UL slots 701a-701c. A mapping 703, therefore, exists between the virtual resources 702a-702c and the physical resources 701a-701c, as indicated in FIG. 7.

Determination of TBS and Maximum Data Rate

In Rel-16, determination of the TBS of the transport block may use the following Eq. (1), $$N_{info} = v * Q * r * N_{RE} \quad (1)$$

in which v is the number of layers used for the physical shared channel transmission, Q and r respectively are the modulation order and the coding rate specified by the Modulation and Coding Scheme (MCS) index, and $N_{RE}$ is the total number of available resources in the scheduled slot.

The TBS is approximately equal to $N_{info}$ in which the difference in size between TBS and $N_{info}$ is related to the addition of a cyclic redundancy code (CRC), the code block segmentation and the finite nature of the allowable TB S values in the specification.

For PUSCH (TS 6.1.4.2, TS 38.214):

if $0 \leq I_{MCS} \leq 27$ and transform precoding is disabled and Table 5.1.3.1-2 is used, or $0 \leq I_{MCS} \leq 28$ and transform precoding is disabled and a table other than Table 5.1.3.1-2 is used, or $0 \leq I_{MCS} \leq 27$ and transform precoding is enabled, the UE shall first determine the TBS as specified below:

The UE shall first determine the number of REs ($N_{RE}$) within the slot:

A UE first determines the number of REs allocated for PUSCH within a PRB ($N'_{RE}$) by $N'_{RE} = N_{sc}^{RB} \cdot N_{symb}^{sh} - N_{DMRS}^{PRB} - N_{oh}^{PRB}$, where $N_{sc}^{RB} = 12$ is the number of subcarriers in the frequency domain in a physical resource block, $N_{symb}^{sh}$ is the number of symbols of the PUSCH allocation within the slot, $N_{DMRS}^{PRB}$ is the number of REs for DM-RS per PRB in the allocated duration including the overhead of the DM-RS CDM groups without data, as described for PUSCH with a configured grant in Subclause 6.1.2.3 or as indicated by DCI format 0_1 or as described for DCI format 0_0 in Subclause 6.2.2, and $N_{oh}^{PRB}$ is the overhead configured by higher layer parameter xOverhead in PUSCH-ServingCellConfig. If the $N_{oh}^{PRB}$ is not configured (a value from 6, 12, or 18), the $N_{oh}^{PRB}$ is assumed to be 0. For Msg3 transmission the $N_{oh}^{PRB}$ is always set to 0.

A UE determines the total number of REs allocated for PUSCH ($N_{RE}$) by $N_{RE} = \min(156, N'_{RE}) \cdot n_{PRB}$ where $n_{PRB}$ is the total number of allocated PRBs for the UE.

Next, proceed with steps 2-4 as defined in Subclause 5.1.3.2

For PDSCH (TS 5.1.3.2, TS 38.214):

The UE shall first determine the number of REs ($N_{RE}$) within the slot.
A UE first determines the number of REs allocated for PDSCH within a PRB ($N'_{RE}$) by
$N'_{RE} = N_{sc}^{RB} \cdot N_{symb}^{sh} - N_{DMRS}^{PRB} - N_{oh}^{PRB}$, where $N_{sc}^{RB} = 12$ is the number of subcarriers in a physical resource block, $N_{symb}^{sh}$ is the number of symbols of the PDSCH allocation within the slot, $N_{DMRS}^{PRB}$ is the number of REs for DM-RS per PRB in the scheduled duration including the overhead of the DM-RS CDM groups without data, as indicated by DCI format 1_1 or as described for format 1_0 in Subclause 5.1.6.2, and $N_{oh}^{PRB}$ is the overhead configured by higher layer parameter xOverhead in PDSCH-ServingCellConfig. If the xOverhead in PDSCH-ServingCellconfig is not configured (a value from 0, 6, 12, or 18), the $N_{oh}^{PRB}$ is set to 0. If the PDSCH is scheduled by PDCCH with a CRC scrambled by SI-RNTI, RA-RNTI or P-RNTI, $N_{oh}^{PRB}$ is assumed to be 0.
A UE determines the total number of REs allocated for PDSCH ($N_{RE}$) by
$N_{RE} = \min(156, N'_{RE}) \cdot n_{PRB}$, where $n_{PRB}$ is the total number of allocated PRBs for the UE.

2) Intermediate number of information bits ($N_{info}$) is obtained by $N_{info} = N_{RE} \cdot R \cdot Q_m \cdot v$.
   If $N_{info} \leq 3824$
      Use step 3 as the next step of the TBS determination
   else
      Use step 4 as the next step of the TBS determination
   end if 3) When $N_{info} \leq 3824$, TBS is determined as follows quantized intermediate number of information bits $N'_{info} = \max\left(24, 2^n \cdot \left\lfloor \frac{N_{info}}{2^n} \right\rfloor \right)$, where $n = \max(3, \lfloor \log_2(N_{info}) \rfloor - 6)$.
   use Table 5.1.3.2-1 find the closest TBS that is not less than $N_{info}'$.

4) When $N_{info} > 3824$, TBS is determined as follows.

quantized intermediate number of information bits $N'_{info} = \max\left(3840, 2^n \times \text{round}\left(\frac{N_{info} - 24}{2^n}\right)\right)$, where $n = \lfloor \log_2(N_{info} - 24) \rfloor - 5$ and ties in the round function are broken towards the next largest integer.
   if $R \leq 1/4$ $$TBS = 8 \cdot C \cdot \left\lceil \frac{N'_{info} + 24}{8 \cdot C} \right\rceil - 24, \text{ where } C = \left\lceil \frac{N'_{info} + 24}{3816} \right\rceil$$

else
      if $N_{info}' > 8424$ $$TBS = 8 \cdot C \cdot \left\lceil \frac{N'_{info} + 24}{8 \cdot C} \right\rceil - 24, \text{ where } C = \left\lceil \frac{N'_{info} + 24}{8424} \right\rceil$$

else $$TBS = 8 \cdot \left\lceil \frac{N'_{info} + 24}{8} \right\rceil - 24$$

end if
   end if

The New Radio (NR) standard specifies the maximum data rate that may be attained given particular UE capabilities. The following text from Specification No. 38.306 specifies the procedure to compute the maximum data rate.

4.1.2 Supported Max Data Rate for DL/UL

For NR, the approximate data rate for a given number of aggregated carriers in a band or band combination is computed as follows.

$$\text{data rate (in Mbps)} = 10^{-6} \cdot \sum_{j=1}^{J} \left( v_{Layers}^{(j)} \cdot Q_m^{(j)} \cdot f^{(j)} \cdot R_{max} \cdot \frac{N_{PRB}^{BW(j),\mu} \cdot 12}{T_s^\mu} \cdot (1 - OH^{(j)}) \right)$$

wherein
J is the number of aggregated component carriers in a band or band combination
$R_{max} = 948/1024$
For the j-th CC,
Layers $v_{layers}^{(j)}$ is the maximum number of supported layers given by higher layer parameter maxNumberMIMO-LayersPDSCH for downlink and maximum of higher layer parameters maxNumberMIMO-LayersCB-PUSCH and maxNumberMIMO-Layers-NonCB-PUSCH for uplink.
$Q_m^{(j)}$ is the maximum supported modulation order given by higher layer parameter supportedModulationOrderDL for downlink and higher layer parameter supportedModulationOrderUL for uplink.
$f^{(j)}$ is the scaling factor given by higher layer parameter scaling Factor and can take the values 1, 0.8, 0.75, and 0.4.
μ is the numerology (as defined in TS 38.211 [6])
$T_s^\mu$ is the average OFDM symbol duration in a subframe for numerology μ, i.e.

$$T_s^\mu = \frac{10^{-3}}{14 \cdot 2^\mu}.$$

Note that normal cyclic prefix is assumed.
$N_{PRB}^{BW(j),\mu}$ is the maximum RB allocation in bandwidth $BW^{(j)}$ with numerology μ, as defined in 5.3 TS 38.101-1 [2] and 5.3 TS 38.101-2 [3], where $BW^{(j)}$ is the UE supported maximum bandwidth in the given band or band combination.
$OH^{(j)}$ is the overhead and takes the following values
 0.14, for frequency range FR1 for DL
 0.18, for frequency range FR2 for DL
 0.08, for frequency range FR1 for UL
 0.10, for frequency range FR2 for UL
NOTE 1: Only one of the UL or SUL carriers (the one with the higher data rate) is counted for a cell operating SUL.
NOTE 2: For UL Tx switching between carriers, only the supported MIMO layer combination across carriers that results in the highest combined data rate is counted for the carriers in the supported maximum UL data rate.
The approximate maximum data rate can be computed as the maximum of the approximate data rates computed using the above formula for each of the supported band or band combinations. For single carrier NR SA operation, the UE shall support a data rate for the carrier that is no smaller than the data rate computed using the above formula, with J=1 CC and component $v_{Layers}^{(j)} \cdot Q_m^{(j)} \cdot f_\square^{(j)}$ is no smaller than 4.

NOTE: As an example, the value 4 in the component above can correspond to $v_{Layers}^{(j)}=1$,
$Q_m^{(j)}4$ and $f_\square^{(j)}=1$.

For EUTRA in case of MR-DC, the approximate data rate for a given number of aggregated carriers in a band or band combination is computed as follows.

$$\text{Data rate (in Mbps)} = 10^{-3} \cdot \Sigma_{j=1}^{J} TBS_j$$

wherein
J is the number of aggregated EUTRA component carriers in MR-DC band combination
$TBS_j$ is the total maximum number of DL-SCH transport block bits received or the total maximum number of UL-SCH transport block bits transmitted, within a 1 ms TTI for j-th CC, as derived from TS36.213 [19] based on the UE supported maximum MIMO layers for the j-th CC, and based on the maximum modulation order for the j-th CC and number of PRBs based on the bandwidth of the j-th CC according to indicated UE capabilities.
The approximate maximum data rate can be computed as the maximum of the approximate data rates computed using the above formula for each of the supported band or band combinations. For MR-DC, the approximate maximum data rate is computed as the sum of the approximate maximum data rates from NR and EUTRA.

The following example rate matching and interleaving procedure applied for PUSCH is described in 3GPP TS 38.212.

Denoting by $E_r$ the rate matching output sequence length for the r-th coded block, where the value of $E_r$ is determined as follows:
Set j=0
for r=0 to C−1
 if the r-th coded block is not scheduled for transmission as indicated by CBGTI according to Clause 5.1.7.2 for DL-SCH and 6.1.5.2 for UL-SCH in [6, TS 38.214]

$E_r=0$;

else
  if $j \leq C-\text{mod}(G/(N_L \cdot Q_m),C)-1$ $$E_r = N_L \cdot Q_m \cdot \left\lfloor \frac{G}{N_L \cdot Q_m \cdot C'} \right\rfloor;$$

else $$E_r = N_L \cdot Q_m \cdot \left\lceil \frac{G}{N_L \cdot Q_m \cdot C'} \right\rceil;$$

end if
  j=j+1;
 end if
end for
where
$N_L$ is the number of transmission layers that the transport block is mapped onto;
$Q_m$ is the modulation order;
G is the total number of coded bits available for transmission of the transport block;
C=C if CBGTI is not present in the DCI scheduling the transport block and C" is the number of scheduled code blocks of the transport block if CBGTI is present in the DCI scheduling the transport block.

Denote by $rv_{id}$ the redundancy version number for this transmission ($rv_{id}$=0, 1, 2 or 3), the rate matching output bit sequence $e_k$, k=0,1,2, . . . ,E−1, is generated as follows, where $k_0$ is given by Table 5.4.2.1-2 according to the value of $rv_{id}$ and LDPC base graph:

k=0;
j=0;
while k<E
   if $d_{(k_0+j) mod\ N_{cb}}$≠<NULL>
      $e_k$=$d_{(k_0+j) mod\ N_{cb}}$;
      k=k+1;
   end if
   j=j+1;
end while

TABLE 5.4.2.1-2

Starting position of different redundancy versions, $k_0$

| | $k_0$ | |
|---|---|---|
| $rv_{id}$ | LDPC base graph 1 | LDPC base graph 2 |
| 0 | 0 | 0 |
| 1 | $\left\lfloor \frac{17 N_{cb}}{66 Z_c} \right\rfloor Z_c$ | $\left\lfloor \frac{13 N_{cb}}{50 Z_c} \right\rfloor Z_c$ |
| 2 | $\left\lfloor \frac{33 N_{cb}}{66 Z_c} \right\rfloor Z_c$ | $\left\lfloor \frac{25 N_{cb}}{50 Z_c} \right\rfloor Z_c$ |
| 3 | $\left\lfloor \frac{56 N_{cb}}{66 Z_c} \right\rfloor Z_c$ | $\left\lfloor \frac{43 N_{cb}}{50 Z_c} \right\rfloor Z_c$ |

5.4.2.2 Bit Interleaving

The bit sequence $e_0, e_1, e_2, \ldots, e_{E-1}$ is interleaved to bit sequence $f_0, f_1, f_2, \ldots, f_{E-1}$, according to the following, where the value of $Q_m$ is the modulation order.

for j=0 to E/$Q_m$−1
   for i=0 to $Q_m$−1
      $f_{i+j \cdot Q_m} = e_{i \cdot E/Q_m + j}$;
   end for
end for For slot aggregation, Rel-16 follows Table 6.1.2.1-2 for determining the Redundancy Version (RV) index for the Registration Management (RM) output of each slot.

For PUSCH repetition Type A, in case K>1, the same symbol allocation is applied across the K consecutive slots and the PUSCH is limited to a single transmission layer. The UE shall repeat the TB across the K consecutive slots applying the same symbol allocation in each slot. The redundancy version to be applied on the nth transmission occasion of the TB, where n=0, 1, . . . K−1, is determined according to table 6.1.2.1-2.

TABLE 6.1.2.1-2

Redundancy version for PUSCH transmission

| $rv_{id}$ indicated by the DCI scheduling the PUSCH | $rv_{id}$ to be applied to $n^{th}$ transmission occasion (repetition Type A) or $n^{th}$ actual repetition (repetition Type B) | | | |
|---|---|---|---|---|
| | n mod 4 = 0 | n mod 4 = 1 | n mod 4 = 2 | n mod 4 = 3 |
| 0 | 0 | 2 | 3 | 1 |
| 2 | 2 | 3 | 1 | 0 |
| 3 | 3 | 1 | 0 | 2 |
| 1 | 1 | 0 | 2 | 3 |

TDD Configurations

In Rel-16, the network may provide a UE with a set of configurations (both semi-statically, e.g., Radio Resource Control (RRC), or dynamically) that indicate a particular configuration for UL slots and resources that dictates the possible transmission directions on these slots and resources. The configuration of the resources may be referred to as the TDD configuration.

In a TDD configuration, each OFDM Symbol (OS) in the UL frame structure may have one of three possible indications: Uplink (UL), Downlink (DL) or Flexible (F). If the OS has an indication to be UL or DL, then the possible direction of transmission on this symbol may only respectively be by UL or DL, while an indication of F provides transmission in both directions on the OS with the actual transmission being dependent on other factors, such as the scheduling type of the transmission.

The TDD configuration may be set in a semi-static manner. That is, a UE may be provided with RRC configurations that indicate a particular slot structure that repeats with a configured periodicity. The slot structure may span one or more slots, and may provide a configuration of UL/DL/F indications for the OS in those slots. The semi-static TDD configuration may either be a common configuration for all UEs in the cell or dedicated configurations for each UE. When both common and dedicated TDD configurations are present, the role of dedicated configurations may be to only override the indication of OS indicated as F in the common configuration. In this case, the overall indication of the OS for the UE would be specified as follows. UL is indicated if the common TDD configuration provides an UL indication, or common TDD configuration provides a F indication and dedicated TDD configuration provides an UL indication. DL is indicated if the common TDD configuration provides a DL indication, or common TDD configuration provides a F indication and dedicated TDD configuration provides a DL indication. F is indicated if both common and dedicated TDD configurations provide F indications.

A dynamic TDD configuration may also be provided to a UE. The dynamic TDD configuration may be referred to as a Slot Format Indication (SFI). Providing a dynamic TDD configuration may be performed by first configuring the UE with an indication that the UE should monitor for a DCI format 2_0 carrying a SFI field. The SFI field indicates one UL/DL/F configuration for one or more slots. The UL/DL/F configuration is intended to override the indication of OS in those slots that are semi-statically indicated as being F. Thus, if a UE is configured to monitor for SFI, the overall indication of the OS for the UE would be specified as follows. UL is indicated if it is semi-statically indicated as UL, or F and dynamic TDD configuration provides an UL indication. DL is indicated if it is semi-statically indicated as DL, or F and dynamic TDD configuration provides an DL indication. F is indicated if both semi-static and dynamic TDD configuration indicates it as F.

The actual transmission in an OS may depend on the transmitted signals (e.g., PDSCH, PUSCH, PDCCH, PUCCH, RS, etc.) and the scheduling type (e.g., dynamic scheduling, configured grant type 1 or type 2, semi-persistent scheduling, scheduling with repetitions Type A or Type B). For a PUSCH transmission, the PUSCH UL transmission may be cancelled due to a conflict with the TDD configuration of the OSs allocated for the PUSCH.

Cancellation Indication

For a cancellation indication in Rel-16, the network may provide a UE with a dynamic indication that UL transmissions are cancelled/prohibited in particular resources. The network may opt to perform a cancellation of UL transmission of some UEs to free the corresponding resources for the use for other transmissions (e.g., transmissions of data with low-latency requirements). The UE may receive an indication of cancellation via a DCI format 2_4 that contains an indication of which time/frequency resources that the UE should cancel/refrain from a UL transmission.

Overlap of UL Transmissions

Regarding overlap of UL transmissions in Rel-16, a UE may encounter a situation in which multiple UL signals may be scheduled in resources that overlap in time and/or frequency. In such case, the UE may have to deal with this situation by proceeding with transmitting all signals simultaneously, multiplex the information of one UL transmission onto the other, and/or cancel the transmission of one or more of the UL transmissions.

The behavior of the UE depends on the types of UL transmissions. That is, a UE may be scheduled with PUSCHs of different types (Dynamic Grant or Configured Grant transmissions). Additionally, a UE may be scheduled with PUSCH or PUCCH transmissions that may be associated with a priority index. The priority index may allow the UE to determine the appropriate behavior when such signals are overlapping in time. For example, if a UE has PUCCHs and/or PUSCHs overlapping in time and if the overlapping signals have the same priority index, then it may be appropriate to multiplex the information of one or more of the PUCCHs onto other PUCCHs or onto other PUSCHs among the set of overlapping signals. Alternatively, if a UE has PUCCHs and/or PUSCHs overlapping in time and if the overlapping signals have different priority indices, the UE may have to cancel some UL signals with the lower priority index and proceed with transmitting the UL signals with the higher priority index.

Thus, in some situations the UE may have to cancel PUSCH transmissions if they collide in time with other UL signals that, for example, may have higher priority index than the PUSCH. A UE may also cancel a CG-PUSCH transmission if the transmission overlaps in time with a DG-PUSCH of the same HARQ process ID.

Overlap Between Dynamically Scheduled DL Signals and UL Signals Scheduled by Higher Layers In Rel-16, a UE may be scheduled to transmit UL signals either dynamically (e.g., through a scheduling DCI received from the gNB) or via higher layers (e.g., through configured grants type 1 or 2). Within an unpaired spectrum, a situation may then occur when the UE may be indicated by higher layers to transmit a PUSCH and then receives a dynamic scheduling of a DL signal, such as a PDSCH or a CSI-RS. In this case in Rel-16, the UE drops the UL transmission based on a particular timeline that allows the UE to process the DL reception request. The following text from the specification describes such an operation. Dynamically scheduled PDSCH and/or CSI-RS may, therefore, be a source of cancellation for some UL PUSCH.

For operation on a single carrier in unpaired spectrum, if a UE is configured by higher layers to transmit SRS, or PUCCH, or PUSCH, or PRACH in a set of symbols of a slot and the UE detects a DCI format indicating to the UE to receive CSI-RS or PDSCH in a subset of symbols from the set of symbols, then the UE does not expect to cancel the transmission in symbols from the set of symbols that occur, relative to a last symbol of a CORESET where the UE detects the DCI format, after a number of symbols that is smaller than the PUSCH preparation time $T_{proc,2}$ for the corresponding UE processing capability [6, TS 38.214] assuming $d_{2,1}=1$ and μ corresponds to the smallest SCS configuration between the SCS configuration of the PDCCH carrying the DCI format and the SCS configuration of the SRS, PUCCH, PUSCH or $μ_r$, where $μ_r$ corresponds to the SCS configuration of the PRACH if it is 15 kHz or higher; otherwise $μ_r=0$ the UE cancels the PUCCH, or the PUSCH, or an actual repetition of the PUSCH [6, TS 38.214], determined from Clauses 9 and 9.2.5 or Clause 6.1 of [6. TS 38.214], or the PRACH transmission in remaining symbols from the set of symbols and cancels the SRS transmission in remaining symbols from the subset of symbols In Rel-16, a UE may be scheduled to receive DL signals either dynamically (e.g., through a scheduling DCI received from the gNB) or via higher layers (e.g., through semi-persistent scheduling). Within an unpaired spectrum, a situation may then arise when the UE may be indicated by higher layers to receive a PDSCH and then receives a dynamic scheduling of an UL signal, such as a PUSCH, PUCCH, SRS-RS or PRACH. Rel-16 instructs the UE in this case to proceed with the UL transmission and cancel the DL reception request. The following text from the specification describes this operation. Dynamically scheduled UL signals may, therefore, be a source of cancellation for some DL PDSCH.

If a UE is configured by higher layers to receive a CSI-RS or a PDSCH in a set of symbols of a slot and the UE detects a DCI format 2_0 with a slot format value other than 255 that indicates a slot format with a subset of symbols from the set of symbols as uplink or flexible, or the UE detects a DCI format indicating to the UE to transmit PUSCH, PUCCH, SRS, or PRACH in at least one symbol in the set of the symbols, the UE cancels the CSI-RS reception in the set of symbols of the slot or cancels the PDSCH reception in the slot.

UCI Multiplexing on PUSCH

Figure 8:
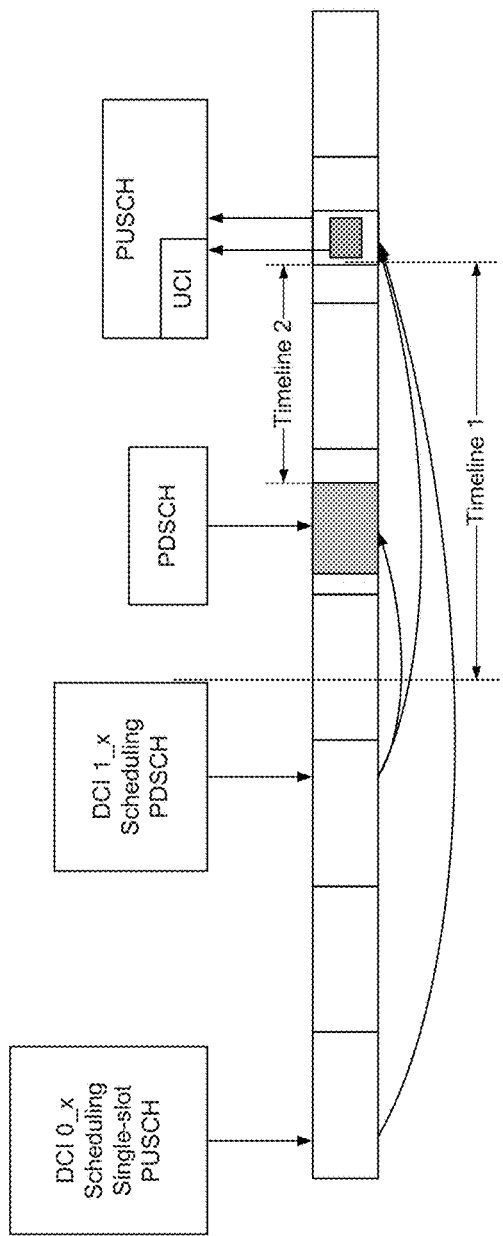
FIG. 8 depicts multiplexing of Uplink Control Information on a Physical Uplink Shared Channel when scheduled resources overlap in Release 16.

FIG. 8 depicts a UE multiplexing Uplink Control Information (UCI) on PUSCH when scheduled resources overlap, which is allowed in Rel-16. As depicted in FIG. 8, a UCI carrying DL HARQ feedback may be scheduled in overlapping resources using a PUSCH, and is, for example, multiplexed on the PUSCH at 801. When PUCCH and PUSCH are multiplexed, Rel-16 specifies Timeline 1 and Timeline 2 constraints between the different signals. Timeline 2 represents the minimum time between all scheduled PDSCHs with which the HARQ feedback is to be multiplexed, and the resources of the multiplexed signals. The following is from TS 38.213.

If a UE would transmit multiple overlapping PUCCHs in a slot or overlapping PUCCH(s) and PUSCH(s) in a slot and, when applicable as described in Clauses 9.2.5.1 and 9.2.5.2, the UE is configured to multiplex different UCI types in one PUCCH, and at least one of the multiple overlapping PUCCHs or PUSCHs is in response to a DCI format detection by the UE, the UE multiplexes all corresponding UCI types if the following conditions are met. If one of the PUCCH transmissions or PUSCH transmissions is in response to a DCI format detection by the UE, the UE expects that the first symbol S, of the earliest PUCCH or PUSCH, among a group overlapping PUCCHs and PUSCHs in the slot, satisfies the following timeline conditions s$_0$ is not before a symbol with CP starting after $T_{proc,1}^{mux}$ after a last symbol of any corresponding PDSCH, $T_{proc,1}^{mux}$ is given by maximum of $\{T_{proc,1}^{mux,1}, \ldots, T_{proc,1}^{mux,i}, \ldots\}$ where for the i-th PDSCH with corresponding HARQ-ACK transmission on a PUCCH which is in the group of overlapping PUCCHs and PUSCHs, $T_{proc,1}^{mux,i}=(N_1+d_{1,1}+1)\cdot(2048+144)\cdot\kappa\cdot2^{-\mu}\cdot T_C$, $d_{1,1}$ is selected for the i-th PDSCH following [6, TS 38.214], $N_1$ is selected based on the UE PDSCH processing capability of the i-th PDSCH and SCS configuration μ, where μ corresponds to the smallest SCS configuration among the SCS configurations used for the PDCCH scheduling the i-th PDSCH (if any), the i-th PDSCH, the PUCCH with corresponding HARQ-ACK transmission for i-th PDSCH, and all PUSCHs in the group of overlapping PUCCHs and PUSCHs.

Timeline 2 in FIG. 8 may account for the decoding time necessary to decode the PDSCHs and determine the HARQ feedback values to be multiplexed. Timeline 1 in FIG. 8 is the minimum duration between all DCIs involved in scheduling the PUCCHs and/or PUSCH signals that are to be multiplexed and the scheduled resources themselves. The following text is from TS 38.214.

if there is no aperiodic CSI report multiplexed in a PUSCH in the group of overlapping PUCCHs and PUSCHs, s$_0$ is not before a symbol with CP starting after $T_{proc,2}^{mux}$ after a last symbol of
  any PDCCH with the DCI format scheduling an overlapping PUSCH, and
  any PDCCH scheduling a PDSCH or SPS PDSCH release with corresponding HARQ-ACK information in an overlapping PUCCH in the slot If there is at least one PUSCH in the group of overlapping PUCCHs and PUSCHs, $T_{proc,2}^{mux}$ is given by maximum of $\{T_{proc,2}^{mux,1}, \ldots, T_{proc,2}^{mux,i} \ldots\}$ where for the i-th PUSCH which is in the group of overlapping PUCCHs and PUSCHs, $T_{proc,2}^{mux,i}=\max((N_2+d_{2,1}+1)\cdot(2048+144)\cdot\kappa\cdot2^{-\mu}\cdot T_C, d_{2,2})$, $d_{2,1}$ and $d_{2,2}$ are selected for the i-th PUSCH following [6, TS 38.214], $N_2$ is selected based on the UE PUSCH processing capability of the i-th PUSCH and SCS configuration where μ corresponds to the smallest SCS configuration among the SCS configurations used for the PDCCH scheduling the i-th PUSCH (if any), the PDCCHs scheduling the PDSCHs with corresponding HARQ-ACK transmission on a PUCCH which is in the group of overlapping PUCCHs/PUSCHs, and all PUSCHs in the group of overlapping PUCCHs and PUSCHs.

If there is no PUSCH in the group of overlapping PUCCHs and PUSCHs, $T_{proc,2}^{mux}$ is given by maximum of $\{T_{proc,2}^{mux,1}, \ldots, T_{proc,2}^{mux,i} \ldots\}$ where for the i-th PDSCH with corresponding HARQ-ACK transmission on a PUCCH which is in the group of overlapping PUCCHs, $T_{proc,2}^{mux,i}=(N_2+1)\cdot(2048+144)\cdot\kappa\cdot2^{-\mu}\cdot T_C$, $N_2$ is selected based on the UE PUSCH processing capability of the PUCCH serving cell if configured. $N_2$ is selected based on the UE PUSCH processing capability 1, if PUSCH processing capability is not configured for the PUCCH serving cell. μ is selected based on the smallest SCS configuration between the SCS configuration used for the PDCCH scheduling the i-th PDSCH (if any) with corresponding HARQ-ACK transmission on a PUCCH which is in the group of overlapping PUCCHs, and the SCS configuration for the PUCCH serving cell.

Timeline 1 in FIG. 8 accounts for a time duration for preparing the PUSCH signals, and may be specified between the first symbol of the overlapping resources and every DCI scheduling any of the signals involved in the multiplexing situation. This may ensure that the UE is aware of the multiplexing signals sufficiently early to prepare the corresponding PUSCH. It should be noted that without knowing that the multiplexing effect is yet to take place, a UE may technically proceed with preparing the PUSCH by determining TBS based on the allocated PUSCH resources, establishing code blocks and performing coding, as depicted in FIG. 6. Determining the RM output, however, should not be performed until the effect of multiplexing is known. Thus, it may be considered that the Timeline 2 is intended to allow enough time for processing the RM output and not for the entire PUSCH preparation time.

When handling UCI multiplexing with PUSCH scheduled with repetition, it may seem there is no distinction among the different PUSCHs in the repetitions; that is, the Timelines 1 and 2 in FIG. 8 hold considering the actual PUSCH affected by multiplexing.

UE Capabilities

Another aspect of Rel-16 NR is the ability of performing Carrier Aggregation (CA). In CA, a UE is able to use multiple component carriers (CCs) for transmission, thereby allowing the UE to utilize a larger bandwidth than what would be possible using a single component carrier. Rel-16 NR allows multiple modes of carrier aggregation, which include an intra-band frequency aggregation with contiguous component carriers, an intra-band frequency aggregation with non-contiguous component carriers; and an inter-band frequency aggregation with non-contiguous component carriers.

Categorization of the CA modes may be dependent on the collection of bands containing the component carriers that are used. The collection of bands may be referred to as the band combination. In NR, carrier aggregation is applied across cells. The UE initially connects to one cell in the CA, which is referred to as the Primary Cell (PCell). Then, the UE finds and connects to multiple other cells in the CA, referred to as Secondary Cells (SCells). A UE in CA is able to use each cell for transmission and reception for different combinations of signals. For example, a UE may send/receive a PUSCH on one cell and send/receive a Sounding Reference Signal (SRS) signal on another cell.

The standard, however, specifies certain timeline rules and conditions for such simultaneous transmission/reception of signals in CA. Even with timeline rules and requirements, the standard does not mandate that every NR-connected UE is able to perform such simultaneous usage of component carriers in CA. In fact, a UE may have the capability of performing certain transmission/reception tasks in CA while not having the capability to perform other tasks.

Another factor that affects the UE capability is whether Frequency Division Duplex (FDD) or Time Division Duplex (TDD) is assumed. A UE may or may not be able to perform a task on FDD bands/band combinations while UE may or may not be unable to perform the same task on TDD bands/band combinations. To fully utilize a capability of the UE and better-optimize the use of the network, a gNB may be informed of the capabilities of the UE that are then taken into account when the gNB schedules transmission/reception for UEs in the network.

A UE capability refers to a mechanism with which the UE informs the gNB of its capability to perform certain transmission/reception tasks. One UE capability reported to the gNB informs the gNB of the UE ability to perform a particular task. The UE capability mechanism provides a UE with a flexibility to report its capability in different transmission scenarios.

A UE may report its capability to perform certain tasks in any scenario, in which case the UE reports its capability on a per-UE basis. A UE may report its capability to perform certain tasks in particular bands, in which case the UE reports its capability on a per-band basis. A UE may report its capability to perform certain tasks in particular band combinations in CA, in which case the UE reports its capability on a per-band combination or per-BC basis. A UE may report its capability to perform certain tasks in CA in certain situations, i.e., not necessarily always for a given band combination. In this case, a mechanism referred to as feature sets may be used to allow for such flexibility in reporting, in which case the UE reports its capability on a per-featureSet or per-FS basis in that case. Other ways of reporting UE capability are also possible.

A UE capability may inform a gNB that a UE is, for example, able/not able to transmit certain UL signals in certain bands. The UE capability mechanism has the flexibility to indicate that the UE is able to perform a certain task in certain scenarios, and to indicate that the UE unable to perform the same task in other scenarios. For example, certain UE capabilities may be signalled to the gNB on a per-band basis, that is, for a given task, a UE may have different capabilities for different bands. Some UE capabilities may be universal across bands/band combination, i.e., the capabilities are per-UE based. In the case of CA, UE capabilities may be signalled on a per-band-combination basis. With respect to CA, the ability of a UE to perform certain tasks may be dependent on the combination of bands involved in the CA. For example, a UE may be able to perform simultaneous transmission of two UL signals when the band combination in the CA is intra-band, but may not be able to perform the transmission in the case of inter-band CA.

In Release-15 NR, simultaneous transmission of UL signals in CA is not always allowed. In fact, allowing simultaneous transmission of UL signals in CA may be governed by UE capabilities for the particular band combinations used in CA.

The following specific rules apply in Release-15. In the case of intra-band carrier-aggregation or in inter-band CA band-band combination in which simultaneous SRS and PUCCH/PUSCH transmissions are not allowed, a UE is not expected to be configured with SRS from a carrier and PUSCH/UL DM-RS/UL PT-RS/PUCCH formats from a different carrier in the same symbol. In the case of intra-band CA or in inter-band CA band-band combination in which simultaneous SRS and PRACH transmissions are not allowed, a UE shall not transmit simultaneously SRS resource(s) from a carrier and PRACH from a different carrier. In the case of inter-band carrier aggregation, a UE can simultaneously transmit SRS and PUCCH/PUSCH across component carriers in different bands subject to the capability of the UE. In the case of inter-band carrier aggregation, a UE can simultaneously transmit PRACH and SRS across component carriers in different bands subject to the capability of the UE.

Table 1 provides a list of UE capabilities in Rel-15 as parameters relating to simultaneous transmission of UL signals in CA.

TABLE 1

| Definitions for parameters | Per | M | FDD-TDD DIFF | FR1-FR2 DIFF |
|---|---|---|---|---|
| ca-BandwidthClassDL-EUTRA<br>Defines for DL, the class defined by the aggregated transmission bandwidth configuration and maximum number of component carriers supported by the UE, as specified in TS 36.101 [14]. When all FeatureSetEUTRA-DownlinkId.s in the corresponding FeatureSetsPerBand are zero, this field is absent. | Band | No | N/A | N/A |
| ca-BandwidthClassDL-NR<br>Defines for DL, the class defined by the aggregated transmission bandwidth configuration and maximum number of component carriers supported by the UE, as specified in TS 38.101-1 [3]. When all FeatureSetDownlinkId.s in the corresponding FeatureSetsPerBand are zero, this field is absent. For FR1, the value 'F' shall not be used as it is invalidated in TS 38.101-1 [2]. | Band | No | N/A | N/A |
| ca-BandwidthClassUL-EUTRA<br>Defines for UL, the class defined by the aggregated transmission bandwidth configuration and maximum number of component carriers supported by the UE, as specified in TS 36.101 [14]. When all FeatureSetEUTRA-UplinkId.s in the corresponding FeatureSetsPerBand are zero, this field is absent. | Band | No | N/A | N/A |
| ca-BandwidthClassUL-NR<br>Defines for UL, the class defined by the aggregated transmission bandwidth configuration and maximum number of component carriers supported by the UE, as specified in TS 38.101-1 [3]. When all FeatureSetUplinkId:s in the corresponding FeatureSetsPerBand are zero, this field is absent. For FR1, the value 'F' shall not be used as it is invalidated in TS 38.101-1 [2]. | Band | No | N/A | N/A |
| channelBWs-DL<br>Indicates for each subcarrier spacing the UE supported channel bandwidths.<br>Absence of the channelBWs-DL (without suffix) for a band or absence of specific scs-XXkHz entry for a supported subcarrier | Band | Yes | N/A | N/A |

TABLE 1-continued

| Definitions for parameters | Per | M | FDD-TDD DIFF | FR1-FR2 DIFF |
|---|---|---|---|---|
| spacing means that the UE supports the channel bandwidths among 30, 40, 50, 60, 80, 100] and [50, 100, 200] that were defined in clause 5.3.5 of TS 38.101-1 version 15.7.0 [2] and TS 38.101-2 version 15.7.0 [3] for the given band or the specifc SCS entry. For IAB-MT, to determine whether the IAB-MT supports a channel bandwidth of 100 MHz, the network checks channelBW-DL-IAB-r16. For FR1, the bits in channelBWs-DL (without suffix) starting from the leading/leftmost bit indicate 5, 10, 15, 20, 25, 30, 40, 50, 60 and 80MHz. For FR2, the bits in channelBWs-DL (without suffix) starting from the leading / leftmost bit indicate 50, 100 and 200MHz. The third/rightmost bit (for 200MHz) shall be set to 1. For IAB-MT the third/rightmost bit (for 200MHz) is ignored. To determine whether the IAB-MT supports a channel bandwidth of 200 MHz, the network checks channelBW-DL-IAB-r16. For FR1, the leading/leftmost bit in channelBWs-DL-v1590 indicates 70MHz, the second leftmost bit indicates 45MHz, the third leftmost bit indicates 35MHz and all the remaining bits in channelBWs-DL-v1590 shall be set to 0. NOTE: To determine whether the UE supports a specific SCS for a given band, the network validates the supportedSubCarrierSpacingDL and the scs-60kHz. To determine whether the UE supports a channel bandwidth of 90 MHz, the network may ignore this capability and validate instead the channelBW-90mhz and the supportedBandwidthCombinationSet. For serving cell(s) with other channel bandwidths the network validates the channelBWs-DL, the supportedBandwidthCombinationSet, the supportedBandwidthCombinationSetIntraENDC, the asymmetricBandwidthCombinationSet (for a band supporting asymmetric channel bandwidth as defined in clause 5.3.6 of TS 38.101-1 [2]) and supportedBandwidthDL. | | | | |
| channelBWs-UL Indicates for each subcarrier spacing the UE supported channel bandwidths. Absence of the channelBWs-UL (without suffix) for a band or absence of specific scs-XXkHz entry for a supported subcarrier spacing means that the UE supports the channel bandwidths among 30, 40, 50, 60, 80, 100] and [50, 100, 200] that were defined in clause 5.3.5 of TS 38.101-1 version 15.7.0 [2] and TS 38.101-2 version 15.7.0 [3] for the given band or the specifc SCS entry. For IAB-MT, to determine whether the IAB-MT supports a channel bandwidth of 100 MHz, the network checks channelBW-UL-IAB-r16. For FR1, the bits in channelBWs-UL (without suffix) starting from the leading/leftmost bit indicate 5, 10, 15, 20, 25, 30, 40, 50, 60 and 80MHz. For FR2, the bits in channelBWs-UL (without suffix) starting from the leading / leftmost bit indicate 50, 100 and 200MHz. The third/rightmost bit (for 200MHz) shall be set to 1. For IAB-MT the third/rightmost bit (for 200MHz) is ignored. To determine whether the IAB-MT supports a channel bandwidth of 200 MHz, the network checks channelBW-UL-IAB-r16. For FR1, the leading/leftmost bit in channelBWs-UL-v1590 indicates 70 MHz, the second leftmost bit indicates 45MHz, the third leftmost bit indicates 35MHz and all the remaining bits in channelBWs-UL-v1590 shall be set to 0. NOTE: To determine whether the UE supports a specific SCS for a given band, the network validates the supportedSubCarrierSpacingUL and the scs-60kHz. To determine whether the UE supports a channel bandwidth of 90 MHz the network may ignore this capability and validate instead the channelBW-90mhz and the supportedBandwidthCombiantionSet. For serving cell(s) with other channel bandwidths the network validates the channelBWs-UL, the supportedBandwidthCombinationSet, the supportedBandwidthCombinationSetIntraENDC, the asymmetricBandwidthCombinationSet (for a band supporting asymmetric channel bandwidth as defined in clause 5.3.6 of TS 38.101-1 [2]) and supportedBandwidthUL. | Band | Yes | N/A | N/A |
| multipleRateMatchingEUTRA-CRS-r16 Indicates whether the UE supports multiple E-UTRA CRS rate matching patterns, which is supported only for FR1. The capability signalling comprises the following parameters: - maxNumberPatterns-r16 indicates the maximum number of LTE-CRS rate matching patterns in total within a NR carrier | Band | No | N/A | FR1 only |

TABLE 1-continued

| Definitions for parameters | Per | M | FDD-TDD DIFF | FR1-FR2 DIFF |
|---|---|---|---|---|
| using 15 kHz SCS. The UE can report the value larger than 2 only if UE reports the value of maxNumberNon-OverlapPatterns-r16 is larger than 1.<br>- maxNumberNon-OverlapPatterns-r16 indicates the maximum number of LTE-CRS non-overlapping rate matching patterns within a NR carrier using 15 kHz SCS. The UE can include this feature only if the UE indicates support of rateMatchingLTE-CRS. | | | | |
| overlapRateMatchingEUTRA-CRS-r16<br>Indicates whether the UE supports two LTE-CRS overlapping rate matching patterns within a part of NR carrier using 15 kHz SCS overlapping with a LTE carrier. If the UE supports this feature, the UE needs to report multipleRateMatchingEUTRA-CRS-r16. | Band | No | N/A | FR1 only |
| pdsch-256QAM-FR2<br>Indicates whether the UE supports 256QAM modulation scheme for PDSCH for FR2 as defined in 7.3.1.2 of TS 38.211 [6]. | Band | No | N/A | FR2 only |
| pusch-256QAM<br>Indicates whether the UE supports 256QAM modulation scheme for PUSCH as defined in 6.3.1.2 of TS 38.211 [6]. | Band | No | N/A | N/A |
| rateMatchingLTE-CRS<br>Indicates whether the UE supports receiving PDSCH with resource mapping that excludes the REs determined by the higher layer configuration LTE-carrier configuring common RS, as specified in TS 38.214 [12]. | Band | Yes | N/A | N/A |
| separateCRS-RateMatching-r16<br>Indicates whether the UE supports rate match around configured CRS patterns which is associated with CORESETPoolIndex (if configured) and are applied to the PDSCH scheduled with a DCI detected on a CORESET with the same value of CORESETPoolIndex. The UE that indicates support of this feature shall support multiDCI-MultiTRP-r16 and overlapRateMatchingEUTRA-CRS-r16. This is only applicable for 15kHz SCS. | Band | No | N/A | FR1 only |
| oneFL-DMRS-ThreeAdditionalDMRS-DL<br>Defines whether the UE supports DM-RS pattern for DL transmission with 1 symbol front-loaded DM-RS with three additional DM-RS symbols. | FS | No | N/A | N/A |
| oneFL-DMRS-TwoAdditionalDMRS-DL<br>Defines support of DM-RS pattern for DL transmission with 1 symbol front-loaded DM-RS with 2 additional DM-RS symbols and more than 1 antenna ports. | FS | Yes | N/A | N/A |
| channelBW-90mhz<br>Indicates whether the UE supports the channel bandwidth of 90 MHz.<br>For FR1, the UE shall indicate support according to TS 38.101-1 [2], Table 5.3.5-1. | FSPC | CY | N/A | FR1 only |
| maxNumberMIMO-LayersPDSCH<br>Defines the maximum number of spatial multiplexing layer(s) supported by the UE for DL reception. For single CC standalone NR, it is mandatory with capability signaling to support at least 4 MIMO layers in the bands where 4Rx is specified as mandatory for the given UE and at least 2 MIMO layers in FR2. If absent, the UE does not support MIMO on this carrier. | FSPC | CY | N/A | N/A |
| supportedBandwidthDL<br>Indicates maximum DL channel bandwidth supported for a given SCS that UE supports within a single CC (and in case of intra-frequency DAPS handover for the source and target cells), which is defined in Table 5.3.5-1 in TS 38.101-1<br>1 in TS 38.101-2<br>For FR1, all the bandwidths listed in TS38.101-1 Table 5.3.5-1 for each band shall be mandatory with a single CC unless indicated optional. For FR2, the set of mandatory CBW is 50, 100, 200 MHz. When this field is included in a band combination with a single band entry and a single CC entry (i.e. non-CA band combination), the UE shall indicate the maximum channel bandwidth for the band according to TS 38.101-1<br>NOTE: To determine whether the UE supports a channel bandwidth of 90 MHz, the network may ignore this capability and validate instead the channelBW-90mhz and the supportedBandwidthCombinationSet. For serving cell(s) with other channel bandwidths the network validates the channelBWs-DL, the supportedBandwidthCombinationSet, the supportedBandwidthCombinationSetIntraENDC, the asymmetricBandwidthCombinationSet (for a band supporting asymmetric channel bandwidth as defined in clause 5.3.6 of TS 38.101-1 [2]) and supportedBandwidthDL. | FSPC | CY | N/A | N/A |

TABLE 1-continued

| Definitions for parameters | Per | M | FDD-TDD DIFF | FR1-FR2 DIFF |
|---|---|---|---|---|
| supportedModulationOrderDL<br>Indicates the maximum supported modulation order to be applied for downlink in the carrier in the max data rate calculation as defined in 4.1.2. If included, the network may use a modulation order on this serving cell which is higher than the value indicated in this field as long as UE supports the modulation of higher value for downlink If not included:<br>-for FR1, the network uses the modulation order signalled in pdsch-256QAM-FR1.<br>-for FR2, the network uses the modulation order signalled per band i.e. pdsch-256QAM-FR2 if signalled. If not signalled in a given band, the network shall use the modulation order 64QAM.<br>In all the cases, it shall be ensured that the data rate does not exceed the max data rate (DataRate) and max data rate per CC (DataRateCC) according to TS 38.214 [12]. | FSPC | No | N/A | N/A |
| channelBW-90mhz<br>Indicates whether the UE supports the channel bandwidth of 90 MHz. For FR1, the UE shall indicate support according to TS 38.101-1 [2], Table 5.3.5-1. | FSPC | CY | N/A | FR1 only |
| maxNumberMIMO-LayersCB-PUSCH<br>Defines supported maximum number of MIMO layers at the UE for PUSCH transmission with codebook precoding. UE indicating support of this feature shall also indicate support of PUSCH codebook coherency subset. This feature is not supported for SUL. | FSPC | No | N/A | N/A |
| maxNumberMIMO-LayersNonCB-PUSCH<br>Defines supported maximum number of MIMO layers at the UE for PUSCH transmission using non-codebook precoding. This feature is not supported for SUL.<br>UE supporting non-codebook based PUSCH transmission shall indicate support of maxNumberMIMO-LayersNonCB-PUSCH, maxNumberSRS-ResourcePerSet and maxNumberSimultaneousSRS-ResourceTx together. | FSPC | No | N/A | N/A |
| supportedBandwidthUL<br>Indicates maximum UL channel bandwidth supported for a given SCS that UE supports within a single CC (and in case of intra-frequency DAPS handover for the source and target cells), which is defined in Table 5.3.5-1 in TS38.101-1 38.101-2<br>For FR1, all the bandwidths listed in TS38.101-1 Table 5.3.5-1 for each band shall be mandatory with a single CC unless indicated optional. For FR2, the set of mandatory CBW is 50, 100, 200 MHz.<br>When this field is included in a band combination with a single band entry and a single CC entry (i.e. non-CA band combination), the UE shall indicate the maximum channel bandwidth for the band according to TS 38.101-1<br>NOTE: To determine whether the UE supports a channel bandwidth of 90 MHz the network may ignore this capability and validate instead the channelBW-90mhz and the supportedBandwidthCombiantionSet. For serving cell(s) with other channel bandwidths the network validates the channelBWs-UL, the supportedBandwidthCombinationSet, the supportedBandwidthCombinationSetintraENDC, the asymmetricBandwidthCombinationSet (for a band supporting asymmetric channel bandwidth as defined in clause 5.3.6 of TS 38.101-1 [2]) and supportedBandwidthUL. | FSPC | CY | N/A | N/A |
| supportedModulationOrderUL<br>Indicates the maximum supported modulation order to be applied for uplink in the carrier in the max data rate calculation as defined in 4.1.2. If included, the network may use a modulation order on this serving cell which is higher than the value indicated in this field as long as UE supports the modulation of higher value for uplink If not included,<br>- for FR1 and FR2, the network uses the modulation order signalled per band i.e. pusch-256QAM if signalled. If not signalled in a given band, the network shall use the modulation order 64QAM.<br>In all the cases, it shall be ensured that the data rate does not exceed the max data rate (DataRate) and max data rate per CC (DataRateCC) according to TS 38.214 [12]. | FSPC | No | N/A | N/A |
| dl-64QAM-MCS-TableAlt<br>Indicates whether the UE supports the alternative 64QAM MCS table for PDSCH. | UE | No | No | Yes |
| maxLayersMIMO-Adaptation-r16<br>Indicates whether the UE supports the network configuration of maxMIMO-Layers per DL BWP. If the UE supports this feature, the UE needs to report maxLayersMIMO-Indication. | UE | No | No | Yes |

TABLE 1-continued

| Definitions for parameters | Per | M | FDD-TDD DIFF | FR1-FR2 DIFF |
|---|---|---|---|---|
| maxLayersMIMO-Indication<br>Indicates whether the UE supports the network configuration of maxMIMO-Layers as specified in TS 38.331 [9]. | UE | Yes | No | No |
| mux-HARQ-ACK-PUSCH-DiffSymbol<br>Indicates whether the UE supports HARQ-ACK piggyback on a PUSCH with/without aperiodic CSI once per slot when the starting OFDM symbol of the PUSCH is different from the starting OFDM symbols of the PUCCH resource that HARQ-ACK would have been transmitted on. This applies only to non-shared spectrum channel access. For shared spectrum channel access, mux-HARQ-ACK-PUSCH-DiffSymbol-r16 applies. | UE | Yes | No | Yes |
| oneFL-DMRS-ThreeAdditionalDMRS-UL<br>Defines whether the UE supports DM-RS pattern for UL transmission with 1 symbol front-loaded DM-RS with three additional DM-RS symbols. | UE | No | No | Yes |
| oneFL-DMRS-TwoAdditionalDMRS-UL<br>Defines support of DM-RS pattern for UL transmission with 1 symbol front-loaded DM-RS with 2 additional DM-RS symbols and more than 1 antenna ports. | UE | Yes | No | Yes |
| pdsch-256QAM-FR1<br>Indicates whether the UE supports 256QAM modulation scheme for PDSCH for FR1 as defined in 7.3.1.2 of TS 38.211 [6]. | UE | Yes | No | FR1 only |
| pdsch-MappingTypeA<br>Indicates whether the UE supports receiving PDSCH using PDSCH mapping type A with less than seven symbols. This field shall be set to supported. | UE | Yes | No | No |
| pdsch-MappingTypeB<br>Indicates whether the UE supports receiving PDSCH using PDSCH mapping type B. | UE | Yes | No | No |
| pdsch-RE-MappingFR1-PerSymbol/pdsch-RE-MappingFR1-PerSlot<br>Indicates the maximum number of supported PDSCH Resource Element (RE) mapping patterns for FR1, each described as a resource (including NZP/ZP CSI-RS, CRS, CORESET and SSB) or bitmap. The number of patterns coinciding in a symbol in a CC and in a slot in a CC are limited by the respective capability parameters. Value n10 means 10 RE mapping patterns and n16 means 16 RE mapping patterns, and so on. The UE shall set the fields pdsch-RE-MappingFR1-PerSymbol and pdsch-RE-MappingFR1-PerSlot to at least n10 and n16, respectively. In the exceptional case that the UE does not include the fields, the network may anyway assume that the UE supports the required minimum values. | UE | Yes | No | FR1 only |
| pdsch-RE-MappingFR2-PerSymbol/pdsch-RE-MappingFR2-PerSlot<br>Indicates the maximum number of supported PDSCH Resource Element (RE) mapping patterns for FR2, each described as a resource (including NZP/ZP CSI-RS, CORESET and SSB) or bitmap. The number of patterns coinciding in a symbol in a CC and in a slot in a CC are limited by the respective capability parameters. Value n6 means 6 RE mapping patterns and n16 means 16 RE mapping patterns, and so on. The UE shall set the fields pdsch-RE-MappingFR2-PerSymbol and pdsch-RE-MappingFR2-PerSlot to at least n6 and n16, respectively. In the exceptional case that the UE does not include the fields, the network may anyway assume that the UE supports the required minimum values. | UE | Yes | No | FR2 only |
| rateMatchingCtrlResrcSetDynamic<br>Indicates whether the UE supports dynamic rate matching for DL control resource set. | UE | Yes | No | No |
| rateMatchingResrcSetDynamic<br>Indicates whether the UE supports receiving PDSCH with resource mapping that excludes the REs corresponding to resource sets configured with RB-symbol level granularity indicated by bitmaps (see patternType in RateMatchPattern in TS 38.331[9]) based on dynamic indication in the scheduling DCI as specified in TS 38.214 [12]. | UE | No | No | No |
| rateMatchingResreSetSemi-Static<br>Indicates whether the UE supports receiving PDSCH with resource mapping that excludes the REs corresponding to resource sets configured with RB-symbol level granularity indicated by bitmaps and controlResourceSet (see pattern Type in RateMatchPattern in TS 38.331 [9]) following the semi-static configuration as specified in TS 38.214 [12]. | UE | Yes | No | No |

Mapping Across Slots (MAS)

The subject matter disclosed herein provides a Mapping Across Slots (MAS) processing technique for transport blocks that may be used by transmitters (UE or gNB) in a wireless network, such as a 5G wireless network. MAS processing maps a TB of size B across the resources of K slots, and a transmitter continuously transmits exactly one transmission conveying the TB of size B across K−1 slot boundaries. In one embodiment, the TBS determination for MAS processing sets the coding rate to be equal to r, the available resources correspond to K slots, and the resultant TBS is B. MAS processing may be performed by a TB processing chain that is similar to the processing chain depicted in FIG. 6, but modified herein as described in connection with FIGS. 9-40. A TB processing chain that provides MAS processing for transport blocks may include circuits and/or modules that perform the functionality described in connection with the MAS processing. That is, the functionality associated with TBS determination, TB selection and CB determination, encoding, rate matching, interleaving, and mapping from virtual to physical resources may be performed by one or more circuits and/or one or more modules.

Figure 9:
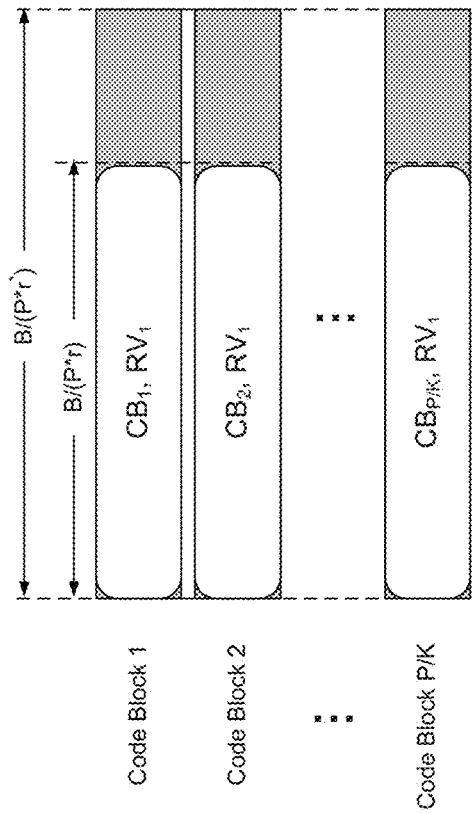
FIG. 9 shows some details of codewords that may be transmitted across K slots depending on the size of the data block according to the subject matter disclosed herein.

FIG. 9 shows some details of codewords that may be transmitted across K slots depending on the size of the data block B according to the subject matter disclosed herein. For each of the Q Code Block Groups (CBGs), the number of code blocks P belonging to one CBG is P/Q. A condition for the code blocks not to cross slot boundary is that K divides P. For MAS processing as disclosed herein, if the number of information bits is B and the target rate is r, then the total number of coded bits is B/r, which may be allocated across the REs of K slots. The size of code blocks and number of code blocks are respectively B/P and P. The number of coded bits per code block is B/r*P. When code blocks cross slot boundary, the MAS technique may provide a greater chance for code blocks crossing slot boundaries to sustain sudden degradation of channel quality in some slots.

Figure 10:
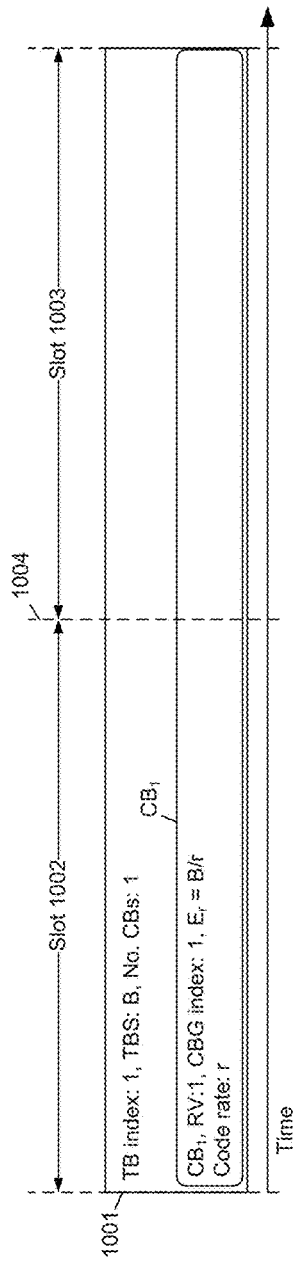
FIG. 10 depicts an example situation in which a data block B that is small enough to fit into a single code block that crosses a slot boundary according to the subject matter disclosed herein.

FIG. 10 depicts an example situation 1000 in which a data block B that is small enough to fit into a single code block $CB_1$ that crosses a slot boundary according to the subject matter disclosed herein. Using a Multi-Slot TBS (M-TBS) determination process, the code block $CB_1$ may be mapped into a single transport block 1001 across slots so that in the example of FIG. 10 one code block 1001 spans two consecutive slots (e.g., slots 1002 and 1003). Rate-matching may be used to allow the code block $CB_1$ to exist on both slots 1002 and 1003 (e.g., crossing a slot boundary 1004).

Figure 11:
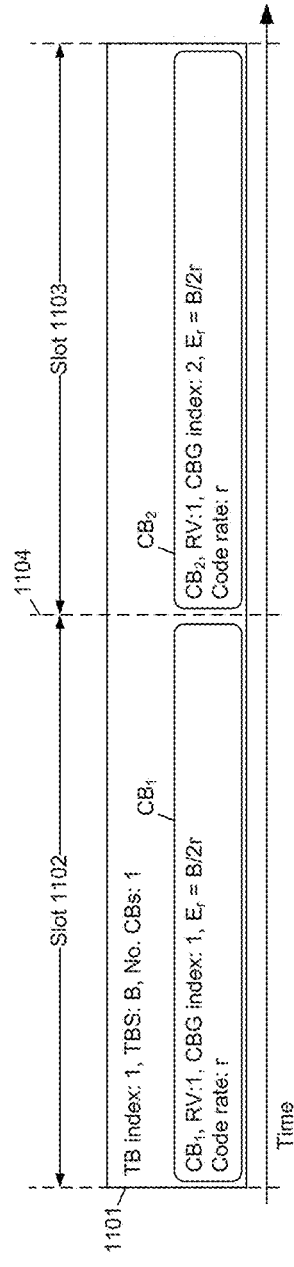
FIG. 11 depicts an example situation in which a relatively larger data block B that fits into two code blocks according to the subject matter disclosed herein.

FIG. 11 depicts an example situation 1100 in which a relatively larger data block B that fits into two code blocks $CB_1$ and $CB_2$ according to the subject matter disclosed herein. That is, the two code blocks $CB_1$ and $CB_2$ are mapped into a single transport block 1101 that spans two consecutive slots (e.g., slots 1102 and 1103). The transport block 1101 crosses a slot boundary 1104 between the slots 1102 and 1103.

Figure 12:
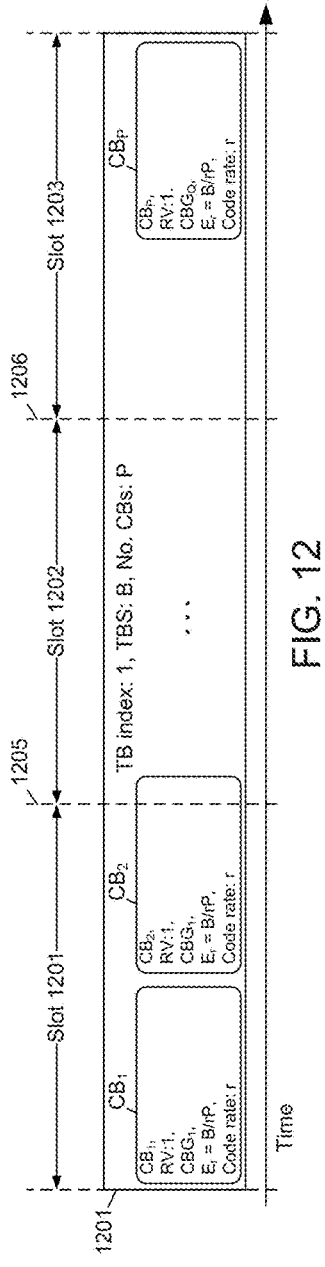
FIG. 12 shows an example situation in which a relatively very large data block B that fits into many code blocks according to the subject matter disclosed herein.

FIG. 12 shows an example situation 1200 in which a relatively very large data block B that fits into many code blocks $CB_1$-$CB_P$ according to the subject matter disclosed herein. The P code blocks $CB_1$-$CB_P$ are mapped into a single transport block 1201 that spans (in this example) three consecutive slots 1202-1204. The transport block 1201 crosses slot boundaries 1205 and 1206.

Figure 13:
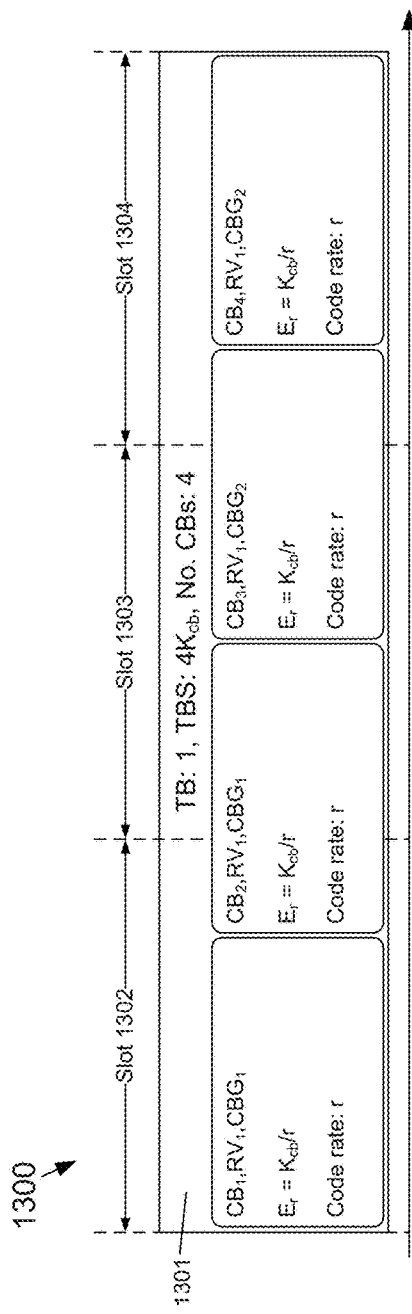
FIG. 13 depicts an example situation when K does not divide P according to the subject matter disclosed herein.

FIG. 13 depicts an example situation 1300 when K does not divide P according to the subject matter disclosed herein. In FIG. 13, MAS selects code blocks $CB_1$-$CB_4$ that are mapped into a single transport block 1301 across three consecutive slots 1302-1304. MAS allows longer RM outputs to be used so that all data bits of the code blocks $CB_1$-$CB_4$ are transmitted in one transport block. When CBG is enabled, a retransmission of a MAS transmission involves a retransmission of the CBG that failed in transmission.

TB Mapping Across Non-Consecutive Resources

Figure 14:
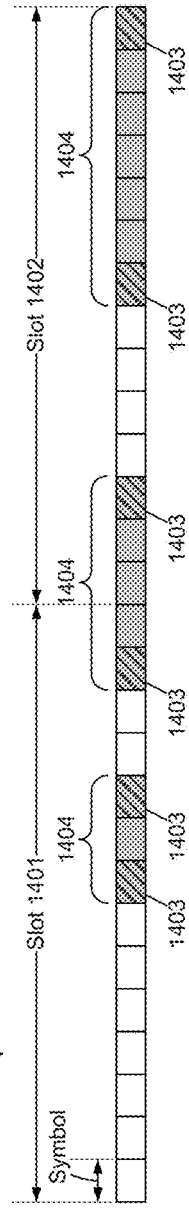
FIG. 14 depicts an example of a scenario in which the resources available for mapping-across-slots PUSCH transmission are non-consecutive according to the subject matter disclosed herein.

Resource allocation for MAS PUSCH transmission may include resources that are not consecutive in time. FIG. 14 depicts an example of a scenario 1400 in which the resources available for MAS PUSCH transmission are non-consecutive. Scenario 1400 depicts two slots 1401 and 1402 in which each slot includes 14 symbols. The non-consecutive resources are that have been allocated for MAS PUSCH are indicated at 1403.

Non-consecutive resource allocation may be the result of, for example, a PDSCH/PUSCH retransmission type B resource allocation mechanism in which some in-between resources are not available based on a conflict with TDD symbol configurations. In such a non-consecutive resource allocation situation, a UE may utilize the collective resources available for type B repetitions for a transmission of one MAS transmission that spans all the available resources, for example, as indicated by resources 1404. Based on the capability of MAS PUSCH transmission, allocation of resources that are non-consecutive may be a particular resource allocation technique for MAS transmission that allows such configuration non-consecutive resource allocation.

If the allocated resources are a result of a repetition type B scheduling, then determination of a transport block may be the same as for an original transmission. Alternatively, if the allocated resources are indicated to the UE as being resources for an original transmission, then the transport block may be determined based on the allocated resources. The transport block determination may follow a Rel-16 TBS determination technique or alternatively a Multi-slot TBS (M-TBS) determination technique. Coding and code block segmentation may follow a Rel-16 process. Rate matching may be provided by techniques described below.

Embodiment 1

A first example embodiment disclosed herein provides Multi-slot TBS Mapping-With-Repetition (M-MWR). M-MWR includes the possibility of scheduling higher TBS values that are not possible using a typical MWR-based or a Rel-16-based TBS determination process. The TBS value determined by M-MWR is mapped to the allocated resources of one slot resulting in higher per-slot coding rate than the coding rate indicated via the typically configured MCS index.

The TBS determination using a typical MWR process sets the coding rate equal to r*K, the available resources correspond to a single slot, and the resultant TBS is B. In contrast, the TBS determination for M-MWR computes the summation of intermediate TBS values in which each intermediate TBS value corresponds to the TB S determined for each slot of the K slots by setting the coding rate equal to r of the slot and setting the available resources to the resources available in the slot.

Embodiment 2

MAS may be configured so that MAS mapping of a transport block avoids crossing a slot boundary. One condition for not having code blocks cross a slot boundary is to ensure that the rate matching output of each code block fits within the resources of one slot. This condition may be expressed as follows. Let $E_s^i$ be the number of coded bits available in slot i. Let $$G = \sum_{i=1}^{K} E_s^i$$

and $$G' = \frac{G}{P}.$$

Then, the condition of not having code blocks crossing slot boundary may be equivalent to the following. For each code block j=1, ..., P, there exists k such that $$j \cdot G' \leq \sum_{i=1}^{k} E_s^i \qquad (2)$$

and $$(j-1) \cdot G' \geq \sum_{i=1}^{k-1} E_s^i. \qquad (3)$$

In this case, the value of k may correspond to the slot containing the code block, and the conditions ensure that code block number j exists entirely in slot k. A gNB may ensure that these conditions are satisfied when scheduling/configuring a MAS-based transmission.

Embodiment 3

Figure 15:
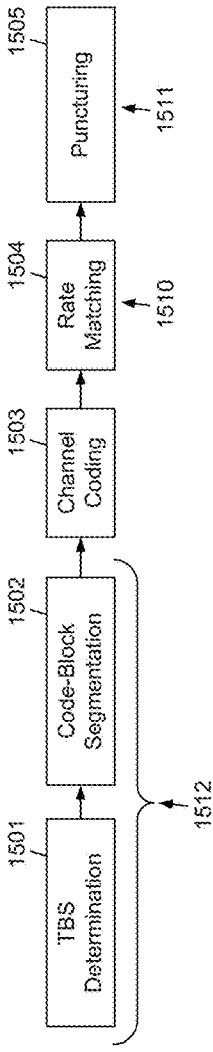
FIG. 15 depicts three locations where handling a cancellation indication may be performed in the operations of a transport block processing chain according to the subject matter disclosed herein.

FIG. 15 depicts three locations in a MAS transport block processing chain 1500 where handling a cancellation indication (CI) may be performed according to the subject matter disclosed herein. The MAS transport block processing chain depicted in FIG. 15 may be part of the TX processing circuitry 303 in the example embodiment of UE 116 depicted in FIG. 3. In one embodiment, the processor 307 of UE 116 may control operation of the MAS TB processing chain depicted in FIG. 15. In another embodiment, a processor (not shown) that is part of the TX processing circuitry 303 may control operation of the MAS TB processing chain depicted in FIG. 15.

The operations 1500 of the MAS transport block processing chain may include a TBS-determination operation 1501, a code-block segmentation operation 1502, a channel-coding operation 1503, a rate-matching operation 1504 and a puncturing operation 1505. In one embodiment, the channel coding operation 1503 may be performed by the encoder 503 and the rate-matching operation 1504 may be performed by the rate matcher 504 in the transmitter structure 501 depicted in FIG. 5A. One or more of the operations 1501-1505 may be performed by circuits and/or modules.

FIG. 16A depicts an example scenario 1600a in which a cancellation indication in one slot of a UL MAS transmission is received by a UE. In the example depicted in FIG. 16A, six slots 1601-1606 have been allocated for a MAS-based transmission. Code blocks $CB_1$-$CB_{13}$ have been mapped into slots 1601-1606. A CI 1607 has been received indicating cancellation of transmission in slot 1604.

There may be various sources of a cancellation indication. In the case of an UL transmission (e.g., MAS PUSCH), examples of cancellation sources include, but are not limited to, receipt by a UE of a DCI format 2_0 carrying SFI values that indicate a slot format that collides with an UL transmission; a collision with semi-static DL/UL slot formats; receipt by a UE of a DCI format 2_4 carrying a CI request that explicitly indicates that UL transmission are cancelled in the specified slot; a collision in time with other UL signals having different priority indices than the PUSCH; a collision between a CG-PUSCH and a DG-PUSCH of the same HARQ process; and a conflict between dynamically scheduled PDSCH and/or CSI-RS and CG-PUSCH. While different cancellation mechanisms may exist for DL transmission (e.g., MAS PDSCH), a main mechanism for handling cancellation may be the same as for a UL transmission.

Referring back to FIG. 15, a first location 1510 where a cancellation indication may be handled is at the rate-matching operation 1504 by changing the output of the rate-matching operation 1504. The resources remaining after applying the cancellation indication at the slot level may first be determined. Some entire slots may be, for example, cancelled based on the cancellation indication. For the already determined set of code blocks, the output of the rate-matching may be changed based on the remaining resources. In the context of the present example, the 13 code blocks are redistributed across the remaining resources for MAS transmission.

A second location 1511 where a cancellation indication may be handled is at the output of the rate-matching operation 1504 by performing puncturing of the output of the rate-matching operation 1504. This approach may keep the original code blocks that have been determined based on the scheduled MAS transmission, and transmission of some or all of the code blocks. There are four variations for the approach using the second location 1511.

The first variation of handling a CI by performing puncturing involves cancellation of all CB transmissions within the slot of the cancellation indication, as depicted in FIG. 16B. If parts of the coded sequence corresponding to the cancelled CBs within the slot extend into neighboring slots, the parts of the CBs that extend into the neighboring slots are transmitted. As depicted by the example scenario 1600b in FIG. 16B, the part of $CB_7$ in slot 1603 and the part of $CB_9$ in slot 1605 are transmitted.

A second variation of handling a CI by performing puncturing involves cancellation of CB transmissions within the indicated slot. That is, if parts of the coded sequence corresponding to the cancelled CBs extend to neighboring slots, they are cancelled as well. As depicted by the example scenario 1600c in FIG. 16C, the part of $CB_7$ in slot 1603 and the part of $CB_9$ in slot 1605 are cancelled.

A third variation of handling a CI by performing puncturing involves cancellation of all CB transmissions within the indicated slot and if parts of the coded sequence corresponding to the cancelled CBs extend to neighboring slots, all transmissions in these neighboring slots are also cancelled. The cancellation continues to neighboring cells until no CB having an extended part is cancelled. As depicted by the example scenario 1600d in FIG. 16D, all transmissions in slots 1602 until 1605 are cancelled.

A fourth variation of handing a CI by performing puncturing depicted by the example scenario 1600e in FIG. 16E and involves cancellation of all slots within the MAS PUSCH transmission.

For the four variations for handing a CI by performing puncturing depicted in FIGS. 16B-16E, the indication to cancel transmission in a slot should be received at a time that is sufficiently prior to the slot being cancelled so that the transmitter (at a UE) has sufficient time to perform the appropriate cancellation. It is worth noting that such an approach may provide a robust handling of the cancellation indication. For example, in case the transmitter (e.g., the UE in case of MAS PUSCH) misses the cancellation indication, the receiver (e.g., gNB) may make a decision to neglect the transmitted CBs in the cancelled slot without affecting the transmission of the remaining CBs in the other resources.

The third location 1512 where a cancellation indication may be handled is at the TBS determination operation 1501 and the code-block segmentation operation 1502 by changing the TBS determination and/or CB segmentation outputs.

The UE may not necessarily adhere to the previously determined CBs and may perform different physical shared channel transmissions in the available resources after cancellation. In this case, the remaining resources are first determined after applying the cancellation indication at the slot level, i.e., some entire slots are cancelled based on the cancellation indication. Accordingly, a cancelled slot within a set of allocated slots for a MAS transmission would lead to two separate groups of consecutive slots, and the transmitter may consider the two separate groups of slots as resources available for physical shared channel transmissions. For example, cancelling slot 1604 in the example scenario 1600*a* depicted in FIG. 16A leaves slots 1601, 1602 and 1603 as one group of available slots, and slots 1605 and 1606 as another group of available slots. The transmitter may then use these resources for physical shared channel transmissions.

Several options may be available for physical shared channel transmissions in the groups of consecutive resources remaining after a cancellation indication. A first option is that the transmitter may send Rel-16 transmissions in each of the slots. In this case, the transmissions may all be repetitions of the originally intended TB for the MAS transmission. If the TBS of the original MAS transmission is larger than the maximum allowable TBS threshold for individual Rel-16 transmissions, the transmission of this TB may be cancelled. Additionally, transmitting the original TB in a set of Rel-16 physical shared channel transmissions as repetitions may not be successful unless conditions are met with respect to the achievable coding rate.

Alternatively for the first option for the groups of consecutive resources remaining after a cancellation indication, the TB transmitted in the remaining slots may be separately determined for each slot. The parameters used for determining the TB, such as the MCS index and the coding rate, may be set to the values provided for the original MAS transmission. As yet another alternate for the first option, the coding rate used for each physical share channel transmission may be set to the effective coding rate that was going to be achieved for each slot had the original MAS transmission been performed.

For a second option for the groups of consecutive resources remaining after a cancellation indication, the transmitter may send MAS transmissions in the available sets of consecutive slots. For example, in the example given above, the transmitter may send two MAS transmissions, one spanning slots 1601-1603, and one spanning slots 1605-1606. Similar handling of the TB determination follows that for the first option for the groups of consecutive resources remaining after a cancellation indication. The TB may be set to the originally determined TB with the MAS transmission being cancelled if the TBS is larger than the maximum allowable TBS threshold. Determining the amount of resources for each MAS transmission may also be dependent on the constraints on the achievable coding rate, as described elsewhere herein. As an alternative for the second option, for each of the new MAS transmission a new TB may be determined.

For a third option for the groups of consecutive resources remaining after a cancellation indication, the transmitter may determine which type of physical shared channel (regular or MAS) that is to be transmitted in the available resources. That is, the transmitter may decide to perform regular transmission in some slots, while performing MAS transmission across some other slots. The decision to do so may, for example, be based on the target TB and selecting the smallest amount of resources that matches the TBS for a given coding rate.

Embodiment 3a

The decision to perform a PUSCH transmission in response to a cancellation indication may be configured in different ways, e.g., RRC configured or dynamically indicated. If the cancellation is RRC configured, all MAS PUSCH transmissions may be configured to be handled in case of cancellation according to one particular method. Alternatively, different kinds of MAS PUSCH transmissions may be handled in different ways (e.g., MAS PUSCH transmissions that are dynamically scheduled, CG-based MAS PUSCH, and so on). For a dynamically scheduled MAS PUSCH or a CG2-based MAS PUSCH, the way cancellation may be handled may be indicated in a scheduling/activating PDCCH.

Constraints Related to Scheduling MAS PUSCHs after Cancellation Indication

There may be limitations on the determination of the scheduling of MAS transmissions in response to a cancellation indication. Two cases may be distinguished. A first case is if there is a TBS threshold on scheduled MAS transmissions. A second case is if there are constraints on the achievable overall coding rate when scheduling MAS transmissions of an original TBS after receiving cancellation indication.

TBS Threshold on Scheduled MAS PUSCHs

The TBS determination for MAS transmissions may include resources from multiple slots, so it may be possible that a resultant TBS may be prohibitively large (e.g., due to implementation issues). Thus, a final TBS that may be used in a MAS transmission may be upper limited by a value $Th_{TBS}$. Consider a TBS determination procedure that results in a value that may be labeled as TBS', which is an intermediate value that is obtained from a procedure for determining TBS. Then, the final TBS value may be given as the minimum between the intermediate value TBS' and the threshold as $$TBS=\min(TH_{TBS}, TBS'). \qquad (4)$$

The value of the threshold may be, for example, a multiplicative factor of the maximum TBS value obtained from Rel-16 TBS determination procedure. It may be calculated that the maximum TBS value obtained from Rel-16 TBS determination procedure is equal to M=1,277,992 (corresponding to the maximum resource allocation for a PUSCH, along with four (4) transmission layers and the highest available coding rate). Therefore, $TH_{TBs}$ may be equal to C·M for some suitable value C.

Constraints on Achievable Overall Coding Rate

Upon receiving a cancellation indication for some slots, the transmitter may refrain from sending the original MAS transmission and may opt to send a collection of physical share channel transmissions in the remaining resources in which each transmission conveys the TB that was determined based on the resources of the original MAS transmission. The newly determined transmissions may be Rel-16 transmissions (i.e., one physical shared channel transmission per slot), or MAS transmissions (i.e., each transmission may span more than one slot and the number of slots in each such transmission may be determined).

Due to the natural reduction in the amount of available resources after cancellation, the achievable coding rate per transmission for the newly determined physical shared channel transmissions may be greater than the original achievable coding rate. More specifically, if the number of available coded bits per transmission is less than the TBS, then the achievable coding rate per physical shared channel may be greater than 1. In this case, one transmission may not be able to convey the TBS.

When such a situation occurs, the receiver may depend on the collection of transmissions (not only one physical shared channel transmission) for decoding the TB. The success of the decoding operation for the TB, however, may depend also on the RV indices used for these transmissions.

To make the previous point clear, consider a situation in which the TBS of the original TB is equal to B. After slot cancellation, assume that the available number of coded bits in all resources is equal to C in which B/C=1. In this case, if the collection of newly determined transmissions includes two physical shared channel transmissions in which each transmission includes half the resources, then the coding rate of each transmission is equal to 2. Two cases may be distinguished.

In a first case, if the RV index of both transmissions is the same, then the overall coding rate of the two transmissions remains and, therefore, the decoding attempt for the TB based on the two transmissions may likely fail. In a second case, if the RV index of the two transmissions is different, then the overall coding rate may be less than or equal to 1 and, therefore, the decoding attempt of the TB based on the two transmissions may have a chance to succeed.

The two cases highlight the importance of determining the coding rate per slot in relation to the specified RV indices of the newly determined transmissions, which is formalized next. However, first an assumption is considered that the newly determined transmissions inherent some configuration properties (such as the modulation order, the DMRS configuration, number of transmission layers, overhead, etc.) from the original MAS transmission configuration.

Let the new set of physical shared channel transmissions be indicated by a set P of indices in which the first transmission corresponds to index $1 \in P$, the second transmission corresponds to $2 \in P$, and so on. When determining a new set of transmissions, the transmitter may be configured to use either a fixed RV version for all the new transmissions, or the transmitter may be configured with a sequence of RV indices in which each transmission sequentially uses one index from the sequence. Let the unique set of RV indices used by the transmissions be labeled as V. For each $v \in V$, let $P_v \subseteq P$ be the indices of the transmissions in the new set of transmissions that uses the RV index v. Let $C_p$ denote the amount of coded bits available for transmissions with index p.

For successful decoding, the overall coding rate of the TB should be less than or equal to 1. This translates to the following condition:

$$\frac{B}{\sum_{v \in V} \max_{p \in P_v} C_p} \leq 1 \tag{5}$$

or $$\sum_{v \in V} \max_{p \in P_v} C_p \geq B. \tag{6}$$

This condition translates into the sum of unique coded bits across all transmissions being greater than B. Depending on the type of scheduled transmissions, this condition may be further simplified. For example, in a first case when the newly determined transmissions are MAS (multi-slot based) transmissions, the amount of available number of coded bits per transmission may depend on how many slots a MAS transmission is scheduled to use. In this case, the number of slots included in each transmission may be chosen such that the aforementioned condition is satisfied.

In a second case in which the newly determined PUSCHs are Rel-16 (one-slot based) PUSCH transmissions, all transmissions include a fixed number of resource elements and, therefore, may have a fixed number of available coded bits per transmission. Let this number be denoted as $C_{Rel-16}$. In this case, the condition simplifies to $$|V| \cdot C_{Rel-16} \geq B. \tag{7}$$

Embodiment 4

In one embodiment, MAS may be allowed to further segment the RM output sequence crossing slot boundaries around the boundaries. For example, FIG. 17A depicts an example MAS transmission of two CBs CBG1 and CBG2 across three slots 1701-1703. Segmentation may result in the RM output sequence corresponding to a CB being split into multiple parts, as depicted in FIG. 17B. The segmented parts may be treated as entirely independent transmissions (i.e., the receiver may use them separately in decoding the CB), or the parts may be jointly used for decoding in an RV-similar fashion.

Considering the resultant segmentation of involved CBs, the RV versions of each of the transmitted parts may be determined. According to the subject matter disclosed herein, the RV version of each part may be determined to use the same RV index of the original CB. Alternatively, a sequence of RV indices may be specified based on which the RV indices of the consecutive CB parts are determined. For example, an RV index sequence may be configured, such as 0, 2, 1, 3. Then, the RV index of each part of the CB sequentially (and cyclically) iterates over this sequence starting from the RV index of the original CB. In FIG. 17B, consider that the RV index of the original $CB_2RV_1$ is 0. Then, the first part of the CB may have an RV index equal to 0, and the second part of the CB may have an RV index equal to 2.

Implementing segmentation may be done in different approaches. Referring to the TB processing chain 1800 in FIG. 18, one approach for segmenting code blocks may be as follows. The TBS-determination operation 1801 computes the TBS based on the resources of all K slots. The CB segmentation operation 1802 receives the TBS as an input, and provides the CBs as specified in Rel-16 (using the same $K_{cb}$). The coding operation 1803 codes the CBs into codewords, as specified in Rel-16, following by a rate-matching operation 1804.

The operations 1801-1804 may be performed by one or more circuits and/or modules. The RM operation 1804 may be changed according to the subject matter disclosed herein as follows. Initially, the RM operation 1804 may be provided with a set of K slots in which the coded bits are going to be allocated, and the number of coded bits available for each slot, labeled $E_s^i$ for the ith slot in which i=1, . . . , K. The total number of coded bits available is $G = \Sigma_i E_s^i$, and the ratio of each CB may be determined from G as $G/P=G'$. For each CB, a pointer is kept of which particular bit is to be allocated in the RM procedure. The pointers may be called $s^j$ for j=1, . . . , P. All of the pointers are initialized to the bit corresponding to the RV index. Li is denoted as the length of the encoder output for the jth CB (which should all be the same). An index i is set equal to 1 and an index j is set equal to 1. The next bit in the ith slot to be allocated is denoted by $b^i$, and that bit is set to 1.

While i≤K (loop over slots) and j≤P (loop over CBs): Bit number $s^j$ is allocated from the encoder output of the jth CB to the bit number $b^i$ from the ith slot. Pointer $s^j$ is set to $s^j=((s^j-1) \bmod L^j)+1$. If $b^i=E_s^i$, then set i=i+1, set $b^i=1$, and set $s^j$ to the RV index of specified index for the part of CB number j in slot i+1. Otherwise, if $b^i \neq E_s^i$, set $b^i=b^i+1$. If k=G', then j=j+1 and k=1. If k≠G', then set k=k+1.

Alternatively, the RM operation may be changed as follows. The RM operation 1804 may be provided with the set of K slots in which the coded bits are going to be allocated and is provided the number of coded bits available for each slot, labeled $E_s^i$ for the ith slot in which i=1, . . . , K. The total number of coded bits available is $G=\Sigma_i E_s^i$, at the ratio of each CB may be determined from G as G/P=G'. For each CB, j=1, . . . , P, if there exists k>0 and n≥0 such that $$(j-1) \cdot G' < \Sigma_{i=1}^{k-1} E_s^i, \quad (8)$$

$$j \cdot G' > \Sigma_{i=1}^{k-1+n} E_s^i \quad (9)$$

then with the largest n satisfying the condition, the RM size of CB j is broken into n+2 values corresponding to slot k−1, k, . . . , k+n as $$\Sigma_{i=1}^{k-1} E_s^i - (j-1) \cdot G', E_s^i, E_s^i, \ldots, E_s^i, j \cdot G' - \Sigma_{i=1}^{k-1+n} E_s^i. \quad (10)$$

If n=0, then CB j is broken into 2 RM sizes as $$\Sigma_{i=1}^{k-1} E_s^i - (j-1) \cdot G', j \cdot G' - \Sigma_{i=1}^{k-1} E_s^i. \quad (11)$$

For multiple RM blocks for multiple slots, the RV index of each part may be determined as described in herein relating to segmentation of CBs across slots.

In one embodiment, one CB crossing slot boundaries may be altered to be confined within only one of the slots it originally spanned. The slot in which the CB is confined may be the slot that originally contained the largest portion of the CB, or based on some other rule for selecting to which slot the CB is confined. Determining the RM output for each CB in each slot follows the concepts disclosed herein.

When one part of a segmented CB only is transmitted in an actual transmission, referred to herein as the transmitted part, determination of the RV index for the transmitted part may follow the RV determination disclosed herein. FIG. 19A depicts an example MAS transmission of CBs in two CB groups CBG1 and CBG2 across three slots 1901-1903. Segmentation and transmission of transmitted parts 1904 and 1905 of CBs $CB_2RV_2$ and $CB_3RV_1$, respectively, is depicted in FIG. 19B.

Embodiment 5

MAS processing may also be used for handling retransmission. For a retransmission situation, consider that the case when CBGs have not been configured. Then, requesting a retransmission of a MAS transmission involves a repetition of all CBs. The retransmission may be scheduled in slots that are identical (in number and available REs) to the original slots. In this case, the retransmission may be performed identically to an original transmission of the K slots. Alternatively, the retransmission may be scheduled in a different set of slots with a different number of available REs. In this embodiment, it may be up to the gNB to ensure that the process of TBS determination, coding and rate-matching produces and retransmits exactly the TB that was transmitted in the initial transmission. It may also be up to the gNB to ensure that the resource allocation in the scheduled slots, along with the coding process, result in an identical retransmission of the originally transmitted RV versions of the CBs, in the situation in which the gNB is interested in such a retransmission (e.g., to perform Chase Combining).

In an alternative embodiment, it may be left to the transmitter to transmit the same TB used in the original transmission. In this alternative embodiment, certain resource allocation of the scheduled slots may be determined. Knowing that the scheduled resources are for retransmission, the transmitter knows the TB may be the same TB determined in the original transmission, and therefore the transmitter does not determine a new TB as per a TB S determination process. Assuming that the number of layers and modulation order are indicated to be the same as the original transmission, the transmitter may then infer the effective coding rate from knowing the number of available resources and the TBS. The transmitter may then proceed with the coding and rate matching procedure to perform the retransmission. It may be up to the gNB when determining the resource allocation for the retransmission to ensure that this procedure generates the necessary RV transmissions of the original codewords.

Retransmissions of MAS transmissions when slot cancellation occurs on the original MAS transmission may be as follows. If the cancellation of a transmission in a slot of MAS transmission is indicated, various techniques for handling the transmission of the transmission in the remaining resources may be used. The techniques may involve sending the original TB in one or multiple other regular and/or MAS transmissions, or sending a set of different and independent TBs in one or multiple other regular and/or MAS transmissions.

In a situation in which the original TB is transmitted, the repetition request may naturally correspond to the TB transmission. The type of transmission (regular/MAS) and the resources for the retransmission may follow the process for transmission repetitions described above.

In a situation in which the transmission involves multiple different TBs, a repetition request should provide an indication as to which TB is requested. The indication may be in the form of an additional indication in the scheduling request for the repetition, or as separate resources indicating a repetition request for each of the TBs transmitted. As the TBs are formed upon receiving a slot cancellation indication, an explicit configuration of the feedback for each of those TBs can be indicated along with the slot cancellation indication. An implicit rule may be used to determine the resources for feedback for each of the transmitted TBs.

Embodiment 6

The resources for MAS transmission may be all configured dynamically. That is, a MAS transmission may be scheduled by a scheduling DCI conveyed in a PDCCH. The DCI may include the resource allocation and configuration of all K slots in the MAS. For a K slot MAS allocation, the DCI information may include K sets of configuration parameters, each containing the resource allocation and configuration for a slot. This may provide the most flexibility in scheduling at the expense of high signalling overhead. Alternatively, the system may restrict MAS transmission to include only slots with identical resource allocations; in this case, the DCI may include only a resource allocation and configuration corresponding to one slot, and a number K that indicates how many slots are included in the MAS transmission. This may limit signalling overhead at the expense of limited scheduling flexibility.

To further limit signalling overhead, the configuration for MAS transmission may be RRC configured. For example, some information, such as the number of slots K of the MAS transmission and/or some resource allocation information (e.g., time, frequency, DMRS configurations, etc.), may be RRC configured, while other information may be conveyed dynamically via scheduling DCI. Alternatively, all information may be RRC configured, with the DCI only carrying an indication as to whether this DCI schedules a regular transmission or a MAS transmission.

For Configured Grant (CG) transmissions of both types, the information about the MAS transmission may be RRC configured similar to the description above. In this case, the CG configuration may indicate the slots of the first slot in the MAS transmissions, with the remaining K−1 slots following the indicated slots. Alternatively, the CG configuration may indicate time locations for different transmission occasions within the CG periodicity. FIG. 20 depicts a CG period 2001 in an example CG configuration that may include a set of regular transmission occasions and a set of MAS transmission occasions according to the subject matter disclosed herein.

Multiple CG configurations may be configured to allow the transmitter to multiple variations of CG configurations with and/or without MAS transmissions. For CG type 2 (semi-persistent scheduling), one CG configuration may be used to indicate both regular transmission occasions and MAS transmission occasions. For example, a CG configuration may provide an indication for particular slots. The activating PDCCH may have an extra indication that the CG is to be used for regular transmissions. Alternatively, if the PDCCH indicates that the CG is to be used for MAS transmissions, then the indicated slots may be considered as the first slots in a MAS transmission occasions that include additional K−1 slots after each indicated slot.

Enhancements in Redundancy Version (RV)

One embodiment disclosed herein provides an enhancement for RV based transmission that addresses the following problem. Consider a TBS of size B. The TBS may normally be segmented into P CBs in which $P=\lfloor(B/K_{cb})\rfloor$. The size of each CB is C=B/P. Each CB is coded into a codeword of size b·B/P in which b=3 for LDPC base graph 1 and b=5 for LDPC base graph 2. The codeword is then provided as an input to the rate-matching block, which produces an allocated segment of the codeword with length L.

Figure 22B:
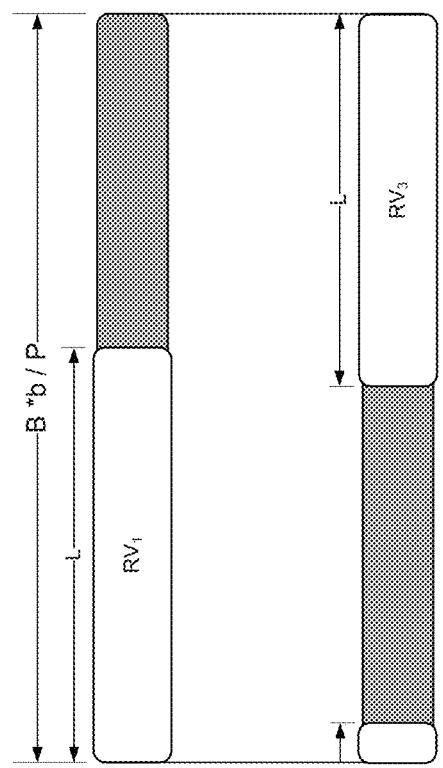
FIGS. 22A and 22B depict example situations in which fewer redundancy versions may be used in a transport block according to the subject matter disclosed herein.
Figure 22A:
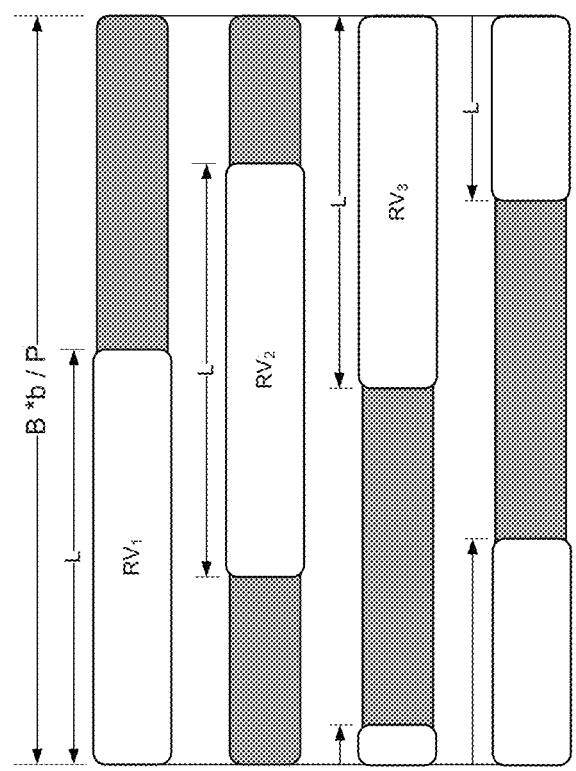

When L is very small, as depicted in FIG. 21A, the RV based retransmissions may not optimally use the coded bits. In such a situation, adding more RV indices may be beneficial, as depicted in FIG. 21B. In contrast, if L is large, using only some RV indices may be very beneficial as shown in FIGS. 22A and 22B. For example, consider an L having a length as indicated in FIG. 21A. FIG. 22A shows an example RM output corresponding to FIG. 21A, but with an L having a length as depicted in FIG. 22A. In particular, FIG. 22A shows an example situation in which L is approximately larger than the length of the entire codeword (e.g., half of B*b/P). RV1 and RV3 would then slightly overlap, and would entirely cover the codeword, and RV2 and RV4 may be removed. FIG. 22B shows an example RM output corresponding to FIG. 22A with RV2 and RV4 removed.

Therefore, the following rule may be adopted for determining the best number of RV versions:

$$V \text{ is the smallest integer such that } V \cdot L \geq C \cdot b \quad (12)$$

or $$V = \left\lceil \frac{C \cdot b}{L} \right\rceil. \quad (13)$$

in which C is the size of a code block, which is equal to B/P.

The number of RV indices may be chosen freely according to Eqs. (12) or (13). Note that, if L changes across slots, one value may be selected that generates a suitable value for V (e.g., the smallest value among all slots).

Another approach may be to select a value of V from among a set of possible RV indices. The selection may be indicated explicitly by the gNB. Alternatively, the selection may be the closest value among the set to the value [(C·b)/L]. The set of possible RV indices may be selected as powers of 2 to guarantee that the RV boundary does not change with the dynamic choice of V.

TBS Limitations

A TBoMS (also referred to as MAS herein) scheduling a TB for transmission may result in a corresponding TBS based on the TBS determination rule. In this aspect, the TBS value for the TBoMS may have an upper limit X that is the maximum TBS value that may be attained in legacy NR (Rel-16). Another upper limit X may be based on the corresponding attained maximum data rate. That is, the attained maximum data rate may not exceed the corresponding maximum data rate in legacy NR (Rel-16). Yet another upper limit X may be based on the corresponding data rate in which the attained data rate for the TBoMS should not exceed the corresponding attained data rate for the legacy PDSCH/PUSCH for the same configuration parameters. The configuration parameters may be the scheduled parameters for the TBoMS. Examples of such parameters include, but are not limited to, rank, BW, number of layers, and MCS, and may be based on indicated UE capabilities.

The parameters indicated in the UE capabilities may not necessarily be equal to the configured parameters for the TBoMS. When using parameters indicated in UE capabilities, it should be noted that UE capabilities may be indicated per frequency range, per CC, per band, per band combination and/or per feature set. A limiting value X may be computed for each case in which a set of parameters are provided. For example, a limiting value may be computed for each feature set that contains parameters related to the TBoMS. Alternatively, one or more limiting values may be computed by taking a representative value for each parameter across the corresponding values for the parameter across different combinations (such as feature sets).

Embodiment 1 of RM and Interleaver Operation

Figure 23A:
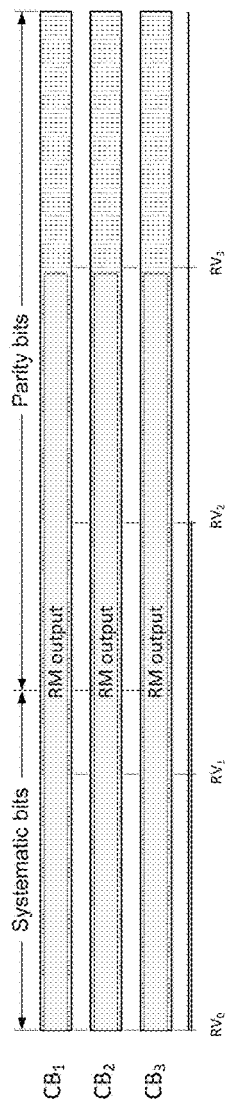
FIGS. 23A and 23B respectively depict an example continuous rate matching output of a code block that is known to cross a slot boundary between slots and a corresponding interleaver output according to the subject matter disclosed herein.
Figure 23B:
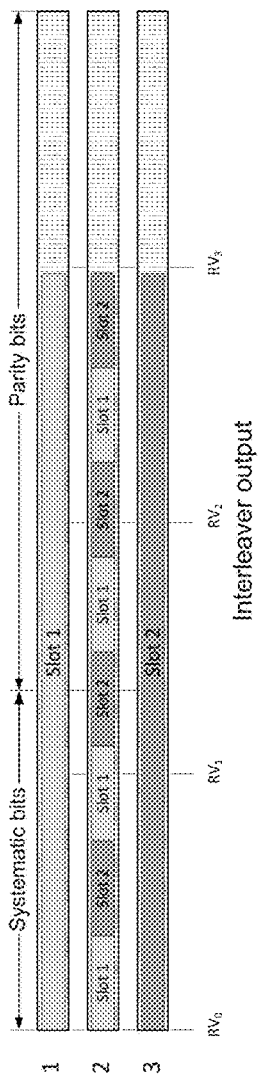

A first example embodiment of RM determination and interleaver operation includes a continuous RM determination and a continuous interleaver. The RM output of CBs may be determined for all slots, and the interleaver operation may be performed across all slots. In this case, the interleaver size would be determined based on the entire CB RM output for all slots. FIGS. 23A and 23B respectively depict operation of a first example embodiment of RM and interleaver operation for a continuous RM determination and a continuation interleaver according to the subject matter disclosed herein. In FIGS. 23A and 23B, a multi-slot physical shared channel transmission is assumed with two slots and three CBs, and the modulation order is 4.

In FIG. 23A, the RM output of CB2 is known to cross the slot boundary between slots 1 and 2. The RM output for CB2 may be assumed to be a continuous RM output. This embodiment applies interleaver operation across the entire RM output. Since the modulation order is 4, the interleaver operation for CB2 results in the coded bits transmitted in the two slots that are interleaved, as shown in FIG. 23B.

Embodiment 1a of RM and Interleaver Operation

Figure 24A:
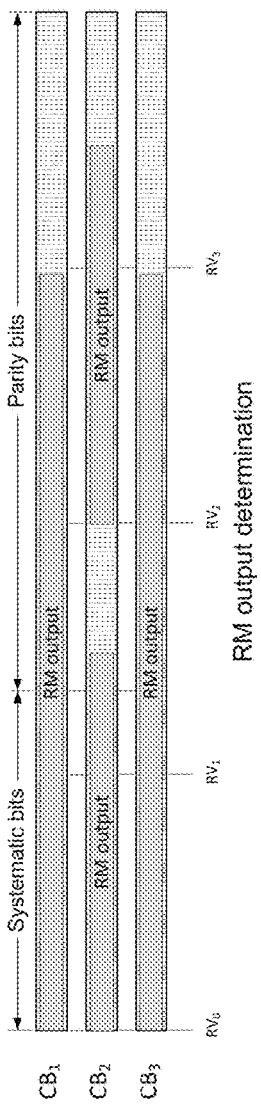
FIGS. 24A and 24B respectively depict an example segmented code block rate matching output with a new redundancy version and a corresponding interleaver output according to the subject matter disclosed herein.
Figure 24B:
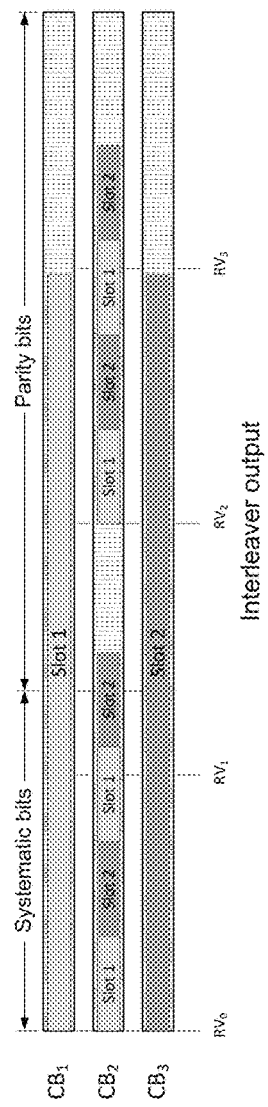

A first variation of the embodiment depicted by FIGS. 23A and 23B may be when the RM output is segmented with a new RV that is used for determining the RM output of each slot. This is shown in FIGS. 24A and 24B, which respectively show RM and interleaver outputs for a multi-slot physical shared channel with two slots and three CBs, a modulation order 4, and segmented CB RM output with a new RV according to the subject matter disclosed herein. The RM output for CB2 may be assumed to be a segmented RM output with a new RV for slot 2. The first variation applies the interleaver operation across the entire RM output. As the modulation order is 4, the interleaver operation for CB2 results in the coded bits transmitted in the two slots that are interleaved, as shown in FIG. 24B.

Embodiment 1b of RM and Interleaver Operation

Figure 25A:
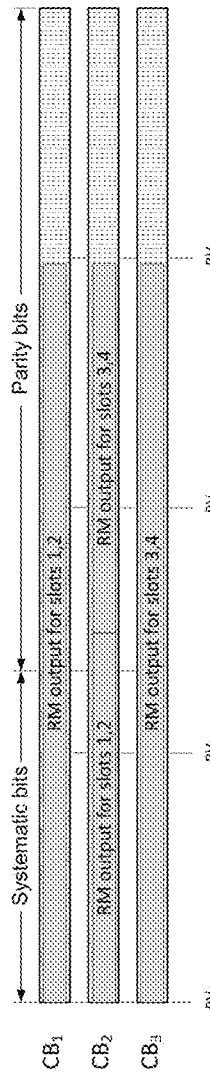
FIGS. 25A and 25B respectively depict an example constrained-continuous rate matching output of a code block and a corresponding constrained-continuous interleaver output according to the subject matter disclosed herein.
Figure 25B:
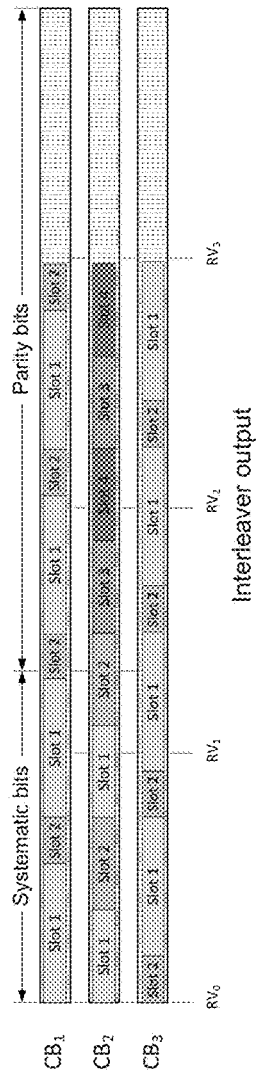

A second variation of the embodiment depicted by FIGS. 23A and 23B may be similar to the first variation of FIGS. 25A and 25B, but within an explicitly constrained number of slots during the multi-slot physical shared channel transmission. This second variation (constrained-continuous RM, constrained-continuous interleaver) may be characterized by a constraint L on the number of slots. More specifically, FIGS. 25A and 25B respectively show RM and interleaver outputs with L=2 for a multi-slot physical shared channel with four slots, three CBs, and a modulation order of 4. In this variation, the RM operation takes as an input the entire codeword for a CB, and provides the coded bits that are rate-matched over the physical shared channel resources in separate sets of L slots. The RM operation provides a continuous set of coded bits as an input for the interleaver, which also operates on the RM output for sets of L slots to provide a mapping for the coded bits onto the symbols of each L slots. This variation allows that the RM output for different sets of L slots may be a continuous RM output or as RM outputs with new RVs. Constraints may also be provided for the gNB in order not to schedule multi-slot physical shared channel transmissions in which CBs experience boundary crossings between sets of L slots.

Embodiment 2 of RM and Interleaver Operation

Figure 26A:
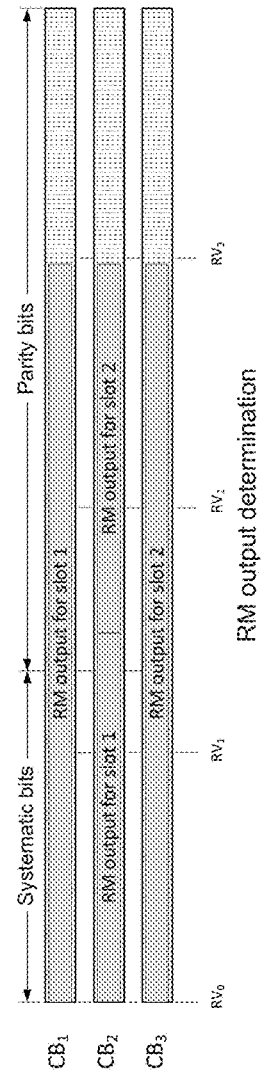
FIGS. 26A and 26B respectively depict an example continuous rate matching output and a corresponding interleaver output across each slot independently according to the subject matter disclosed herein.
Figure 26B:
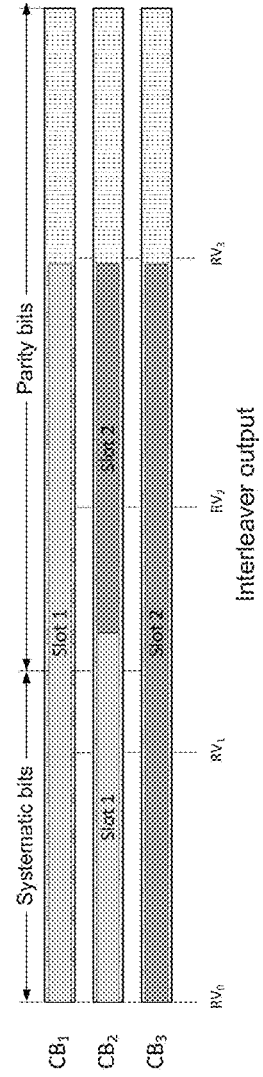

A second example embodiment of RM determination and interleaver operation for multi-slot physical shared channel with two slots, three CBs, a modulation order 4 and continuous CB RM output is depicted in FIGS. 26A and 26B. Interleaver operation is performed across each slot independently. In this case, the interleaver size would be determined based on the CB RM output for the particular slot. This may work either when the RM output is determined for all slots, or when the RM output is determined for each slot independently. When the RM output is determined for all slots, the rate matching procedure described herein may be extended by considering $E_r$ as the RM size across all slots. In that case, however, the interleaving procedure disclosed herein cannot directly be extended because the slot boundary should still be acknowledged for interleaver operation. Let the number of slots for which a certain CB is mapped be M. For $i \in \{1, \ldots, M\}$, the number of coded bits available in the ith slot is $E_i$ to have $E = \sum_{i=1}^{M} E_i$. Then, the interleaving procedure disclosed herein may be applied to each $E_i$ separately by replacing E with in $E_i$ and considering the input sequence of $e_{\sum_{j=1}^{i-1} E_j}, e_{\sum_{j=1}^{i-1} E_j + 1}, \ldots, e_{\sum_{j=1}^{i} E_j - 1}$ in the existing procedure.

In FIG. 26A, the RM output for $CB_2$ is a continuous RM output. This variation applies the interleaver operation in FIG. 26B across only the RM output of each slot.

Figure 27A:
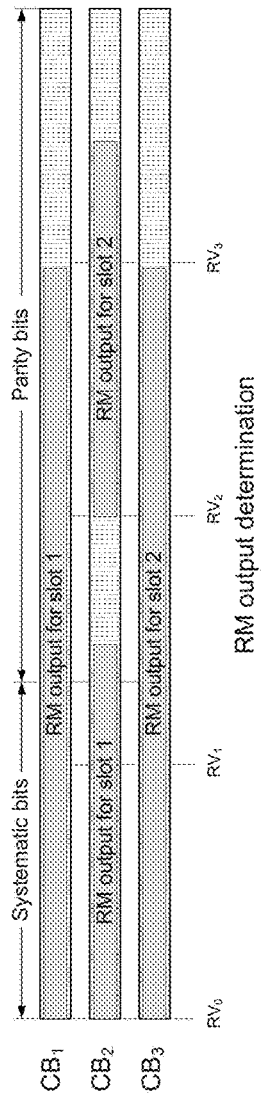
FIGS. 27A and 27B respectively depict an example segmented code block rate matching output with a new redundancy version and a corresponding interleaver output across each slot independently according to the subject matter disclosed herein.
Figure 27B:
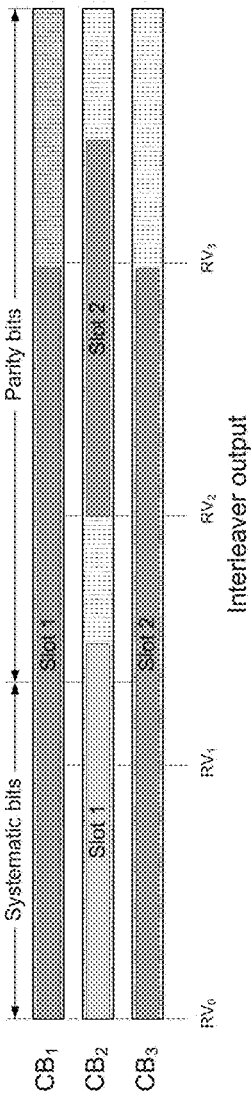

Similar behaviour exists when the RM output is a segmented output with new RV index, as shown in FIGS. 27A and 27B, which are respectively RM and interleaver outputs for a multi-slot physical shared channel with two slots, three CBs, a modulation order 4 and a segmented CB RM output with a new RV according to the subject matter disclosed herein.

The systematic bits available in the codeword corresponding to a CB are important bits for a decoding operation. Therefore, it may be beneficial that the interleaver is able to map the systematic bits onto reliable bits according to the used modulation scheme, e.g., 16QAM. A possible issue with of the present example embodiment of a RM and interleaver is that it may end up being that a small amount of systematic bits may be mapped onto reliable bits as compared with the example embodiment of FIGS. 23A and 23B. This possible issue may be circumvented by using the following first variation of the example embodiment modification of FIGS. 23A and 23B.

Embodiment 2a of RM and Interleaver Operation

Embodiment 2a of the RM and interleaver operation is similar to the example embodiment of FIGS. 27A and 27B. In the example embodiment of FIGS. 27A and 27B the interleaver operation may be performed across each slot independently, and the interleaver size may be determined based on the CB RM output for the particular slot. The RM output may distribute information bits among slots so that information bits are mapped via the interleavers of different slots onto reliable bit positions. An example of the operation of embodiment 2a of RM and interleaver operations are respectively shown in FIGS. 28A and 28B in which a multi-slot physical shared channel transmission may be assumed with two slots and three CBs, and the modulation order is 4.

Figure 28A:
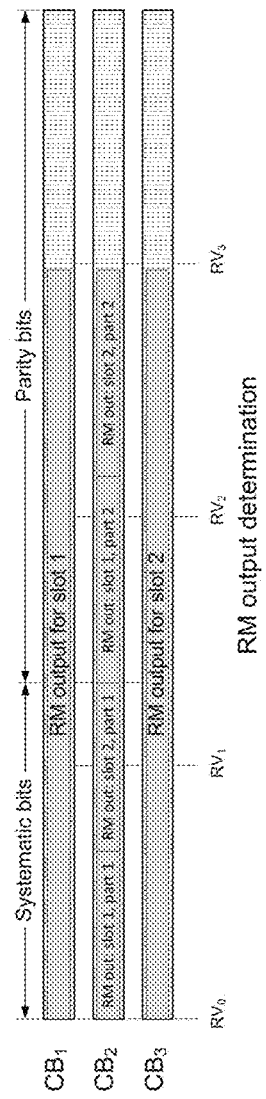
FIGS. 28A and 28B respectively depict an example rate matching output in which systematic bits and parity bits are treated separately when determining the inputs to the interleaver for different slots and a corresponding interleaver output according to the subject matter disclosed herein.
Figure 28B:
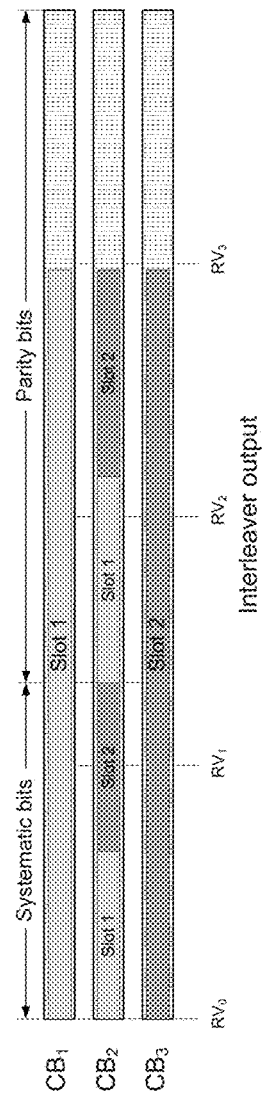

RM operation for the variation of FIGS. 28A and 28B for a particular CB may be based on treating the systematic bits and parity bits separately when determining the inputs to the interleaver for different slots. Let the number of slots in a multi-slot PUSCH be M. For $i \in \{1, \ldots, M\}$, the number of coded bits available in the ith slot is $E_i$. Let the bits of the codeword corresponding to the CB be numbered from 0 to N−1 in which N is the length of the codeword. Let the bits from 0 to K−1 correspond to K systematic bits for the codeword. Let $j \in \{0, \ldots, N-1\}$ indicate the bit corresponding to the start of the RM output (e.g., indicated by the RV index of the multi-slot physical shared channel transmission). Out of $E = \sum_{i=1}^{M} E_i$ output bits from the RM operation, let $B_S \subseteq \{0, \ldots, K-1\}$ indicate the subset of size B of the systematic bits that are going to be part of the output of the RM operation across all slots of the multi-slot physical shared channel transmission. Determining $B_S$ may vary depending on how the RM operation selects the total amount of output bits. For example, the RM output for the M slots may be determined by continuously selecting bits from the codeword starting from the jth bit and for a total of E bits, while performing a module-N operation.

The RM operation may be described as follows: First, determine M fractions as $x_i=E_i/E$. Alternatively, $x_i=1/M$. These fractions determine the ratio of systematic bits to be allocated in each slot. Next, continuously allocate systematic bits to slots according to the ratios of systematic bits. The number of systematic bits allocated to slot i is $B \cdot x_i$. Lastly, the remaining E−B bits from the RM output are allocated to slots according to the ratios of the systematic bits. The number of bits allocated to slot i may be subject to a suitable rounding operation to determine an integer numbers of bits.

Yet another way to describe RM operation equally interleaves bits mapped in M slots, as follows. For all codeword bits from 0 to $(\Sigma_{j=1}^{M} E_j/M)-1$, continuously allocate $x_i=E_i/M$ for slot i for all M slots. In other words, bits from 0 to $(E_1/M)-1$ are allocated in the first slot, bits from $E_1/M$ to $(E_1+E_2/M)-1$ are allocated in the second slot. Bits from $\Sigma_{j=1}^{i-1} E_j/M$ to $(\Sigma_{j=1}^{i} E_j/M)-1$ are allocated in slot i. After $\Sigma_{j=1}^{M} E_j/M$ bits have been allocated, the previous procedure is repeated starting from bits from $\Sigma_{j=1}^{M} E_j/M$ until $(2\Sigma_{j=1}^{M} E_j/M)-1$. This continues for k≤M for bits from $((k-1)\Sigma_{j=1}^{M} E_j)M$ to $(k\Sigma_{j=1}^{M} E_j/M)-1$.

This procedure divides the RM output into M sections in which slots may be assigned fractions of each section based on their respective RM sizes. This procedure may be generalized to any number T of sections as follows.

First, for all codeword bits from 0 to $((\Sigma_{j=1}^{M} E_j)/M)-1$, continuously allocate $x_i=E_i/T$ for slot i for all M slots. In other words, bits from 0 to $(E_1/T)-1$ are allocated in the first slot, bits from $E_1/T$ to $((E_1+E_2)/T)-1$ are allocated in the second slot. Bits from $((\Sigma_{j=1}^{i-1} E_j)/T)-1$ to $((\Sigma_{j=1}^{i} E_j/T)-1$ are allocated in slot i.

Next, after $(\Sigma_{j=1}^{M} E_j)/M$ bits are allocated, and the above procedure is repeated starting from bits from $(\Sigma_{j=1}^{M} E_j)/T)$ until $(2\Sigma_{j=1}^{M} E_j)/T-1$. This continues for k≤T for bits from $((k-1)\Sigma_{j=1}^{M} E_j)/T$ to $(k \Sigma_{j=1}^{M} E_j/T)-1$.

Figure 29:
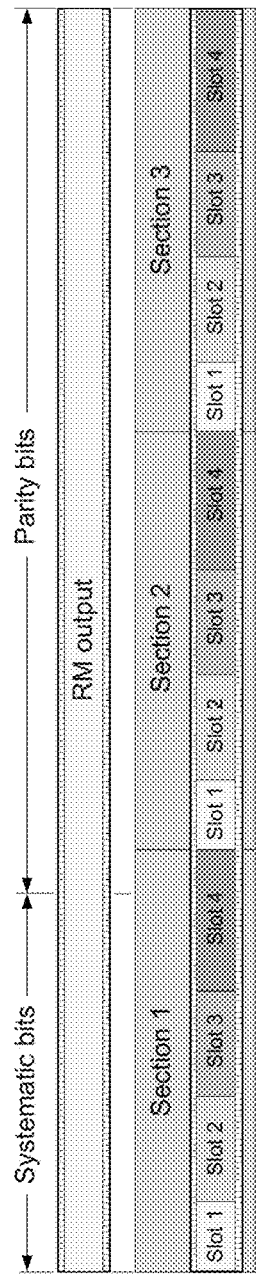
FIG. 29 shows an example of a rate matching output that has been split into sections according to the subject matter disclosed herein.

The value of T may be chosen to allow an equal distribution of information bits among the M slots. The number T may be chosen based on different criterion, e.g., T=round (E/B), T=⌈E/B⌉, T=⌊E/B⌋ and others. FIG. 29 shows an example of the RM output approach in which $6E_1=4E_2=4E_3=3E_4$ and B=(3/10) E. T=round(E/B) may be chosen at this point.

RV Selection

The RM operation of the example embodiment of FIGS. 26A and 26B is slot-based, and the RM output for each CB is based on a selected RV index. RM operation may be enhanced by the set of RV indices being the set of RV indices used in Rel-16 PUSCH, or they may be a different set of RV indices that has been possibly increased. In this enhancement, the RM output of a CB in a slot may be based on an RV index. The enhancement includes techniques to select such an index. Multiple options that follow.

A first option includes that the RV index for a CB in each slot follows the selections of RV indices as per the Rel-16 procedure for slot aggregation. An alternative option provides that the RV index for a CB may be incremented for each slot in the multi-slot physical shared channel transmission. Another alternative option includes that the RV index for a CB in each slot may be the largest RV index for which its starting position is smaller than the ending position of the RM output from the previous slot. That is, for a given set of N slots in one multi-slot physical shared channel transmission, $E_i$ is the RM size of slot number i for a CB, and $p_{st}$ is the starting position for the RM output of the first slot (this may be the starting position corresponding to a particular RV index specified for the multi-slot physical shared channel transmission). Then, for slot i, the value $x=p_{st}+\Sigma_{j}^{i-1} E_i$ is computed, and then the RV index is used with a starting position that is the largest one that is less than or equal to x. This alternative option may include selecting the RV index with a starting position that is closest to x.

Still another option includes letting S be the RM size corresponding to the difference between the starting positions of two consecutive RV indices. Then, T=round(E/S) (or T=ceil(E/S) or =floor(E/S)) may be computed, and the RV index of each consecutive slot incremented by T.

Another option may be that the transmitter may be configured with multiple possible sequences of RV selections in which the RV index of different CB segments follow the pattern of one of these sequences. The selection of the sequence to use may be performed, e.g., as follows. The DCI scheduling the multi-slot physical shared channel transmission may include a field for selecting the index of the RV sequence to be used in the multi-slot physical shared channel transmission. This field may be the same RV index field in DCI format 0_1. Alternatively, the field may be a different field or the same field, but with an increased number of bits to accommodate the larger number of RV sequences. The transmitter may be configured with a large set of RV sequences. Then, only a subset of such sequences to be used by the transmitter may be configured by the gNB. The selection of such subset may either be using RRC configurations or via MAC CE. Among the selected subset, the transmitter is indicated the particular sequence to use via a field indicated in the scheduling DCI of the multi-slot physical shared channel transmission. The choice of this field may be the same be the same RV index field in DCI format 0_1. Alternatively, the field may be a different field or may be the same field, but with an increased number of bits to accommodate the larger number of RV sequences.

When a CB crosses a slot boundary, the RV index of the new formed segments may follow the sequence indicated by the DCI as previously described. An example of this operation is explained next in which a transmitter is assumed to be configured with a set of RV sequences as indicated in the next table. Assume a UE is indicated by RV index 0 via the scheduling DCI. In the situation in which one coded CB crosses three slots, the RM output of the three slots would use the RV indices 0, 1 and 2.

The table that the UE follows in order to determine the RV sequence of CB segments across slots may be the Rel-16 table used for determining RV sequences across slot aggregations. Alternatively, a new table may be defined for determining the RV sequence of CB segments across slots, similar (but not constrained) to the Table 2 below.

TABLE 2

| $rv_{id}$ indicated by the DCI scheduling the PUSCH | $rv_{id}$ to be applied to $n^{th}$ slot in a set of slots which includes parts of a coded CB in a multi-slot PUSCH | | | |
|---|---|---|---|---|
| | n mod 4 = 0 | n mod 4 = 1 | n mod 4 = 2 | n mod 4 = 3 |
| 0 | 0 | 1 | 2 | 3 |
| 1 | 1 | 2 | 3 | 0 |
| 2 | 2 | 3 | 0 | 1 |
| 3 | 3 | 0 | 1 | 2 |
| 4 | 0 | 3 | 1 | 2 |
| 5 | 3 | 0 | 2 | 1 |

As an alternative, the transmitter may select an RV index for the slots spanning the CB to ensure that the maximum number of information bits are mapped to higher order symbols with high reliability. For example, in the situation in which 16QAM modulation is used, some bits have higher decoding reliability than others depending on their respective positions within the 16QAM symbols. If all the information bits are transmitted in the coded bit locations of one slot, then approximately half of the information bits would be mapped to unreliable bit positions. In this case, the RV index of the next slot may be selected so that the half of bits that are unreliability transmitted would be re-transmitted in the new slot instead of selecting an RV index, which may lead to transmission of coded bits that are not transmitted.

As a generalization, for a M-QAM modulation scheme, there may be varying levels of reliability for the information bits. Let the number of levels be $K_Q$. Each level represents a different level of reliability in correct decoding. Ideally, information bits would be mapped to the most reliable bit positions. If, however, such mapping is not possible within one slot, then the RV index selection may be made to ensure that the information bits that are not mapped to the most reliable bits would be mapped to most reliable ones in the coming slots.

As an alternative to this condition, each information bit would be sent with a particular "guarantee" in reliability. The concept of "guarantee" as used herein may be a function of the number of repeated transmissions of the information bit and the level of reliability at which each repetition is transmitted. For example, in a 16-QAM setting with two reliability levels, an information bit can be considered as satisfactory transmitted if it is transmitted once in a most reliable position, or twice in two unreliable positions. The RV index selection may then be performed to ensure the maximum number of bits transmitted with guaranteed reliability.

As a simplified alternative, for $K_Q$ levels of reliability with level 1 to $K_Q$ correspond to the most reliable to the least reliable, an information bit may be deemed reliable if it is mapped to any bit of reliability 1 to $K'_Q$, for a given level $K'_Q$. An RV index selection may be made to ensure that the maximum number of information bits is mapped to a reliable bit.

Embodiment 3 of RM and Interleaver Operation

For embodiment 3 of RM and interleaver operation, the interleaver operation is a continuous interleaver operation similar to the previous descriptions. The size of the interleaver may, however, be limited. That is, the interleaver operation may be a continuous interleaver operation, but having a maximum interleaver size. The interleaver size constraint may be enforced by resetting the interleaver operation after each set of interleaver input bits that equal to the maximum interleaver size. In this case, multiple interleaver operations may be performed for the entire RM output (e.g., when the RM output size is larger than the maximum interleaver size).

An interleaver size constraint may alternatively be enforced by limiting the RM output size to be equal to the maximum interleaver size. In this case, the number of bits of the RM output may be limited to the maximum interleaver size.

Yet another way to enforce the interleaver size constrain may be by enforcing the resource allocation of the TBoMS so that the RM output and interleaver input are all within the maximum interleaver size limit.

The interleaver size constraint may be in the form of a value X that sets the maximum interleaver size. The value X may be specified in different ways. For example the value X may be specified as an absolute value that is irrespective of other configurations of the TBoMS. In this case, this specified absolute value may be explicitly mentioned in the Rel-16 specification. Alternatively, the absolute value may be in the form of a numeric value. For example, the numeric value may be in the form of X=1000 bits in which the value 1000 is an example. Another alternative may be that the absolute value may be specified as a relation to one or more other parameters in the Rel-16 specification in which these parameters may not be related to the configuration of any TBoMS in particular. For example, X may be in the form of a fraction of other parameters in the specification, such as the maximum TBS value attained in Rel-16, or any other function of other parameters in the specification.

Still another way is for the value X to be specified in relation to the particular configuration of the scheduled TBoMS or the particular configuration of UE capabilities indicated by the UE which are related to the use of TBoMS. For example, the value of X can be dependent on any one or more of the parameters, such as a scheduled MCS, a scheduled resources in time and/or frequency, a scheduled number of layers, a scheduled number of slots, a resource allocation mechanism, a type of scheduling for the TBoMS (dynamic, configured grant, others), a transport block size, a number of CBs per TB, a configured CBG, and/or a UE capability.

For example, the value X may be dependent on the scheduled BW, MCS, number of layers, and UE capability. The value of X may also be specified in relation to the corresponding interleaver size attained in legacy NR (e.g., Rel-15/16). This corresponding value may be a value that may be attained using the same/similar scheduled parameters when scheduling transmissions in legacy NR (e.g., Rel-15/16).

The value of X may be determined based on the scheduled parameters of the TBoMS, such as rank, modulation order, coding rate, MCS, bandwidth, number of layers and others. For example, if a TBoMS is scheduled in a 50 MHz bandwidth, then the value of X can be determined based on the scheduled bandwidth. Alternatively, the value of X may be determined based on the indicated UE capability of supported parameters for the TBoMS, such as rank, modulation order, coding rate, MCS, bandwidth, number of layers and others. For example, if the TBoMS is scheduled in a 50 MHz bandwidth, but the UE indicates a capability of supporting up to 100 MHz, the value of X may be computed based on the value 100 MHz.

In a situation in which determination of X is dependent on UE capabilities, the values used in the determination may be for each band in each band combination indicated by the UE capabilities.

X may be computed as the value of the TBS corresponding to the legacy (Rel-16) counterpart of the scheduled TBoMS. The legacy counterpart of the TBS may mean the TBS value computed according to the legacy specification procedures and using scheduled/configured parameters and UE capabilities. For example, X may be the TBS value computed according to legacy procedure using the parameters of the scheduled TBoMS, such as, but not limited to, rank, modulation order, coding rate, MCS, bandwidth, and number of layers; or the values of these parameters may be indicated by their respective UE capabilities.

X may be computed as the input interleaver size expected using the legacy specification procedure. For example, X may be equivalent to the number of available coded bits in legacy PDSCH/PUSCH scheduling using the same scheduled/configured parameters for the TBoMS. The number of available coded bits may be given by $N_{RE}*v*Q$ in which all parameters are given the Rel-16 TBS determination equation.

Operational Alternatives for the Interleaver of the Third Embodiment

As a first operational alternative, a UE may not be expected to process an interleaver input size that is larger than the Rel-15/16 limit that correspond to parameters a UE has declared to support for each band in a band combination, and this limit corresponds to the amount of available coded bits G or available coded bits per CB G/C' in section 5.4.2.1 of 38.212 V16.4.0.

As a second operational alternative, a UE may not be expected to process an interleaver input size $G_{max}/C'$ in which C' is given in section 5.4.2.1 of 38.212, and $G_{max}$ may be determined as $N_{RE}Q_mV$ according to 6.1.4.2 in 38.214 for UL-SCH and 5.1.3.2 in TS 38.214 for DL-SCH/PCH, assuming the following for the number of REs ($N_{RE}$), the modulation order ($Q_m$), the number of layers (v), as in 5.4.2.1 of 38.212:

The maximum number of layers for one TB for UL-SCH is given by X in which:
  if the higher layer parameter maxMIMO-Layers of PUSCH-ServingCellConfig of the serving cell is configured, X is given by that parameter,
  else if the higher layer parameter maxRank of pusch-Config of the serving cell is configured, X is given by the maximum value of maxRank across all BWPs of the serving cell,
  otherwise, X is given by the maximum number of layers for PUSCH supported by the UE for the serving cell.
The maximum number of layers for one TB for DL-SCH/PCH is given by the minimum of X and 4 in which
  if the higher layer parameter maxMIMO-Layers of PDSCH-ServingCellConfig of the serving cell is configured, X is given by that parameter,
  otherwise, X is given by the maximum number of layers for PDSCH supported by the UE for the serving cell.
if the higher layer parameter mcs-Table given by a pdsch-Config for at least one DL BWP of the serving cell is set to "qam256", maximum modulation order $Q_m=8$ is assumed for DL-SCH; otherwise a maximum modulation order $Q_m=6$ is assumed for DL-SCH.

if the higher layer parameter mcs-Table or mcs-Table-TransformPrecoder given by a pusch-Config or configuredGrantConfig for at least one UL BWP of the serving cell is set to "qam256", maximum modulation order $Q_m=8$ is assumed for UL-SCH; otherwise a maximum modulation order $Q_m=6$ is assumed for UL-SCH.

$\eta_{PRB}=\eta_{PRB,LBRM}$ is given by Table 5.4.2.1-1 (Table 3) in which the value of $\eta_{PRB,LBRM}$ for DL-SCH is determined according to the initial downlink bandwidth part if there is no other downlink bandwidth part configured to the UE.

$N_{RE}=156 \cdot \eta_{PRB}$.

TABLE 3

(Table 5.4.2.1-1)Value of $\eta_{PRBLBRM}$

| Maximum number of PRBs across all configured DL BWPs and UL BWPs of a carrier for DL-SCH and UL-SCH, respectively | $\eta_{PRBLBRM}$ |
|---|---|
| Less than 33 | 32 |
| 33 to 66 | 66 |
| 67 to 107 | 107 |
| 108 to 135 | 135 |
| 136 to 162 | 162 |
| 163 to 217 | 217 |
| Larger than 217 | 273 |

As a third operational alternative, a UE may not be expected to process an interleaver input size $G_{max}/C'$ in which C' is given in section 5.4.2.1 of 38.212 and $G_{max}$ may be determined as $N_{RE}Q_mV$ according to 6.1.4.2 in 38.214 for UL-SCH and 5.1.3.2 in TS 38.214 for DL-SCH/PCH, assuming the following for the number of REs ($N_{RE}$), the modulation order ($Q_m$), the number of layers (v).

The maximum number of layers for one TB for UL-SCH is given by the maximum number of layers for PUSCH supported by the UE for the serving cell;
  the maximum number of layers for one TB for DL-SCH/PCH is given by the maximum number of layers for PDSCH supported by the UE for the serving cell;
  the maximum modulation order $Q_m=8$ is assumed for DL-SCH if the UE supports 256QAM for the serving cell; otherwise a maximum modulation order $Q_m=6$ is assumed for DL-SCH;
  the maximum modulation order $Q_m=8$ is assumed for UL-SCH if the UE supports 256QAM for the serving cell; otherwise a maximum modulation order $Q_m=6$ is assumed for UL-SCH;
  $\eta_{PRB}=\eta_{PRB,LBRM}$ is given by Table 5.4.2.1-1 (Table 4); and $N_{RE}=156 \cdot \eta_{PRB}$.

TABLE 4

(Table 5.4.3.1-1)Value of $\eta_{PRBLBRM}$

| Maximum number of PRBs corresponding to the maximum channel bandwidth supported by the UE for the serving cell or corresponding to subcarrier spacing of the active BWP of the serving cell | $\eta_{PRBLBRM}$ |
|---|---|
| Less than 33 | 32 |
| 33 to 66 | 66 |
| 67 to 107 | 107 |
| 108 to 135 | 135 |

TABLE 4-continued (Table 5.4.3.1-1)Value of $\eta_{PRBLBRM}$

| Maximum number of PRBs corresponding to the maximum channel bandwidth supported by the UE for the serving cell or corresponding to subcarrier spacing of the active BWP of the serving cell | $\eta_{PRBLBRM}$ |
|---|---|
| 136 to 162 | 162 |
| 163 to 217 | 217 |
| Larger than 217 | 273 |

As a fourth operational alternative for a configured TBoMS, a feature set is said to be satisfied by the configured TBoMS if the parameters associated with the TBoMS satisfy the UE capabilities indicated in the feature set. A UE is not expected to process an interleaver input size $G_{max}/C'$ in which C' is given in section 5.4.2.1 of 38.212 and $G_{max}$ may be determined as $N_{RE}Q_m V$ according to 6.1.4.2 in 38.214 for UL-SCH and 5.1.3.2 in TS 38.214 for DL-SCH/PCH, assuming the following for the number of REs ($N_{RE}$), the modulation order ($Q_m$), the number of layers (v).

The maximum number of layers for one TB for UL-SCH is given by the maximum number of layers for PUSCH supported by the UE within the set of satisfied feature sets;
  the maximum number of layers for one TB for DL-SCH/PCH is given by the maximum number of layers for PDSCH supported by the UE within the set of satisfied feature sets;
  the maximum modulation order $Q_m=8$ is assumed for DL-SCH if the UE supports 256QAM within the set of satisfied feature sets; otherwise a maximum modulation order $Q_m=6$ is assumed for DL-SCH;
  the maximum modulation order $Q_m=8$ is assumed for UL-SCH if the UE supports 256QAM within the set of satisfied feature sets; otherwise a maximum modulation order $Q_m=6$ is assumed for UL-SCH;
  $\eta_{PRB}=\eta_{PRB,LBRM}$ is given by Table 5.4.2.1-1 (Table 5); and
  $N_{RE}=156 \cdot \eta_{PRB}$.

TABLE 5

(Table 5.4.2.1-1)Value of $\eta_{PRBLBRM}$

| Maximum number of PRBs corresponding to the maximum channel bandwidth supported by the UE for the serving cell corresponding to 'maximum or minimum' subcarrier spacing configured for the serving cell or corresponding to subcarrier spacing of the active BWP of the serving cell | $\eta_{PRBLBRM}$ |
|---|---|
| Less than 33 | 32 |
| 33 to 66 | 66 |
| 67 to 107 | 107 |
| 108 to 135 | 135 |
| 136 to 162 | 162 |
| 163 to 217 | 217 |
| Larger than 217 | 273 |

In other words, this operational alternative corresponds to computing the interleaver size limit using parameters selected from satisfied feature sets in a way that maximizes the limit value.

As a fifth operational alternative for a configured TBoMS, a feature set is said to be satisfied by the configured TBoMS if the parameters associated with the TBoMS satisfy the UE capabilities indicated in the feature set. For each satisfied feature set, a UE may not be expected to process an interleaver input size $G_{max}/C'$ in which C' is given in section 5.4.2.1 of 38.212 and $G_{max}$ is determined as $N_{RE}Q_m v$ according to 6.1.4.2 in 38.214 for UL-SCH and 5.1.3.2 in TS 38.214 for DL-SCH/PCH, assuming the following for the number of REs ($N_{RE}$), the modulation order ($Q_m$), the number of layers (v).

The maximum number of layers for one TB for UL-SCH is given by the maximum number of layers for PUSCH supported by the UE in the satisfied feature set;
  the maximum number of layers for one TB for DL-SCH/PCH is given by the maximum number of layers for PDSCH supported by the UE in the satisfied feature set;
  the maximum modulation order $Q_m=8$ is assumed for DL-SCH if the UE supports 256QAM in the satisfied feature set; otherwise a maximum modulation order $Q_m=6$ is assumed for DL-SCH;
  the maximum modulation order $Q_m=8$ is assumed for UL-SCH if the UE supports 256QAM in the satisfied feature set; otherwise a maximum modulation order $Q_m=6$ is assumed for UL-SCH;
  $\eta_{PRB}=\eta_{PRB,LBRM}$ is given by Table 5.4.2.1-1 (Table 6); and
  $N_{RE}=156 \cdot \eta_{PRB}$.

TABLE 6

(Table 5.4.2.1-1)Value of $\eta_{PRBLBRM}$

| Maximum number of PRBs corresponding to the maximum channel bandwidth supported by the UE for the serving cell corresponding to 'maximum or minimum' subcarrier spacing configured for the serving cell or corresponding to subcarrier spacing of the active BWP of the serving cell | $\eta_{PRBLBRM}$ |
|---|---|
| Less than 33 | 32 |
| 33 to 66 | 66 |
| 67 to 107 | 107 |
| 108 to 135 | 135 |
| 136 to 162 | 162 |
| 163 to 217 | 217 |
| Larger than 217 | 273 |

In other words, the fifth operational alternative corresponds to choosing the minimum interleaver size limit across all satisfied feature sets.

Embodiment 4 of RM and Interleaver Operation

In a fourth embodiment, the interleaver operation may be a continuous interleaver operation, but across a certain unit of resources. The unit of resources may be a slot, in which case the fourth embodiment similar to the embodiment 2 of the RM and interleaver operation. The unit of resources may be the entire set of slots for the TBoMB, in which case the fourth embodiment becomes similar to embodiment 1 of the RM and interleaver operation. The unit of resources may be different from a slot or the entire set of slots for TBoMS. For example, the unit of resources may be a set of time contiguous or non-contiguous resources, which may or may not span different slots.

In some cases, the RM output may include of multiple such units of resources. In some cases, the definition of the unit may depend on its relative location with respect to the RM output. For example, the first unit in the RM output may correspond to certain resources with certain configuration, while the second or later units in the RM output may correspond to different configuration of resources. In this case, the interleaver operation may be continuous in the context of one unit, while independent interleaver operations may occur across different units.

Mapping from Virtual to Physical Resources

The subject matter disclosed herein includes methods to perform mapping from virtual to physical resources in the context of multi-slot physical shared channel transmission processing. That is, a transmitter may be indicated with a set of physical resources to use for the transmission of a multi-slot physical shared channel transmission. It may be assumed that the set of resources includes $N_{slots}^{phy}$ slots. Each slot of the $N_{slots}^{phy}$ slots may be associated with a global identifier of the slot location in the system, e.g., an identifier based on the System Frame Number (SFN). For the ith slot, a set $S_{i,sym}^{phy}$ may include the indices of OFDM symbols that are allocated for the transmitter to use in the multi-slot physical shared channel transmission in which each symbol corresponds to a set of REs for each allocated SC. The set of $N_{slots}^{phy}$ slots may be consecutive or non-consecutive. It may be assumed that the slots are ordered in time according to their time index, i.e., slot i comes before slot j in time if i<j. The sets of symbols $S_{i,sym}^{phy}$ may have UL symbols, DL symbols or F symbols. For the indication of the sets, no assumptions on the rules have been made related to the transmission directions that are mandated for those symbols. For example, some of the symbols in the sets $S_{i,sym}^{phy}$ may have DL/UL symbols. A transmitter, however, should comply with the transmission rules indicated by the network or the gNB for the allocated symbols.

The transmitter may also be indicated a set of virtual resources to use in the processing of multi-slot physical shared channel transmission. It may be assumed that this set of resources includes $N_{slots}^{vir}$ slots. For the ith slot, a set $S_{i,sym}^{vir}$ includes the indices of OFDM symbols that are allocated for the transmitter to use in the multi-slot physical shared channel transmission. The number of virtual sets $N_{slots}^{vir}$ may be the same or different than the number of physical slots $N_{slots}^{phy}$. The sets of virtual symbols $S_{i,sym}^{vir}$ may the same or different than the sets of physical symbols $S_{i,sym}^{phy}$. Indication of the sets may be done dynamically or semi-statically.

Indication of virtual resources may be separate from the indication of physical resources. Alternatively, indication of virtual resources may be implicitly deduced from the set of physical resources. For example, the set of virtual resources may be determined by considering the set of physical resources and omitting the resources corresponding to physical resources with transmission in the intended direction being not allowed (e.g., with DL and/or F transmission direction as dictated by TDD configurations in the case of multi-slot PUSCH).

Based on the allocations of physical and virtual resources, several methods of mapping from virtual to physical resources follow.

In the case in which the virtual and physical sets are identical, i.e., $N_{slots}^{phy}=N_{slots}^{vir}$ and $S_{i,sym}^{phy}=S_{i,sym}^{vir}$ and all slots in the set of physical slots are contiguous, the resources corresponding to the symbols in $S_{i,sym}^{vir}$ may be mapped to the resources corresponding to the symbols in $S_{i,sym}^{phy}$.

When the virtual and physical sets are identical, i.e., $N_{slots}^{phy}=N_{slots}^{vir}$ and $S_{i,sym}^{phy}=S_{i,sym}^{vir}$, and not all slots in the set of physical slots are contiguous, the set of physical slots 1, include a number of subsets in which each subset includes contiguous slots. In this case, the resources corresponding to the symbols in $S_{i,sym}^{viry}$ may be mapped to the resources corresponding to the symbols in $S_{i,sym}^{phy}$. For example, $N_{slots}^{phy}=4$ and the set of four slots includes two subsets each subset contains two consecutive slots. This may, for example, be a case of multi-slot PUSCH and for a TDD configuration of the form DDSUUDDSUU in which all the U slots are allocated for the multi-slot PUSCH. This may also happen due to dynamic indication of slot format. Consider for example a TDD configuration FFFFFF. A UE may be indicated via an SFI indication the following pattern of this configuration UUUUDD. After performing the necessary PUSCH processing for the multi-slot PUSCH, the UE receives another SFI indication that changes the pattern to UUDDUU in which case the UE may perform a multi-slot PUSCH transmission on the set of newly-determined physical slots. As another example, $N_{slots}^{phy}=4$ and none of the four slots are contiguous. This may, for example, be the case of multi-slot PUSCH and for a TDD configuration of the form DDSUDDSUDDSUDDSU in which all the U slots are allocated for the multi-slot PUSCH.

In the case in which the number of physical slots is smaller than the virtual slots, i.e., $N_{slots}^{phy}<N_{slots}^{vir}$, which may correspond to the following use case in Rel-16, the UE may be allocated a set of physical slots for a transmission of a multi-slot PUSCH. The UE then may determine that all physical slots are feasible for transmission and, therefore, corresponding virtual slots are identical to physical slots. Later, some physical slots may be rendered not suitable for transmission due to dynamic changes in, e.g., TDD configuration. In this case, the UE has different options for mapping. For a first option, the UE may continuously map virtual slots to physical slots in their respective orderings. Consequently, the extra $N_{slots}^{vir}-N_{slots}^{phy}$ virtual slots with no physical slots to be mapped to end up being the last $N_{slots}^{viry}-N_{slots}^{phy}$ of the set of virtual slots. For a second option, the UE may continuously map virtual slots to physical slots in their respective orderings. If determination of virtual slots was based on physical slots, then the UE may also skip virtual slots having original physical slots are no longer available.

In the case in which the number of physical slots is larger than the virtual slots, i.e., $N_{slots}^{phy}>N_{slots}^{vir}$, which may happen for example if the UE is indicated with slots to use for multi-slot PUSCH processing and some slots are determined to be not suitable for UL transmission at the time when the UE is determining virtual slots from physical slots, the UE has different options for mapping.

For a first option, the UE may continuously map virtual slots to physical slots in their respective orderings. If a physical slot is not suitable for transmission, it is skipped while the corresponding virtual slot is not skipped. For example, the set of virtual slots may be numbered from 1 to 4 and physical slots numbered from 1 to 5 with the third slot being not suitable. Then, the mapping from virtual to physical is: 1-1, 2-2, 3-4, 4-5.

For a second option, the UE may continuously map virtual slots to physical slots in their respective orderings. If a physical slot is not suitable for transmission, the slot is skipped while the corresponding virtual slot is also skipped. For example, assume the set of virtual slots are numbered from 1 to 4 and physical slots from 1 to 5 with the third slot being not suitable. Then, the mapping from virtual to physical is: 1-1, 2-2, 4-4, nothing-5.

As may be clear from the examples, it may be possible that some physical slots may end up with nothing being mapped from virtual slots. In such a situation, the UE may refrain from sending anything in those particular slots. Alternatively, the UE may retransmit other virtual slots in those physical slots. For example, in the example above in which the mapping resulted in nothing-5, the nothing-5 mapping may be replaced with 1-5 or 4-5. Another possibility may be that some virtual slots may not be mapped to any physical slot.

UCI Multiplexing with Multi-Slot PUSCH

One technique that may prevent UCI multiplexing with multi-slot PUSCHs is that a UE may not be expected to have a UCI multiplexing situation with multi-slot PUSCH. Alternatively, a UE may be instructed to handle UCI multiplexing with multi-slot PUSCH in a way that does not lead to UCI multiplexing actually occurring. For example, a UE may cancel the UCI transmission or the multi-slot PUSCH transmission if such multiplexing situation occurs. In case the multi-slot PUSCH transmission is cancelled, then the affected slot may be cancelled, or the affected slot and all subsequent slots. In case such a cancellation takes place, the UE should be expected to cancel transmission in the OFDM symbols that are within a suitable cancellation timeline.

Figure 30:
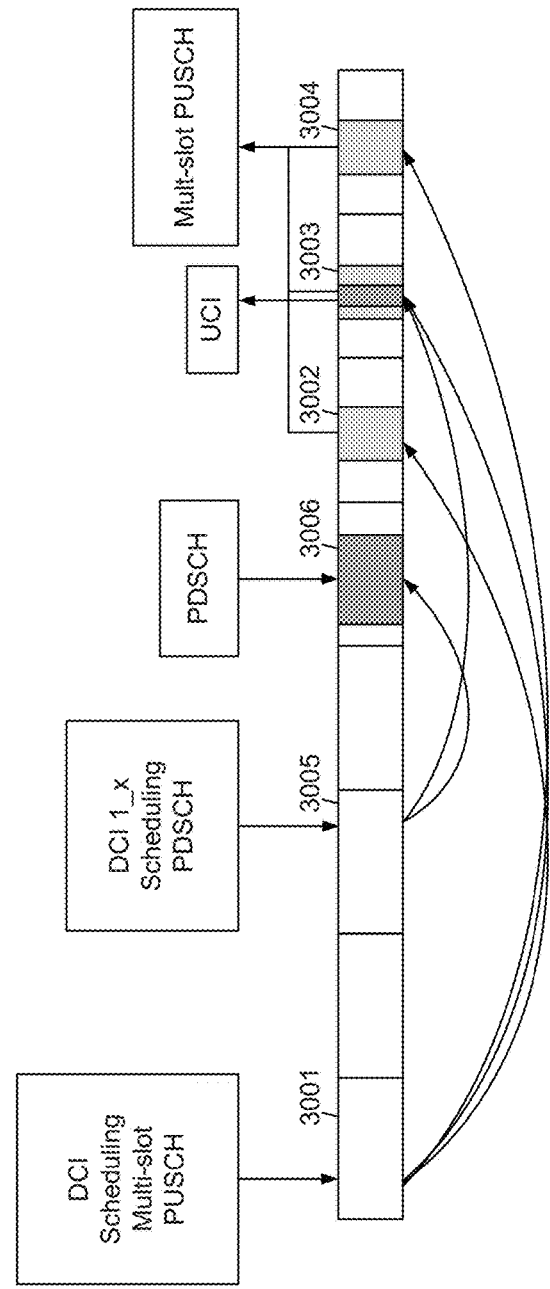
FIG. 30 depicts an example situation in which a multi-slot PUSCH is scheduled and that an uplink control information has been scheduled to be multiplexed in one of the slots forming the multi-slot PUSCH.

FIG. 30 depicts an example situation in which a multi-slot PUSCH is scheduled and that a UCI has been scheduled to be multiplexed in one of the slots forming the multi-slot PUSCH. In FIG. 30, a multi-slot PUSCH scheduling occurs at 3001 for slots 3002-3004. Subsequent to the multi-slot PUSCH scheduling, a UCI PDSCH is scheduled at 3005 for slots 3006 and 3003.

Figure 31:
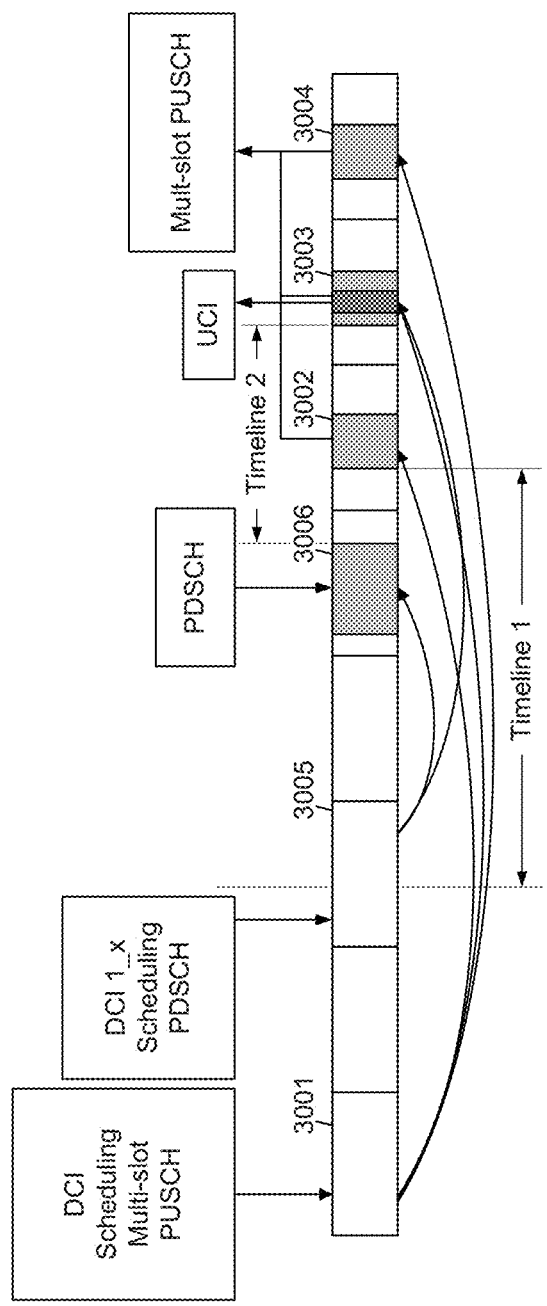
FIG. 31 depicts the example situation of FIG. 30 from a timeline perspective.

The situation depicted in FIG. 30 is considered in FIG. 31 from a timeline perspective and then from a performance perspective. Different approaches to handling UCI multiplexing are as follows. That is, when the UE determines that a UCI multiplexing situation is to take place with one or more slots in a multi-slot PUSCH the following options may be performed.

As a first option, the UE may adapt the interleaver output for all slots in the multi-slot PUSCH. For this option, the Rel-16 timeline associated with UCI multiplexing on multi-slot PUSCH, indicated as Timeline 1 in FIG. 31, should be adapted to provide sufficient time to adapt possibly earlier slots in the multi-slot PUSCH prior to the slot in which UCI multiplexing takes place. It may suffice to adapt only Timeline 1 in FIG. 31 in order to determine the interleaver behaviour with UCI multiplexing in effect. A Timeline 2 in FIG. 31 allows the UE to determine the exact values of the UCI bits that are to be multiplexed, which may not require a similar adaptation to the Rel-16 Timeline 1 in FIG. 31. Alternatively, both Timelines 1 and 2 in FIG. 31 may be adapted to similar to the adaptation provided for Timeline 1. This approach works with all of the previously described embodiments of the RM and interleaver operation.

From a performance perspective, this may allow the UE to naturally inherent the multiplexing behavior in Rel-16, that is, the UE may recompute the RM outputs and interleaver outputs for the updated amounts of resources available after UCI multiplexing. This also may allow easy handling of UCI multiplexing from a UE implementation perspective. This, however, may be quite constraining from a scheduling point of view.

The UE may adapt the interleaver output of the affected slot and later possible slots by puncturing the interleaver output at the locations in which REs are to be used for sending symbols carrying UCI bits. This solution may result in a bad decoding of the multi-slot PUSCH. That is, puncturing the REs used for UCI bits may remove important coded bits of the CB carried in the punctured slots, which may seriously reduce the probability of successful decoding of affected CBs. This adverse effect relating to unsuccessful decoding may be present in all instances of puncturing.

Figure 32:
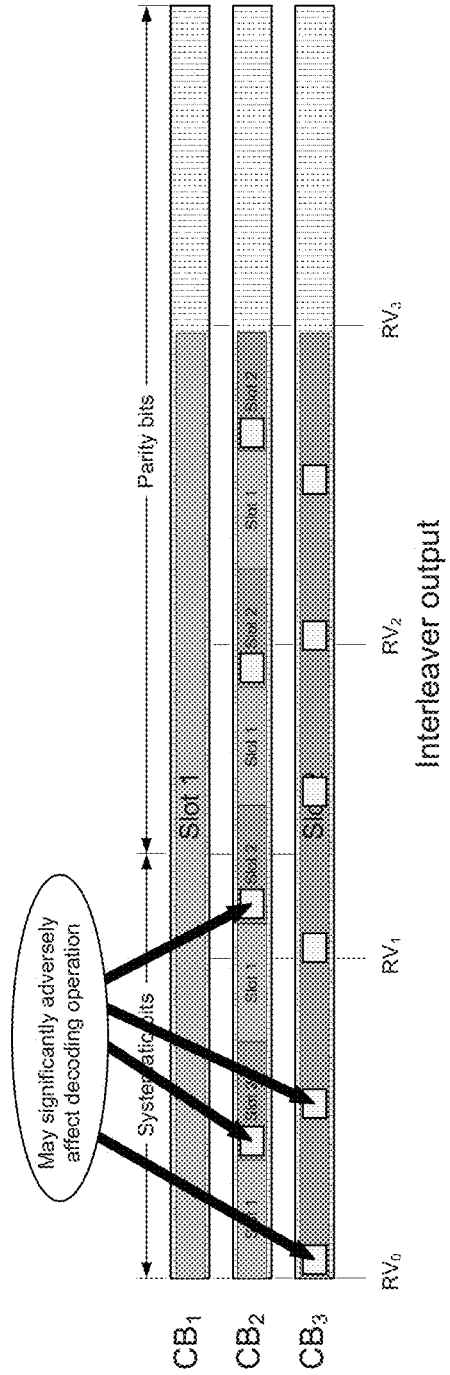
FIG. 32 depicts example punctured slots for a first embodiment of a rate matching and an interleaver operation according to the subject matter disclosed herein.
Figure 33:
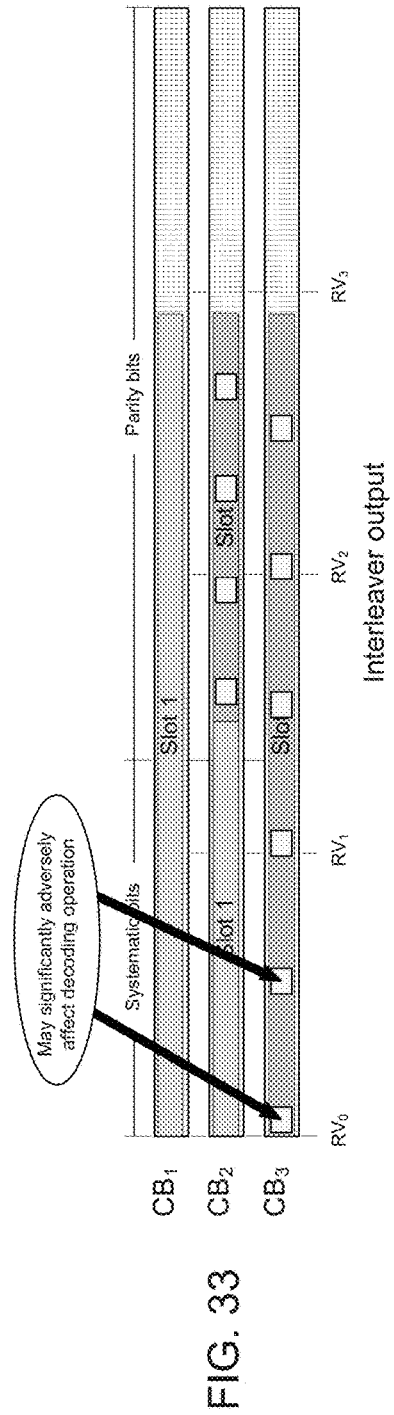
FIG. 33 depicts example punctured slots for a first embodiment of a rate matching and an interleaver operation according to the subject matter disclosed herein.

FIGS. 32 and 33 respectively depict punctured slots for the Embodiment 1 and Embodiment 2 of the RM and interleaver operation.

For Embodiments 1 and 1a, interleaving for entire slots for the affected CB has already happened, and it cannot be redone. In other words, for the CB mapped on M slots, the interleaving input sequence may be given as $e_0, e_1, \ldots, e_{E-1}$ in which $E = \Sigma_{i=1}^{M} E_i$ and $E_i$ is the number of coded bits available in the ith slot. Then, the interleaving output sequence will be $f_0, f_1, \ldots f_{E-1}$ in which bits from $f_{\Sigma_{j=1}^{i-1} E_j}$ to $f_{\Sigma_{j=1}^{i} E_j - 1}$ correspond to bits mapped in the slot i. If UCI multiplexing happens in the slot i and if the resulting rate matching size becomes then a UE should select $E'_i$ bits out of bits from $f_{\Sigma_{j=1}^{i-1} E_j}$ to $f_{\Sigma_{j=1}^{i} E_j - 1}$ to transmit. One way of doing this may be to transmit from $f_{\Sigma_{j=1}^{i-1} E_j}$ to $f_{\Sigma_{j=1}^{i-1} E_j + E'_i - 1}$. This corresponds to continuous bit selection/puncturing from interleaver output. An alternative way may be for continuous bit selection/puncturing from interleaver input that may be realized as follows. First, $E_i$ bit positions are selected from the original interleaver input sequence $e_0, e_1, \ldots, e_{E-1}$ corresponding to the original interleaver output from $f_{\Sigma_{j=1}^{i-1} E_j}$ to $f_{\Sigma_{j=1}^{i} E_j - 1}$. Then, certain $E'_i$ bits can be selected out of these $E_i$ values, and the corresponding $E'_1$ values in the original interleaver output can be transmitted. One possible selection of $E'_1$ bits may be by the increasing order of bit positions in $e_i$. In this case, the interleaver operation may not performed again as a consequence of rate matching size change, as previously described. A general selection of $E'_i$ bits may be by selection the bits $e_{\Phi(0)}, e_{\Phi(1)}, \ldots, e_{\Phi(E'_i - 1)}$ in which the function $\Phi(i)$ is a selection function that determines which bit to be selected in the ith position. The function $\Phi(i) = i$ corresponds to the one possible selection that has been previously described.

If UCI multiplexing happens in the slot i and if the resulting rate matching size becomes $E'_i$, then another alternative may be to perform interleaving again. One way of performing interleaving again may be to select $E'_i$ bit positions from the original interleaver input sequence $e_0, e_1, \ldots, e_{E-1}$ corresponding to the original interleaver output sequence from $f_{\Sigma_{j=1}^{i-1} E_j}$ to $f_{\Sigma_{j=1}^{i-1} E_j + E'_i - 1}$ as a new interleaver input sequence. Then, the interleaver operation may be applied on this sequence to obtain new interleaver output sequence. This corresponds to continuous bit selection/puncturing from interleaver output. Another alternative may be selecting $E_i$ bit positions from the original interleaver input sequence $e_0, e_1, \ldots, e_{E-1}$ corresponding to the original interleaver output from $f_{\Sigma_{j=1}^{i-1} E_j}$ to $f_{\Sigma_{j=1}^{i} E_j} - 1$ and selecting $E'_i$ bit positions from the $E_i$ bit positions. This corresponds to continuous bit selection/puncturing from the interleaver input. Then, a new length $E'_1$ interleaver sequence $e'_0, e'_1, \ldots, e'_{E'_i - 1}$ is constructed, and the interleaver operation may be applied on this sequence to obtain new interleaver output sequence. In this case, reperforming interleaver operation may be restricted to slot i. A general selection of the $E'_i$ bit positions may be done using a function $\Phi(i)$ that is similar to that previously described.

If UCI multiplexing occurs in the slot i and if the resulting rate matching size becomes $E'_i$, then another alternative may be to perform interleaving together with all later slots by utilizing the length $E'_i + \Sigma_{j=i+1}^{M} E_j$ sequence as a new interleaver input. Such interleaver input sequence may be formed by selecting certain $E'_1 + \Sigma_{j=i+1}^{M} E_j$ bit positions from the original interleaver input sequence $e_0, e_1, \ldots, e_{E-1}$ either in continuous in interleaver input or output as previously described. One possible way may be to select $E'_1 + \Sigma_{j=i+1}^{M} E_j$ bit positions from the original interleaver input sequence $e_0, e_1, \ldots, e_{E-1}$ corresponding to the original interleaver output from $f_{\sum_{j=1}^{i-1} E_j}$ to $f_{E-1}$. One possible such way may be to utilize from $f_{\sum_{j=1}^{i-1} E_j}$ to $f_{E-1+'_i-Edi\ i}$. This corresponds to continuous bit selection/puncturing from the interleaver output. Alternatively, continuous bit selection/puncturing from interleaver input may be utilized, as previously described, or using a generalized selection function $\Phi(i)$.

Another consideration may be related to how $E'_i$ is calculated for each CB if slot i involves multiple CBs. For example, consider two CBs mapped in slot i having original RM sizes that are $E_{i,1}$ and $E_{i,2}$ respectively, which correspond to the total RM size $E_i=E_{i,1}+E_{i,2}$, and consider the total RM size reduces to $E'_i$ due to UCI multiplexing. Then, there are several possible ways to compute new RM size for each CB $E'_{i,1}$ and $E'_{i,2}$ satisfying $E'_i=E'_{i,1}+E'_{i,2}$ as:

Equal size: $E'_{i,1} = E'_{i,2} = E'_i/2$;

Equal reduction: $E'_{i,1} = E_{i,1} - (E_i - E'_i)/2$, $E'_{i,2} = E_{i,2} - (E_i - E'_i)/2$;

Weighted size: $E'_{i,1} = E'_i\left(\frac{E_{i,1}}{E_i}\right)$ ( or $E'_{i,1} = \text{ceil}\left(E'_i\left(\frac{E_{i,1}}{E_i}\right)\right)$, or $E'_{i,1} = \text{floor}\left(E'_i\left(\frac{E_{i,1}}{E_i}\right)\right)$), $E'_{i,2} = E'_i\left(\frac{E_{i,2}}{E_i}\right)$ ( or $E'_{i,2} = E'_i - E'_{i,1}$);

or

Weighted reduction: $E'_{i,1} =$ $E_{i,1} - (E_i - E'_i)\left(\frac{E_{i,1}}{E_i}\right)$ ( or $E'_{i,1} = E_{i,1} - \text{ceil}\left((E_i - E'_i)\left(\frac{E_{i,1}}{E_i}\right)\right)$), or $E'_{i,1} = E_{i,1} - \text{floor}\left((E_i - E'_i)\left(\frac{E_{i,1}}{E_i}\right)\right)$), $E'_{i,2} = E_{i,2} - (E_i - E'_i)\left(\frac{E_{i,2}}{E_i}\right)$ ( or $E'_{i,2} = E'_i - E'_{i,1}$).

This solution may be quite complicated from a UE implementation perspective as well as from an impact to the specification.

Figure 34:
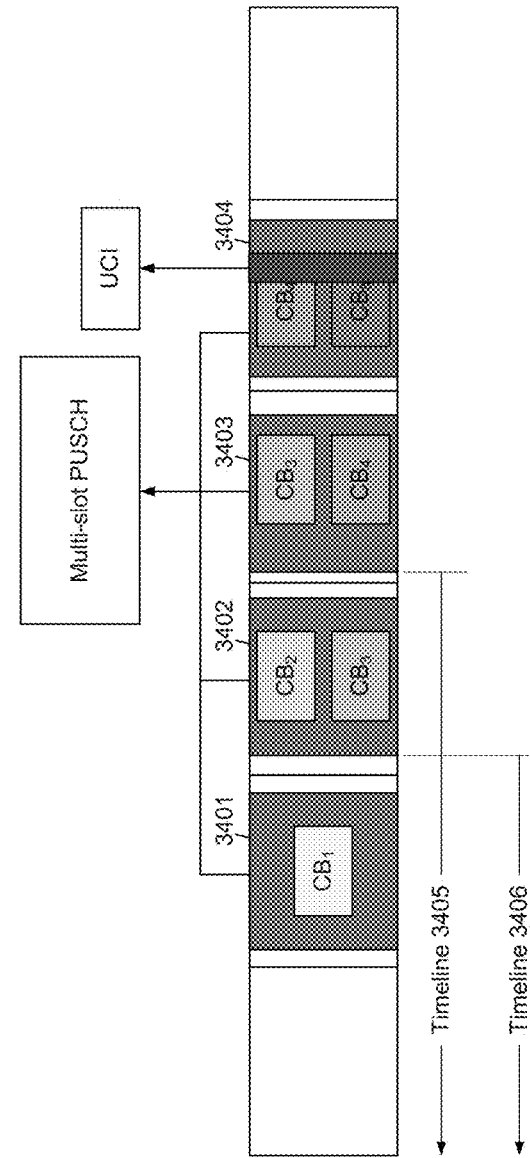
FIG. 34 depicts timeline adaptations for a multi-slot shared channel with four slots and four code blocks for uplink control information multiplexing according to the subject matter disclosed herein.
Figure 35:
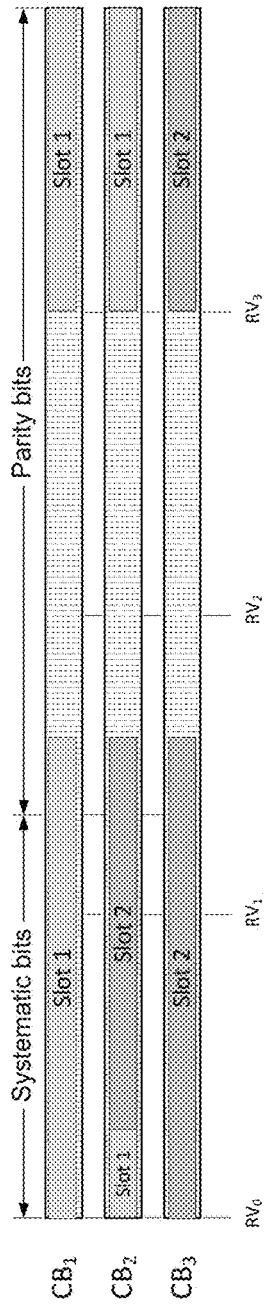
FIG. 35 depicts an example rate matching output for each code block for a multi-slot PUSCH that spans two slots with three code blocks, RV3 and with UCI multiplexing according to the subject matter disclosed herein.

An alternative to the previous approach may be to let the UE redetermine the RM output of all slots that contain CBs that were affected by the UCI multiplexing. This involves a timeline adaptation to allow sufficient time before the first slot containing affected CB for the UE to perform the related processing. There are three options for timeline adaptation of which two of the options are depicted in FIG. 34, which depicts a multi-slot shared channel with four slots 3401-3404 and four code blocks $CB_1$-$CB_4$.

A first option may be that a timeline providing sufficient time to perform the related processing starts from the first slot containing the affected CB. In FIG. 34, the timeline 3405 for the first option starts from slot 3403, which contains the starting of $CB_4$. A second option may be that a timeline 3406 starts from the first slot containing a CB that does not exist in earlier slots. In FIG. 34, the timeline starts from slot 3402, the first slot before slot 3404 that contains a code block (i.e., $CB_2$) that does not exist in earlier slots. A third option may be that the timeline to allow sufficient time to perform the related processing starts from the first slot of multi-slot PUSCH.

For Embodiments 2 and 2a, which rely on a slot-based interleaver configuration, the UE may redetermine the RM output of the affected slot and possibly later slots. This may be done following a Rel-16 operation for RM determination due to UCI multiplexing, which is facilitated based on the slot-based operation of the interleaver. In this case, when slot i is affected by UCI multiplexing resulting in new RM size of $E'_i$ compared with the original $E_i$, the new interleaver input sequence may be selected from the original input sequence $e_{\sum_{j=1}^{i-1} E_j}, e_{\sum_{j=1}^{i-1} E_j+1}, \ldots, e_{\sum_{j=1}^{i} E_j-1}$ by selecting $e_{\sum_{j=1}^{i-1} E_j}, e_{\sum_{j=1}^{i-1} E_j+1}, \ldots, e_{\sum_{j=1}^{i-1} E_j+E'_i-1}$. In this case, interleaving the input sequence of all later slots k may also be adjusted as $e_{\sum_{j=1}^{i-1} E_j+E'_i+\sum_{l=i+1}^{k-1} E_l}, e_{\sum_{j=1}^{i-1} E_j+E'_i+\sum_{l=i+1}^{k-1} E_l+1}, \ldots, e_{\sum_{j=1}^{i-1} E_j+E'_i+\sum_{l=i+1}^{k-1} E_l-1}$, or may remain the same as before as $e_{\sum_{j=1}^{k-1} E_j}, e_{\sum_{j=1}^{k-1} E_j+1}, \ldots, e_{\sum_{j=1}^{k} E_j-1}$. Alternatively, the new interleaver input sequence may be selected from the original input sequence using a general selection function $\Phi(i)$ as previously described. Another consideration may be how $E'_i$ is calculated for each CB if slot i involves multiple CBs, and the previously described variations may be applied.

With such implementations, the UE may also perform a smart RM determination operations that allows for better decoding performance of affected CBs. This operation may be explained in the following example. Consider the example shown in FIG. 35 in which a multi-slot PUSCH spans two slots with three CBs with RV3, and the RM output is shown for each CB.

Figure 36:
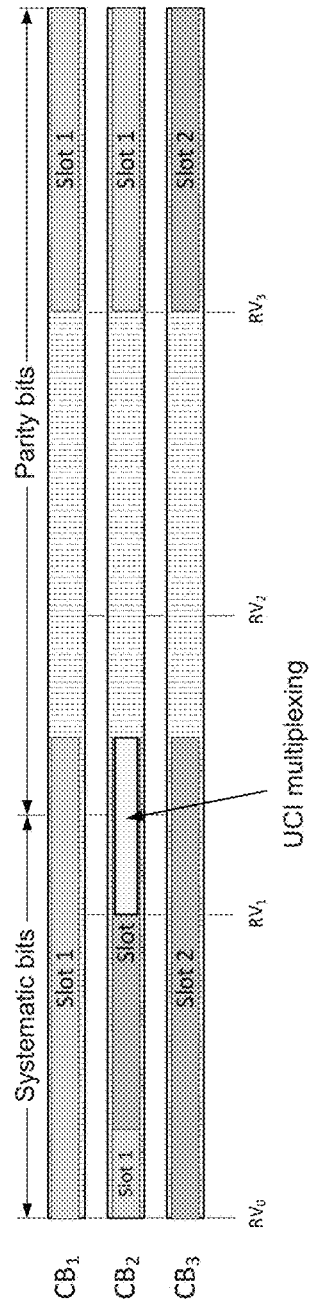
FIG. 36 depicts an example rate matching output for a multi-slot PUSCH with two slots, three code blocks, RV3 and with UCI multiplexing according to the subject matter disclosed herein.

Assume that UCI multiplexing occurs on the second slot of the multi-slot PUSCH, which leads to a fraction of the coded bits in slot 2 no longer being available for the CB s in the PUSCH. When adapting the RM output of the CBs affected by bits no longer being available, one choice may be to reduce the amount of available coded bits equally among those affected bits. Such an approach, however, may not provide the best decoding performance of the TB, as shown in FIG. 36, which depicts a RM output for multi-slot PUSCH with two slots, three CBs, RV3, and with UCI multiplexing. The RM output of affected CBs are treated equally. In this case, CB2 is quite adversely impacted due to the omission of systematic bits for the RM output. An adverse effect that does not occur for CB3.

Figure 37:
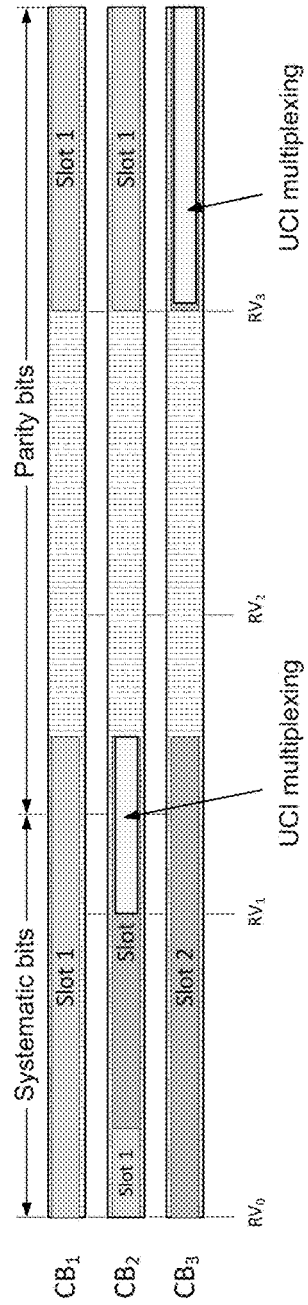
FIG. 37 depicts an example rate matching output for a multi-slot PUSCH with two slots, three code blocks, RV3 and with UCI multiplexing that maintains systematic bits of the code blocks according to the subject matter disclosed herein.

A better technique than that depicted in FIG. 36 may be to adapt the RM output of the two CB s differently according to the types of coded bits being included. For example, one RM output may be to reduce the amount of parity bits from both CB s equally until all parity bits are omitted for one CB, then all remaining omission may be distributed among CBs with remaining parity bits and so on. This approach is depicted in FIG. 37, which depicts a RM output for multi-slot PUSCH with two slots, three CBs and RV3, and with UCI multiplexing. The RM output of affected CBs maintains systematic bits.

Figure 38:
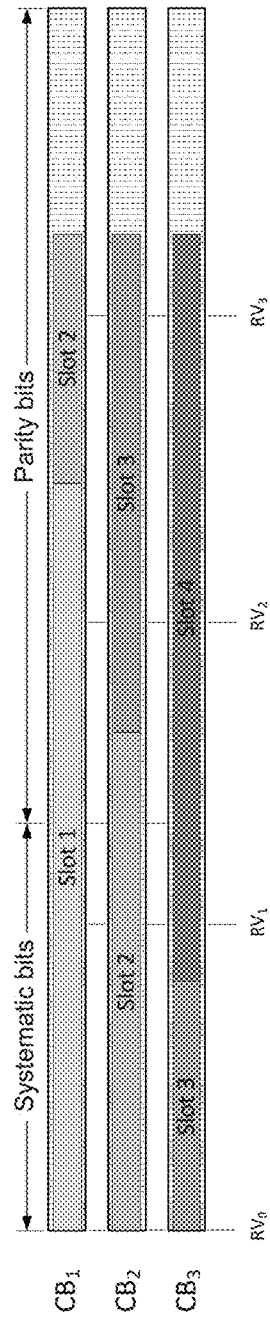
FIG. 38 depicts an example rate matching output for a multi-slot PUSCH that spans four slots with three CBs with RV0 according to the subject matter disclosed herein.

In the example depicted in FIG. 38 depicts the RM output for each CB for a multi-slot PUSCH that spans four slots with three CBs with RV0.

Figure 39:
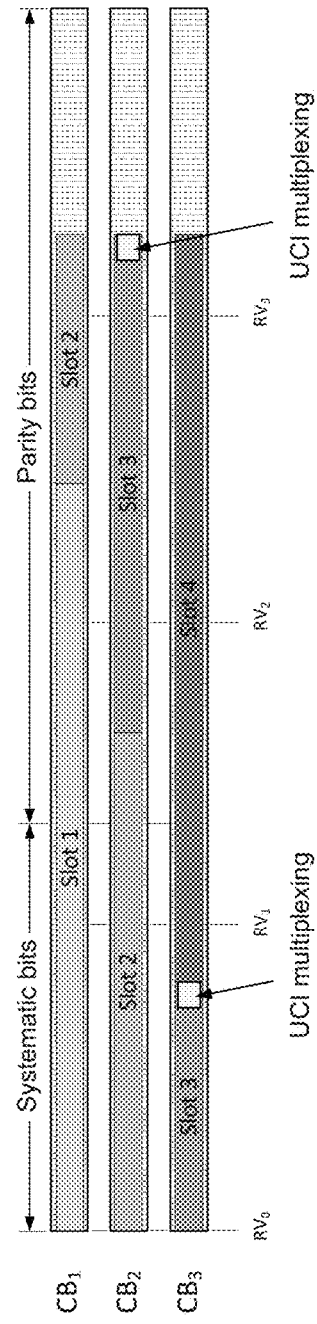
FIG. 39 depicts the rate matching output corresponding to FIG. 38 in which the amount of available coded bits is reduced equally among the affected bits according to the subject matter disclosed herein.
Figure 40:
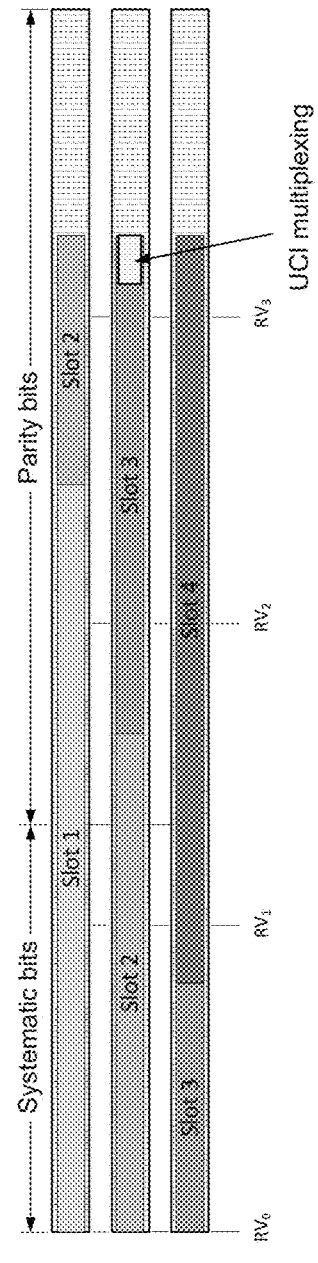
FIG. 40 depicts the rate matching output corresponding to FIG. 38 in which the affected code block maintains systematic bits according to the subject matter disclosed herein.

Consider an example situation in which UCI multiplexing occurs on the third slot of the multi-slot PUSCH, which results to a fraction of the coded bits in slot 3 being no longer available for the CBs in the PUSCH. FIG. 39 depicts the RM output corresponding to FIG. 38 in which the amount of available coded bits is reduced equally among the affected bits. In this case, CB3 is quite negatively affected due to the omission of systematic bits for the RM output (even for such a small number of omitted bits). An effect that does not occur for CB2. FIG. 40 depicts the RM output corresponding to FIG. 38 in which the affected CBs maintain systematic bits. Implementing a smart RM determination approach may be a matter of determining the new RM output size $E'_i$ for each CB in the affected slot i. If the RM output of the CB at slot i before UCI multiplexing is $e_{\sum_{j=1}^{i-1} E_j}, e_{\sum_{j=1}^{i-1} E_j+1}, \ldots,$ $e_{\Sigma_{j=1}^{i-1}E_j-1}$, then the RM output for the CB after UCI multiplexing is $e_{\Sigma_{j=1}^{i-1}E_j}, e_{\Sigma_{j=1}^{i-1}E_j+1}, \ldots, \Sigma_{\Sigma_{j=1}^{i-1}E_j+E'_i-1}$. Then, the following options may be used for determining the values of $E'_i$ for each CB in slot i.

A first option may determine $E'_i$ to be equal among all CBs in the affected slot i.

A second option may be to let the number of CBs in slot i be K. For CB number k in the K CBs, let the amount of information bits and parity bits originally scheduled to be transmitted in slot i be $b_k$ and $p_k$ respectively. Also relabel $E'_i$ as $E'^{,k}_i$ to distinguish the new RM sizes for each CB. And let the new RM size for slot i be equal to $E'_i$. Then, set $E'^{,k}_i$ to be equal to min $(E'_i/K, p_1, p_2, \ldots, p_K)$. If $\Sigma_{k=1}^{K} E'^{,k}_i < E'_i$, then reduce all values of $p_k$ by $$\min\left(\frac{E'_i}{K}, p_1, p_2, \ldots, p_K\right),$$

and consider the CBs with non-zero values of $p_k$, which is the new set of CBs the size of which is K. Increase $E'^{,k}_i$ for this set of CBs by an amount equal to $$\min\left(\frac{E'_i}{K}, p_1, p_2, \ldots, p_K\right),$$

If $\Sigma_{k=1}^{K} E'^{,k}_i < E'_i$, then if $p_k=0$ for all original K CBs, and increase $E'_i$ for all original K CBs by an equal amount until $\Sigma_{k=1}^{K} E'^{,k}_i < E'_i$. If $p_k \neq 0$, then repeat from determining whether $\Sigma_{k=1}^{K} E'^{,k}_i < E'_i$.

Figure 41:
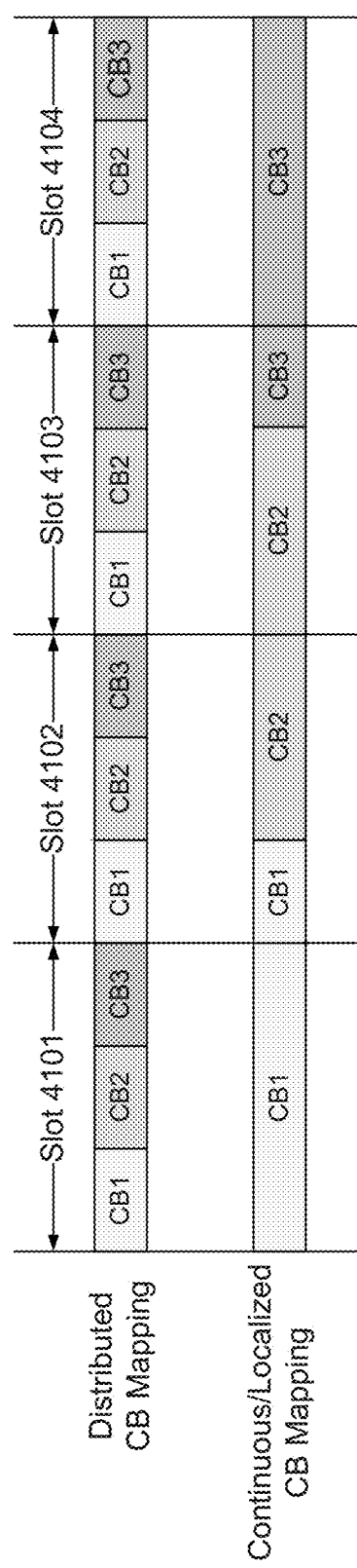
FIG. 41 depicts alternative code block mapping to slots per code block if a transmit block includes one or more code blocks according to the subject matter disclosed herein.

For all embodiments disclosed herein, operations may be performed per transmit block if the transmit block includes a single code block, or may be performed per code block if the transmit block includes multiple code blocks. The operations described are not dependent on how the coded bits corresponding to the code blocks are mapped to time resources. An example of potential mapping of coded bits to time resources are depicted FIG. 41 in which one transmit block includes three code blocks and coded bits are mapped to four slots 4101-4104. In a first example mapping mechanism depicted at the top of FIG. 41, a distributed code block mapping distributes coded bits from each code block across all slots. In a second example mapping mechanism depicted at the bottom of FIG. 41, a continuous/localized code block mapping sequentially maps coded bits from code blocks across all slots. In both example mapping mechanisms (and mapping mechanism not explicitly depicted), the operations described herein may be performed per code block in which the output of the operations described herein, if further mapped onto slots, are then mapped according to the mapping mechanism being used. For example, for a continuous rate-matching operation, a continuous amount of coded bits per code block are selected that are to be mapped across all slots regardless whether the code block exists in two slots or four slots. As another example, for a segmented rate-matching operation based on RV indices, the rate-matching operation may select a certain set of coded bits per code block that are to be mapped in each slot in which for each slot the set of coded bits are selected based on an RV index. This is irrespective of whether the code block exists in two slots or four slots. Similar behavior may exist, for example, for other rate-matching operations and interleaver operations. Additionally, although other figures herein may be understood as describing the different embodiments in a continuous/localized code block mapping manner, it should be understood that other mappings may be applicable including, but not limited to, a distributed code block mapping.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may include many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A transmit block processing chain circuitry for a transmitter device, comprising:
   a code block determination circuit that determines a size of a code block that maps across at least one slot boundary between a first slot and a second slot of a wireless physical shared channel;
   a rate matching circuit that rate matches bits of the code block to a number of bits available in a transport block that spans one or more slots of the wireless physical shared channel; and
   an interleaver that interleaves a continuous output of the rate matching circuit independently for each slot, wherein an interleaver size is determined independently for each slot of the first slot and the second slot so that the code block that crosses the slot boundary between the first slot and the second slot is interleaved within the first slot and the second slot.

2. The transmit block processing chain circuitry of claim 1, wherein the code block that crosses the slot boundary between the first slot and the second slot is segmented with a redundancy version corresponding to the second slot,
   wherein an output of the rate matching circuit is constrained to a predetermined number of slots, and
   wherein the interleaver further interleaves the output of the rate matching circuit across the predetermined number of slots.

3. The transmit block processing chain circuitry of claim 1, wherein the rate matching circuit rate matches bits of the code block continuously to a number of bits available in the transport block, and
   the interleaver interleaves a continuous rate matching of the rate matching circuit across a predetermined number of slots that are fewer than a number of allocated to the transmit block processing chain circuitry.

4. The transmit block processing chain circuitry of claim 1, further comprising the interleaver that interleaves the continuous output of the rate matching circuit with no Redundancy Version segmentation.

5. The transmit block processing chain circuitry of claim 1, wherein the interleaver interleaves the continuous output of the rate matching circuit on a slot basis in response to a cancellation indication by interleaving the output of the rate matching circuit in slots remaining after the cancellation indication or in response to an uplink control information (UCI) with multi-slot physical uplink shared channel (PUSCH) being scheduled in the one or more slots over which the transport block spans by interleaving the output of the rate matching circuit in one or more slots that precede a slot into which the UCI is scheduled.

6. The transmit block processing chain circuitry of claim 5, wherein information scheduling the UCI is received a first predetermined time period prior to a first slot of the one or more slots over which the transport block spans.

7. The transmit block processing chain circuitry of claim 6, wherein information relating to bits of the UCI is received a second predetermined time period prior to the first slot of the one or more slots over which the transport block spans.

8. A transceiver, comprising:
   receive processing circuitry that receives an indication of resources that have been allocated for a transmission over a wireless physical shared channel, the indication of resources including one or more allocated slots of the wireless physical shared channel;
   transmit processing circuitry that comprises:
   a code block determination circuit that determines a size of a code block that maps across at least one slot boundary between a first allocated slot and a second allocated slot of the wireless physical shared channel;
   a rate matching circuit that rate matches bits of the code block to a number of bits available in a transport block that spans the one or more allocated slots of the wireless physical shared channel; and
   an interleaver that interleaves a continuous output of the rate matching circuit independently for each slot, wherein an interleaver size is determined independently for each slot so that the code block that crosses a slot boundary between the first allocated slot and the second allocated slot is interleaved within the first allocated slot and the second allocated slot.

9. The transceiver of claim 8, wherein the code block that crosses the slot boundary between the first allocated slot and the second allocated slot is segmented with a redundancy version corresponding to the second allocated slot,
   wherein an output of the rate matching circuit is constrained to a predetermined number of allocated slots, and
   wherein the interleaver further interleaves the output of the rate matching circuit across the predetermined number of allocated slots.

10. The transceiver of claim 8, wherein the rate matching circuit rate matches bits of the code block continuously to a number of bits available in the transport block, and
    the interleaver interleaves a continuous rate matching of the rate matching circuit across a predetermined number of slots that are fewer than a number of allocated to the transmit processing circuitry.

11. The transceiver of claim 8, wherein the interleaver interleaves the continuous output of the rate matching circuit with no Redundancy Version segmentation.

12. The transceiver of claim 8, wherein the interleaver interleaves the continuous output of the rate matching circuit on a slot basis in response to a cancellation indication by interleaving the output of the rate matching circuit in slots remaining after the cancellation indication or in response to an uplink control information (UCI) with multi-slot physical uplink shared channel (PUSCH) being scheduled in the one or more allocated slots over which the transport block spans by interleaving the output of the rate matching circuit in one or more slots that precede a slot into which the UCI is scheduled.

13. The transceiver of claim 12, wherein information scheduling the UCI is received a first predetermined time period prior to a first slot of the one or more allocated slots over which the transport block spans.

14. The transceiver of claim 13, wherein information relating to bits of the UCI is received a second predetermined time period prior to the first slot of the one or more allocated slots over which the transport block spans.

15. A method for processing data to be mapped into a transport block, the method comprising:
    determining, by a code block determination circuit, a size of a code block of data that maps across at least one slot boundary between a first slot and a second slot of a wireless physical shared channel;

rate matching, by a rate matching circuit, bits of a code block to a number of bits available in the transport block that spans one or more slots of the wireless physical shared channel; and interleaving, by an interleaver, a continuous output of the rate matching circuit independently for each slot, wherein an interleaver size is determined independently for each slot so that the code block that crosses a slot boundary between the first slot and the second slot is interleaved within the first slot and the second slot.

16. The method of claim 15, further comprising segmenting, by the code block determination circuit, the code block that crosses the slot boundary between the first slot and the second slot with a redundancy version corresponding to the second slot, and wherein an output of the rate matching circuit is constrained to a predetermined number of slots, the method further comprising interleaving, by the interleaver, the output of the rate matching circuit across the predetermined number of slots.

17. The method of claim 15, further comprising rate matching, by the rate matching circuit rate, bits of the code block continuously to a number of bits available in the transport block; and interleaving, by the interleaver, the continuous rate matching of the rate matching circuit across a predetermined number of slots that are fewer than a number of allocated slots.

18. The method of claim 15, further comprising interleaving, by the interleaver, the continuous output of the rate matching circuit with no Redundancy Version segmentation.

19. The method of claim 15, further comprising interleaving, by the interleaver, the continuous output of the rate matching circuit on a slot basis in response to a cancellation indication by interleaving the output of the rate matching circuit in slots remaining after the cancellation indication or in response to an uplink control information (UCI) with multi-slot physical uplink shared channel (PUSCH) that is scheduled in the one or more slots over which the transport block spans by interleaving the rate matching circuit output in one or more slots that precede a slot into which the UCI is scheduled.

20. The method of claim 19, wherein information scheduling the UCI is received a first predetermined time period prior to a first slot of the one or more slots over which the transport block spans, and wherein information relating to the bits of the UCI is received a second predetermined time period prior to the first slot of the one or more slots over which the transport block spans.

* * * * *